(12) United States Patent
Ogisu et al.

(10) Patent No.: US 8,716,857 B2
(45) Date of Patent: May 6, 2014

(54) SPLIT LOOP CUT PATTERN FOR SPACER PROCESS

(71) Applicant: SanDisk Technologies Inc., Plano, TX (US)

(72) Inventors: Kiyonori Ogisu, Yokkaichi (JP); Yosuke Takahata, Yokkaichi (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/092,289

(22) Filed: Nov. 27, 2013

(65) Prior Publication Data

US 2014/0084451 A1   Mar. 27, 2014

Related U.S. Application Data

(62) Division of application No. 13/449,650, filed on Apr. 18, 2012.

(51) Int. Cl.
*H01L 23/48* (2006.01)

(52) U.S. Cl.
USPC ............. 257/734; 257/E29.12; 257/E23.145; 438/400; 438/622; 438/666

(58) Field of Classification Search
USPC ............. 257/734, E29.12, E23.145; 438/400, 438/622, 666
See application file for complete search history.

(56) References Cited

U.S. PATENT DOCUMENTS

| | | | |
|---|---|---|---|
| 6,779,167 B2 | 8/2004 | Igarashi et al. | |
| 7,002,256 B1 | 2/2006 | Nakamura | |
| 7,037,732 B2 | 5/2006 | Maruta et al. | |
| 7,675,161 B2 | 3/2010 | Hashimoto et al. | |
| 7,838,996 B2 | 11/2010 | Sato et al. | |
| 7,898,007 B2 | 3/2011 | Lee et al. | |
| 2010/0038795 A1 | 2/2010 | Aburada et al. | |
| 2012/0044735 A1 | 2/2012 | Tran et al. | |
| 2013/0277823 A1 | 10/2013 | Ogisu et al. | |

OTHER PUBLICATIONS

Notice of Allowance and Fee(s) due dated Oct. 8, 2013, U.S. Appl. No. 13/449,650, filed Apr. 18, 2012.
Restriction Requirement dated Jun. 26, 2013, U.S. Appl. No. 13/449,650, filed Apr. 18, 2012.
Response to Restriction Requirement dated Jul. 18, 2013, U.S. Appl. No. 13/449,650, filed Apr. 18, 2012.

*Primary Examiner* — Thao X Le
*Assistant Examiner* — Matthew Gordon
(74) *Attorney, Agent, or Firm* — Vierra Magen Marcus LLP

(57) ABSTRACT

A semiconductor fabrication technique cuts loops formed in a spacer pattern. The spacer pattern is a split loop pattern which generally includes a symmetric arrangement of one or more loops in each of four quadrants which are defines with respect to a reference point. The loops can be peaks or trenches. Each quadrant can include one loop, or multiple nested loops. Further, the space pattern includes a single cross, or multiple nested crosses, which extend between the loops. A cut out area is defined which extends outward from the reference point to closed ends of the loops, also encompassing a central portion of the cross. When a metal wiring layer pattern is formed using the spacer pattern with the cut out area, metal wiring is excluded from the cut out area. The loop ends in the metal wiring layer are broken and can be used as independent active lines.

4 Claims, 51 Drawing Sheets

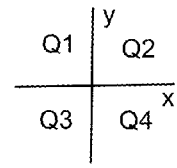
Fig. 1A1
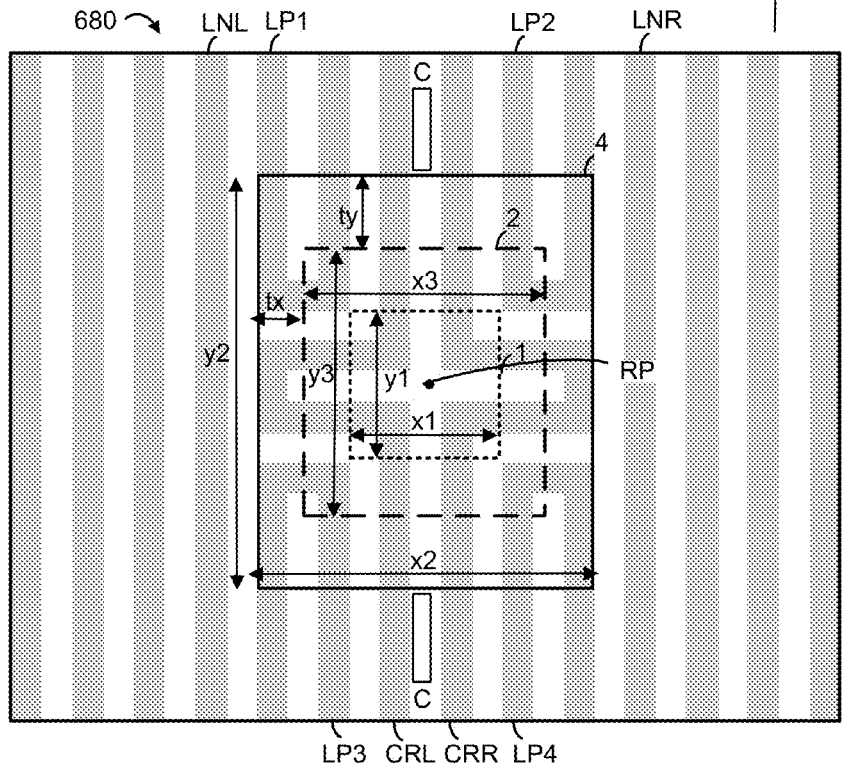
Fig. 1A2
| Line Target(nm) | Number of Spacer Process | Number of cut lines | Split loop structure | | | | | | | |
|---|---|---|---|---|---|---|---|---|---|---|
| | | | Min size | | Max size | | Average | | Tolerance | |
| | | | x1 x-axis | y1 y-axis | x2 x-axis | y2 y-axis | x3 x-axis | y3 y-axis | tx x-axis | ty y-axis |
| 20 | Single Spacer | 5 | 100 | 100 | 220 | 500 | 160 | 300 | 60 | 200 |
| | | 7 | 100 | 100 | 300 | 500 | 200 | 300 | 100 | 200 |
| | | 9 | 180 | 180 | 380 | 500 | 280 | 340 | 100 | 160 |
| | | 11 | 180 | 180 | 460 | 500 | 320 | 340 | 140 | 160 |
| | | 13 | 260 | 260 | 540 | 500 | 400 | 380 | 140 | 120 |
| 10 | Double Spacer | 11 | 130 | 130 | 230 | 500 | 180 | 315 | 50 | 185 |
| | | 15 | 130 | 130 | 310 | 500 | 220 | 315 | 90 | 185 |
| | | 19 | 210 | 210 | 390 | 500 | 300 | 355 | 90 | 145 |
| | | 23 | 210 | 210 | 470 | 500 | 340 | 355 | 130 | 145 |
| | | 27 | 290 | 290 | 550 | 500 | 420 | 395 | 130 | 105 |
| 5 | Triple Spacer | 23 | 145 | 145 | 235 | 500 | 190 | 322.5 | 45 | 177.5 |
| | | 31 | 145 | 145 | 315 | 500 | 230 | 322.5 | 85 | 177.5 |
| | | 39 | 225 | 225 | 395 | 500 | 310 | 362.5 | 85 | 137.5 |
| | | 47 | 225 | 225 | 475 | 500 | 300 | 362.5 | 75 | 137.5 |
| | | 55 | 305 | 305 | 555 | 500 | 430 | 402.5 | 125 | 97.5 |

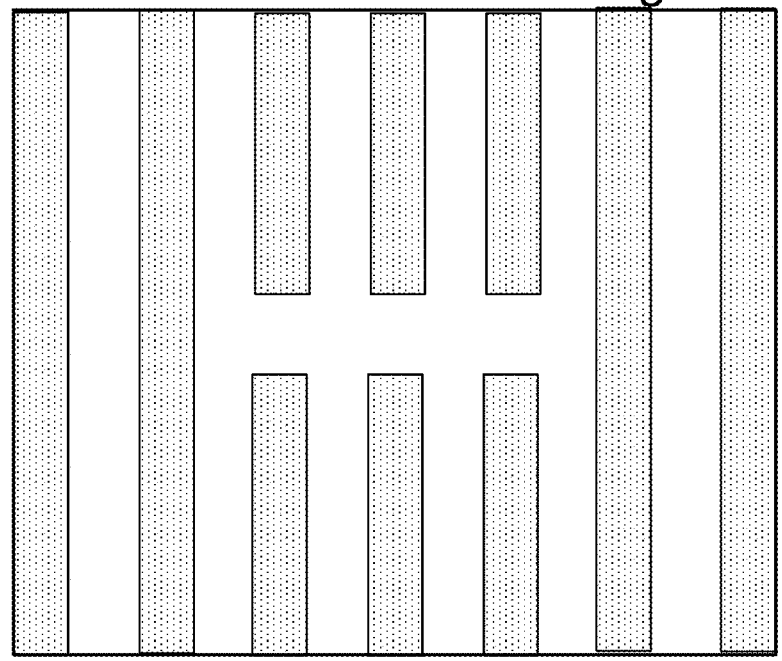
Fig. 1A3
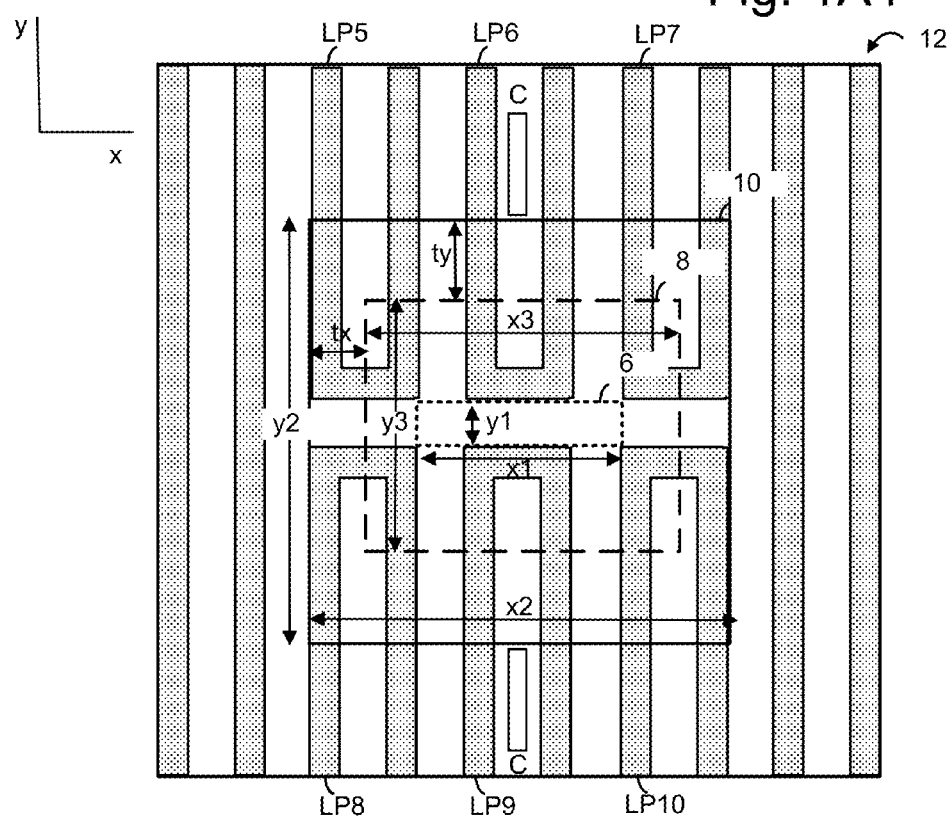
Fig. 1A4

Fig. 1A5

| Line Target(nm) | Number of Spacer Process | Number of cut lines | Individualized loop structure ||||||||
| --- | --- | --- | --- | --- | --- | --- | --- | --- | --- | --- |
| | | | Min size || Max size || Average || Tolerance ||
| | | | x1 | y1 | x2 | y2 | x3 | y3 | tx | ty |
| | | | x-axis | y-axis | x-axis | y-axis | x-axis | y-axis | x-axis | y-axis |
| 20 | Single Spacer | 5 | 100 | 20 | 220 | 500 | 160 | 260 | 60 | 240 |
| | | 7 | 180 | 20 | 300 | 500 | 240 | 260 | 60 | 240 |
| | | 9 | 260 | 20 | 380 | 500 | 320 | 260 | 60 | 240 |
| | | 11 | 340 | 20 | 460 | 500 | 400 | 260 | 60 | 240 |
| | | 13 | 420 | 20 | 540 | 500 | 480 | 260 | 60 | 240 |
| 10 | Double Spacer | 11 | 130 | 50 | 230 | 500 | 180 | 275 | 50 | 225 |
| | | 15 | 210 | 50 | 310 | 500 | 260 | 275 | 50 | 225 |
| | | 19 | 290 | 50 | 390 | 500 | 340 | 275 | 50 | 225 |
| | | 23 | 370 | 50 | 470 | 500 | 420 | 275 | 50 | 225 |
| | | 27 | 450 | 50 | 550 | 500 | 500 | 275 | 50 | 225 |
| 5 | Triple Spacer | 23 | 145 | 65 | 235 | 500 | 190 | 282.5 | 45 | 217.5 |
| | | 31 | 225 | 65 | 315 | 500 | 270 | 282.5 | 45 | 217.5 |
| | | 39 | 305 | 65 | 395 | 500 | 350 | 282.5 | 45 | 217.5 |
| | | 47 | 385 | 65 | 475 | 500 | 430 | 282.5 | 45 | 217.5 |
| | | 55 | 465 | 65 | 555 | 500 | 510 | 282.5 | 45 | 217.5 |

Fig. 1A6
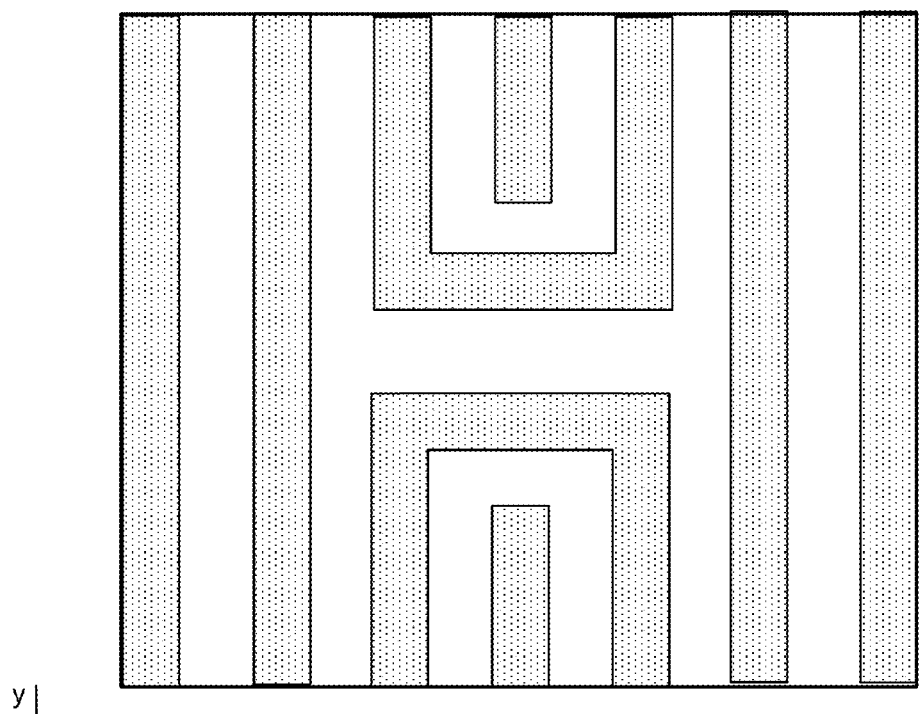
Fig. 1A7
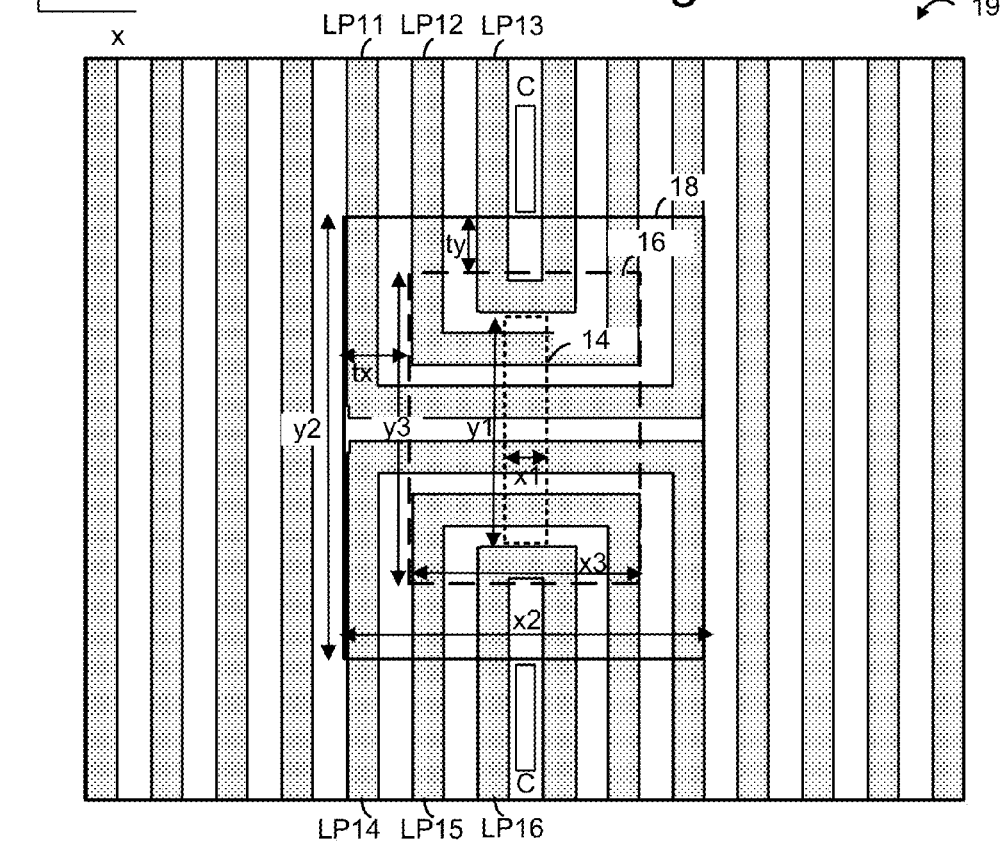

Fig. 1A8

| Line Target(nm) | Number of Spacer Process | Number of cut lines | Nested loop structure | | | | | | | |
|---|---|---|---|---|---|---|---|---|---|---|
| | | | Min size | | Max size | | Average | | Tolerance | |
| | | | x1 x-axis | y1 y-axis | x2 x-axis | y2 y-axis | x3 x-axis | y3 y-axis | tx x-axis | ty y-axis |
| 20 | Single Spacer | 5 | 20 | 180 | 220 | 500 | 120 | 340 | 100 | 160 |
| | | 7 | 20 | 260 | 300 | 500 | 160 | 380 | 140 | 120 |
| | | 9 | 20 | 340 | 380 | 500 | 200 | 420 | 180 | 80 |
| | | 11 | 20 | 420 | 460 | 500 | 240 | 460 | 220 | 40 |
| | | 13 | 20 | 500 | 540 | 500 | 280 | 500 | 260 | 0 |
| 10 | Double Spacer | 11 | 20 | 210 | 230 | 500 | 125 | 355 | 105 | 145 |
| | | 15 | 20 | 290 | 310 | 500 | 165 | 395 | 145 | 105 |
| | | 19 | 20 | 370 | 390 | 500 | 205 | 435 | 185 | 65 |
| | | 23 | 20 | 450 | 470 | 500 | 245 | 475 | 225 | 25 |
| | | 27 | 20 | 530 | 550 | 500 | 285 | 515 | 265 | -15 |
| 5 | Triple Spacer | 23 | 20 | 225 | 235 | 500 | 127.5 | 362.5 | 107.5 | 137.5 |
| | | 31 | 20 | 305 | 315 | 500 | 167.5 | 402.5 | 147.5 | 97.5 |
| | | 39 | 20 | 385 | 395 | 500 | 207.5 | 442.5 | 187.5 | 57.5 |
| | | 47 | 20 | 465 | 475 | 500 | 197.5 | 482.5 | 177.5 | 17.5 |
| | | 55 | 20 | 545 | 555 | 500 | 287.5 | 522.5 | 267.5 | -22.5 |

Fig. 1A9

| Line Target (nm) | Spacer process | Cut lines | Minimum tolerance (nm) | | |
|---|---|---|---|---|---|
| | | | Split loop | Individual loop | Nested loop |
| 20 | single | 5 | 60 | 60 | 100* |
| | | 7 | 100 | 60 | 120* |
| | | 9 | 100* | 60 | 80 |
| | | 11 | 140* | 60 | 40 |
| | | 13 | 120* | 60 | 0 |
| 10 | double | 11 | 50 | 50 | 105* |
| | | 15 | 90 | 50 | 105* |
| | | 19 | 90* | 50 | 65 |
| | | 23 | 130* | 50 | 25 |
| | | 27 | 105* | 50 | -15 |
| 5 | triple | 23 | 45 | 45 | 107.5* |
| | | 31 | 85 | 45 | 97.5* |
| | | 39 | 85* | 45 | 57.5 |
| | | 47 | 75* | 45 | 17.5 |
| | | 55 | 97.5* | 45 | -22.5 |

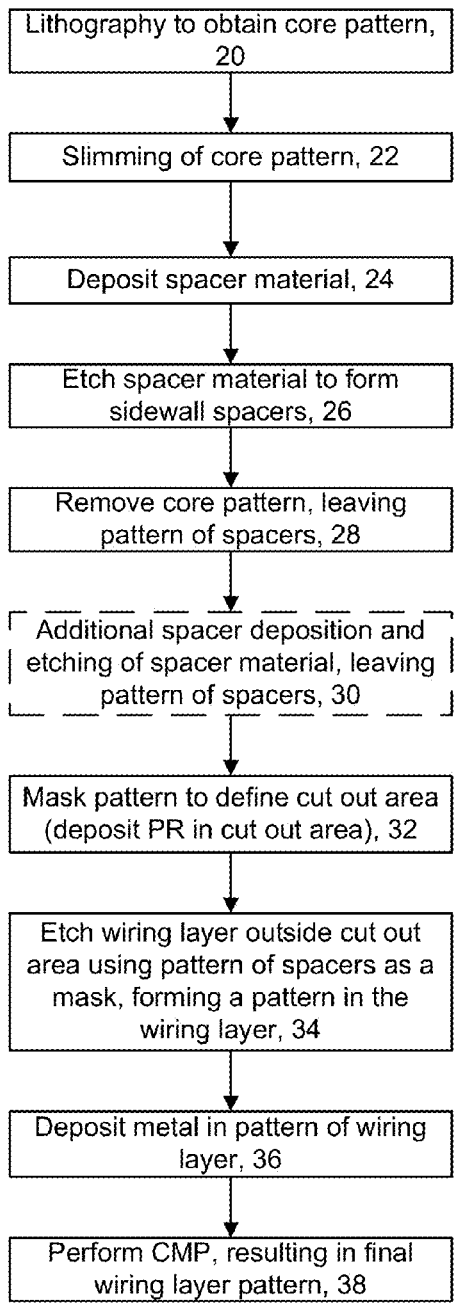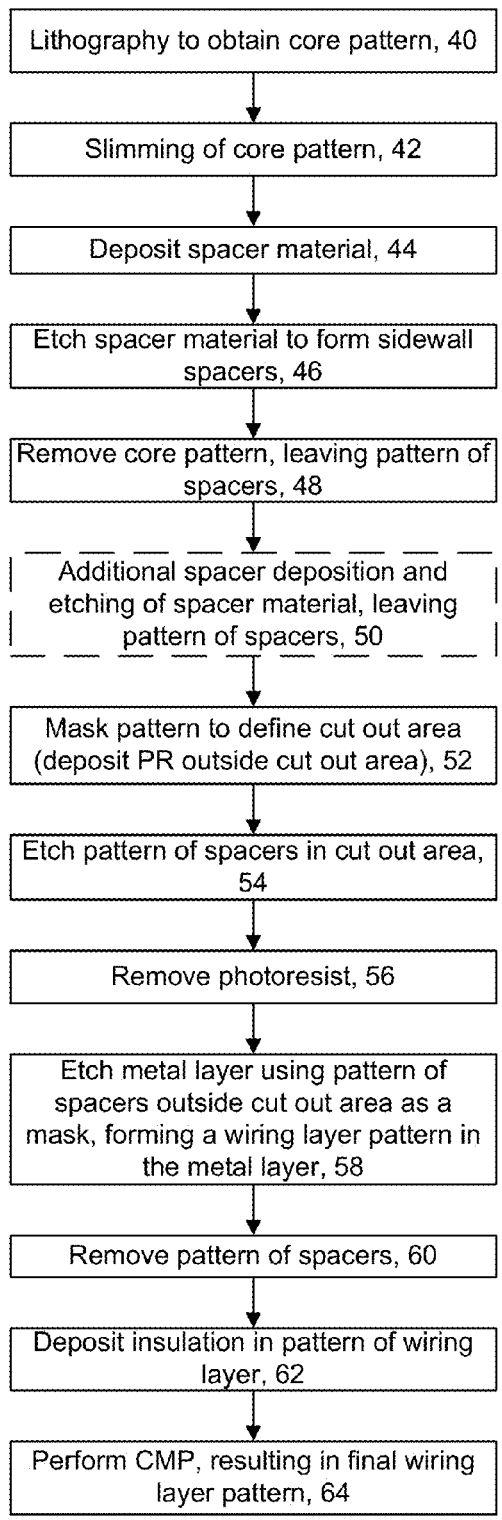

Fig. 1A12

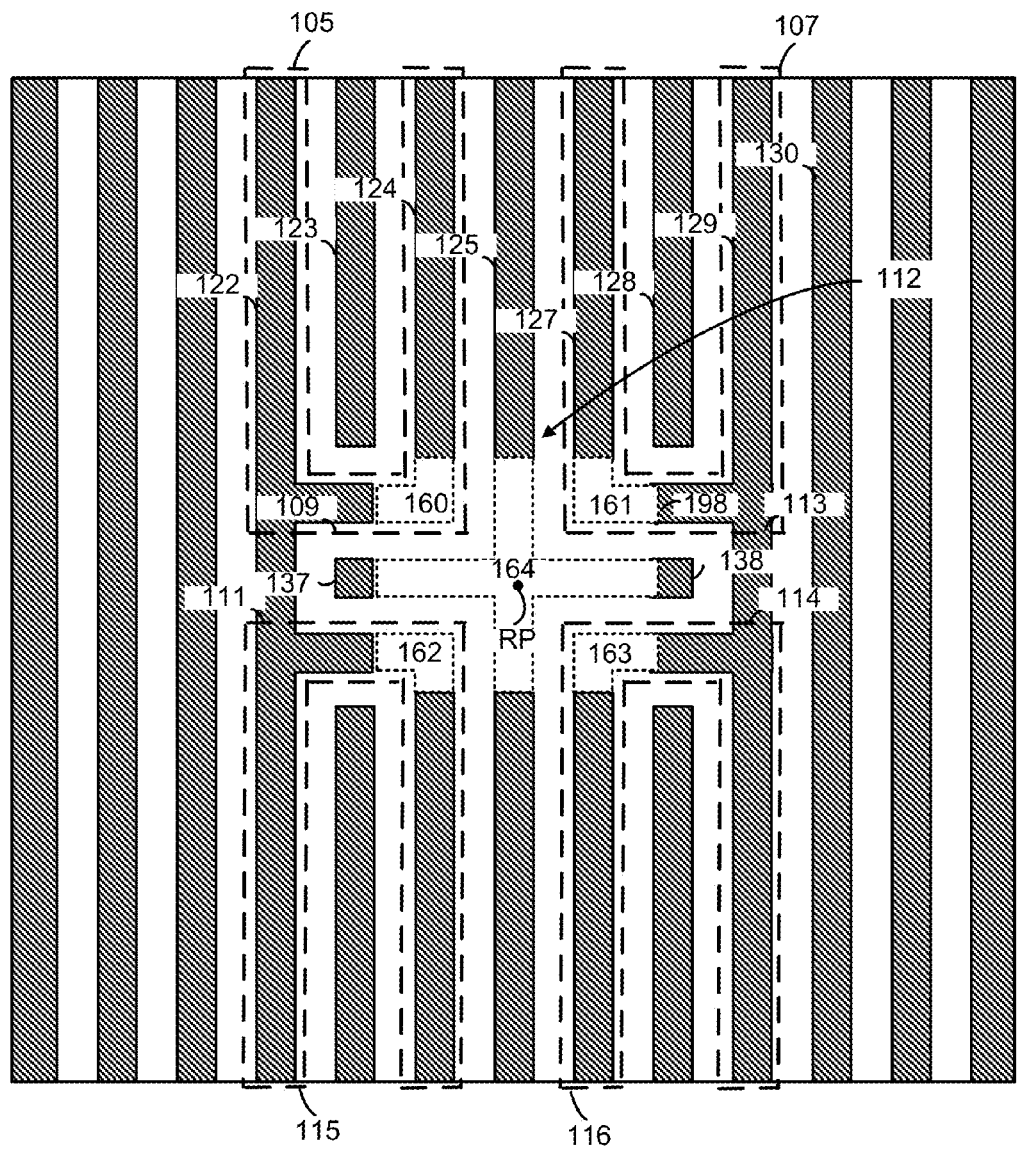

Fig. 3A
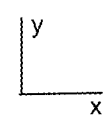
Fig. 3B
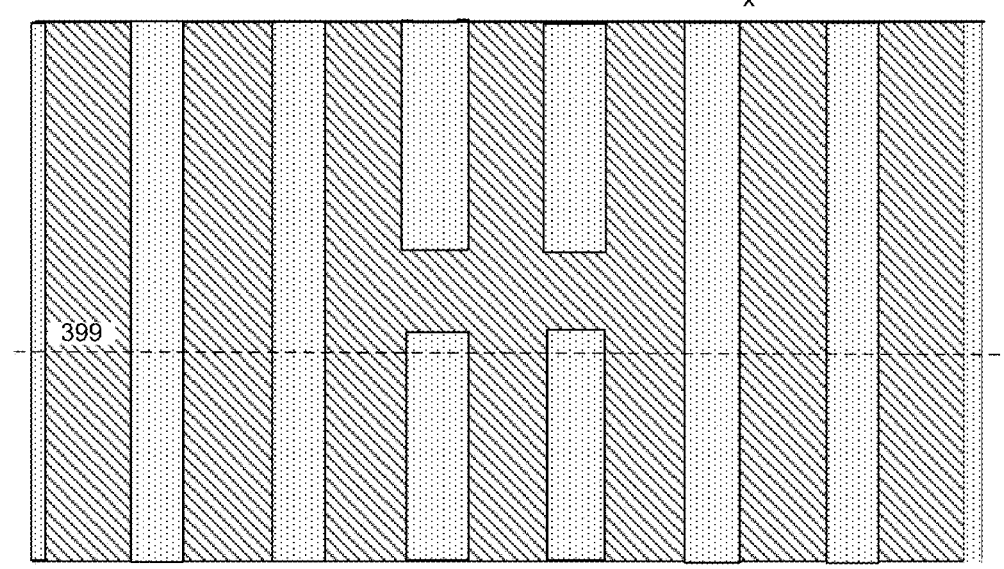
Fig. 3C
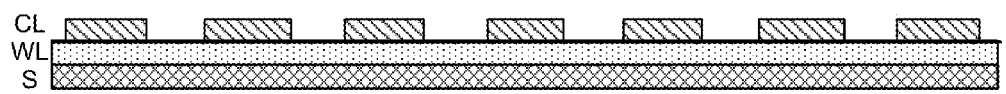

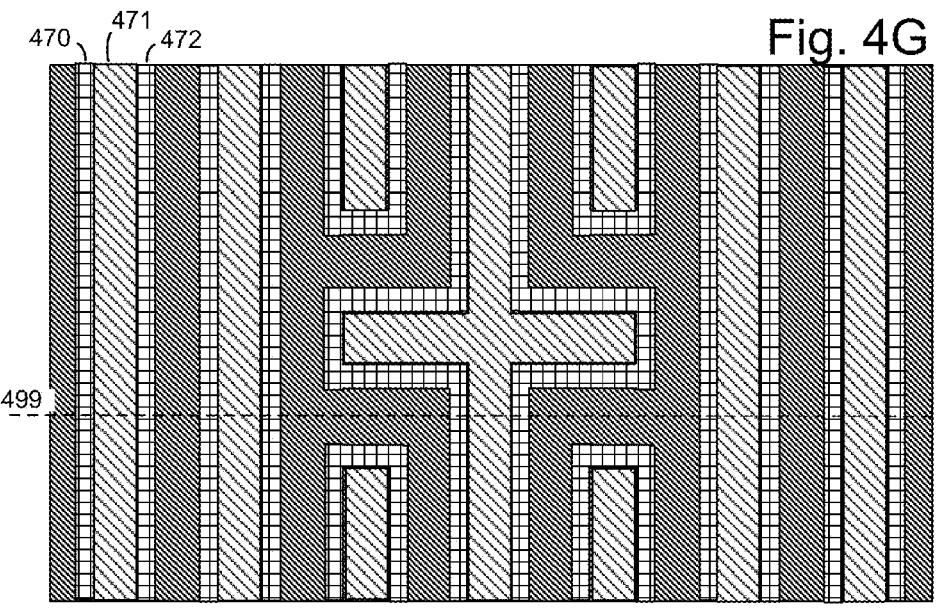
Fig. 4G
Fig. 4H
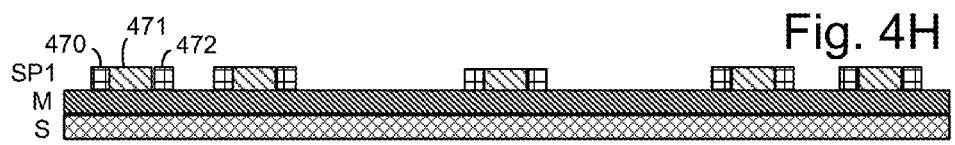
Fig. 4I
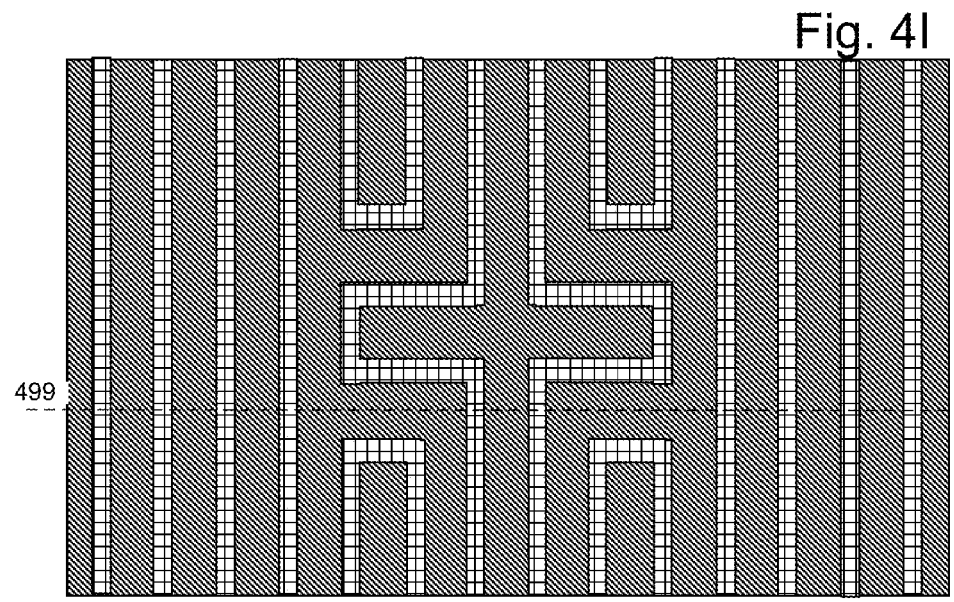
Fig. 4J
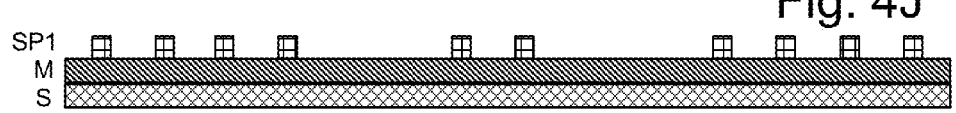

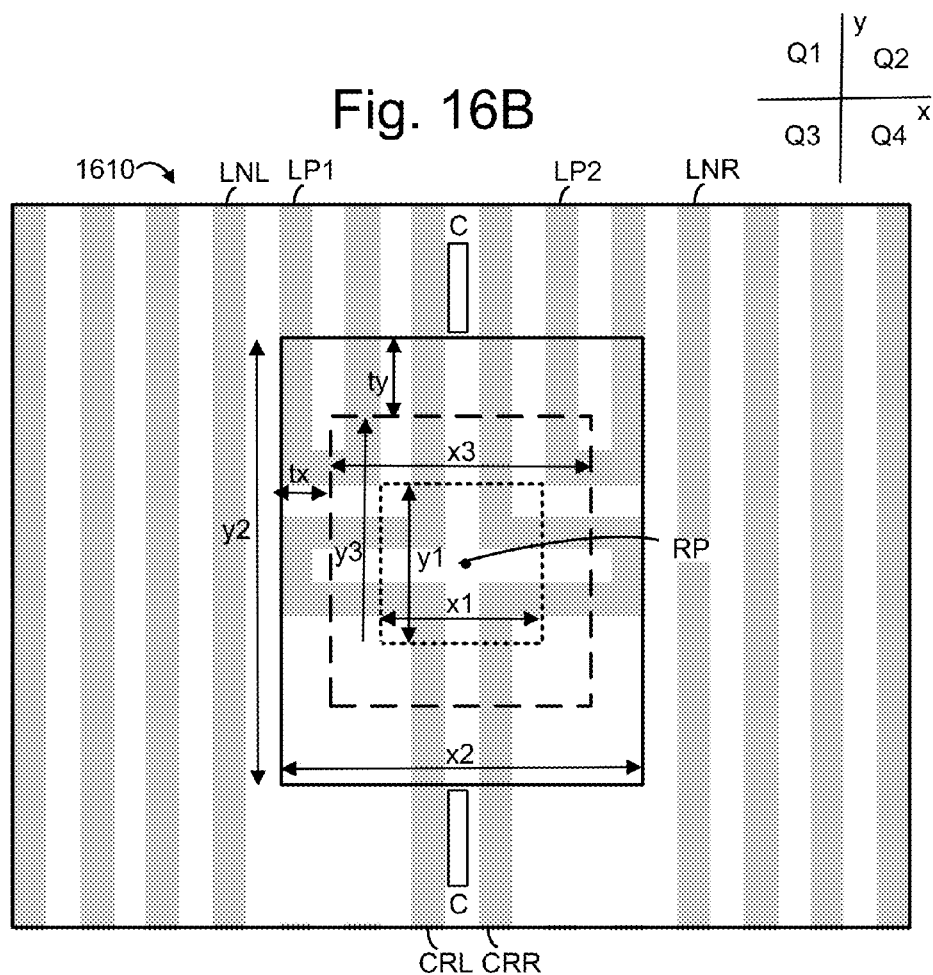

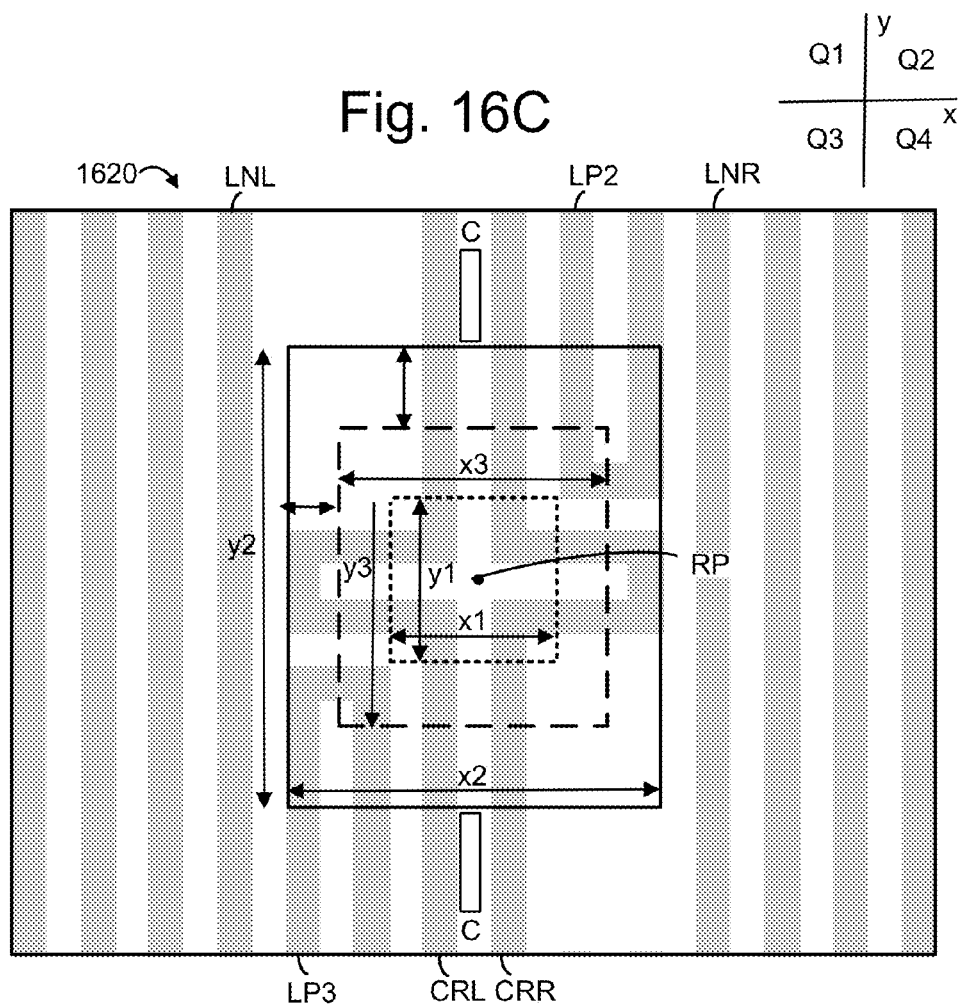

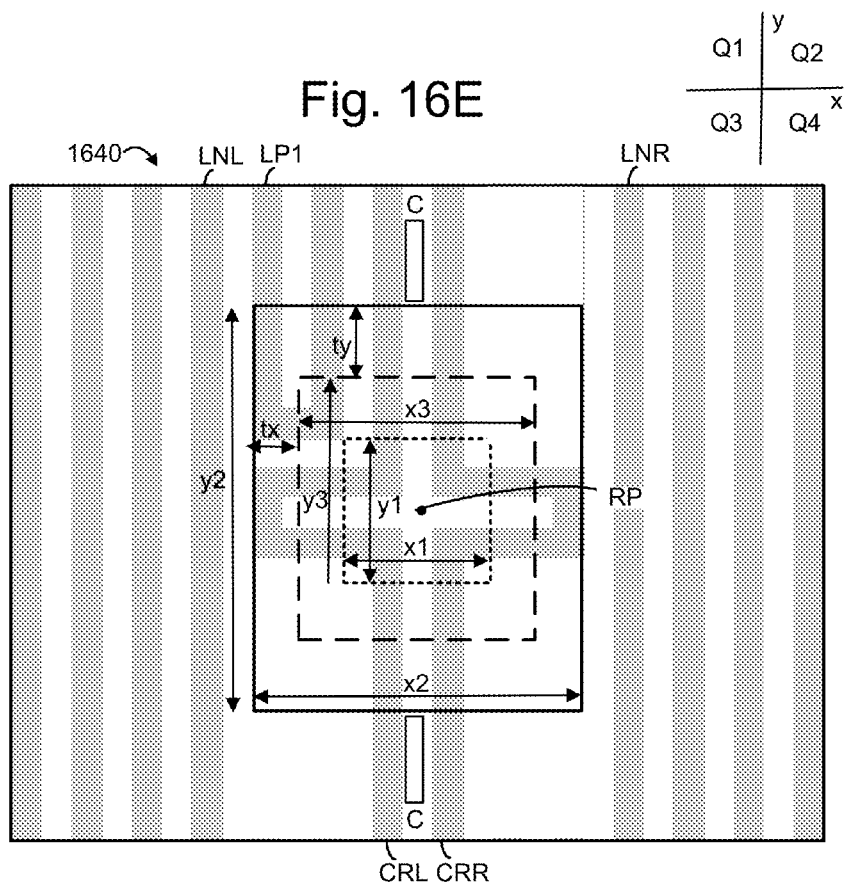

SPLIT LOOP CUT PATTERN FOR SPACER PROCESS

CLAIM OF PRIORITY

This application is a divisional application of U.S. patent application Ser. No. 13/449,650, entitled "SPLIT LOOP CUT PATTERN FOR SPACER PROCESS," filed Apr. 18, 2012, published as US2013/0277823 on Oct. 24, 2013 and issued as U.S. Pat. No. 8,637,982 on Jan. 28, 2014, incorporated herein by reference in its entirety. incorporated herein by reference in its entirety.

BACKGROUND OF THE INVENTION

1. Field of the Invention

The present invention relates to semiconductor fabrication techniques, including techniques for forming wiring layers, and to a corresponding semiconductor device.

2. Description of the Related Art

Lithographic techniques are used to fabricate patterns in semiconductor materials. Due to the demand for ever-smaller dimensions in semiconductor devices such as integrated circuits, techniques such as the spacer process have been developed. In this process, a spacer material is deposited as a film layer on a pattern of raised features, e.g., lines, which is formed on an underlying layer. Etching removes portions of the film which are on horizontal surfaces of the underlying layer, leaving only portions of the film on sidewalls of the raised features. Subsequently, the raised features are removed, leaving only the spacers in a new pattern of raised features which has twice the line density as the previous pattern. This process can performed once, as a single spacer or patterning process, or multiple times, in a multiple spacer or patterning process. However, closed loop shapes can be formed in the spacer patterns which are not desired.

BRIEF DESCRIPTION OF THE DRAWINGS

Like-numbered elements refer to common components in the different figures.

FIG. 1A1 depicts an example of a split loop pattern 680 as an enlarged view of the pattern of FIG. 6C, showing a minimum cut out area 1, a maximum cut out area 4, an average cut out area 2, and x- and y-direction tolerances, tx and ty, respectively, between the maximum cut out area and the average cut out area.

FIG. 1A2 depicts a table listing a minimum cut out area, maximum cut out area, an average cut out area, and x- and y-direction tolerances, tx and ty, respectively, for different configurations of a split loop structure such as shown in FIG. 1A1.

FIG. 1A3 depicts a core pattern for an example individualized loop structure.

FIG. 1A4 depicts a pattern 12 for an individualized loop structure based on the core pattern of FIG. 1A3, showing a minimum cut out area 6, a maximum cut out area 10, an average cut out area 8, and x- and y-direction tolerances, tx and ty, respectively, between the maximum cut out area and the average cut out area.

FIG. 1A5 depicts a version of the table of FIG. 1A2 for the individualized loop pattern of FIG. 1A4.

FIG. 1A6 depicts a core pattern for an example nested loop structure.

FIG. 1A7 depicts a pattern 19 for a nested loop structure based on the core pattern of FIG. 1A6, showing a minimum cut out area 14, a maximum cut out area 18, an average cut out area 16, and x- and y-direction tolerances, tx and ty, respectively, between the maximum cut out area and the average cut out area.

FIG. 1A8 depicts a version of the table of FIG. 1A2 for the nested loop pattern of FIG. 1A7.

FIG. 1A9 depicts a table which compares minimum tolerances from the three previously shown tables.

FIG. 1A10 depicts a fabrication process for a split loop embodiment such as shown in FIG. 1A1 using Damascene processing, corresponding to the embodiment of FIGS. 1A-1Q, 3A-3V and 5A-13G.

FIG. 1A11 depicts a fabrication process for a split loop embodiment such as shown in FIG. 1A1 using subtractive etch processing, corresponding to the embodiment of FIGS. 2A-2W, 4A-4Z and 14A-15H.

FIGS. 1A12-1R depict views of a layered semiconductor material which is processed to form a wiring layer using a single spacer, Damascene process, with five cut wires.

FIGS. 3A-3V depict views of a layered semiconductor material which is processed to form a wiring layer using a double spacer, Damascene process, with seven cut wires.

FIGS. 11A-11G depict views of a layered semiconductor material which is processed to form a wiring layer using a double spacer, Damascene process, with eleven cut wires.

FIGS. 13A-13G depict views of a layered semiconductor material which is processed to form a wiring layer using a double spacer, Damascene process, with nineteen cut wires.

FIGS. 16A-E depicts alternative configurations of the split loop pattern of FIG. 1A1.

DETAILED DESCRIPTION

As mentioned at the outset, the spacer process often results in loop patterns which are not desired. As a result, additional fabrication steps are used to cut the loops, such as before patterning a wiring layer. A cut out area can be defined which is used to remove portions of the spacer pattern. In some cases, several loops have loops ends that meet at a common location in which the cut out area is defined. However, the cut out area must be accurately positioned to avoid cutting adjacent portions of the spacer pattern and extending in area in which contacts will be formed. Such adjacent portions may be used to form active lines in the wiring layer which cannot be cut, to avoid an open circuit which will cause a malfunction in the resulting semiconductor device. Similarly, a short circuit to a contact should be avoided. A split loop spacer pattern as provided herein can provide optimal results in terms of design flexibility, compatibility and a process friendly layout.

Figure 6A:
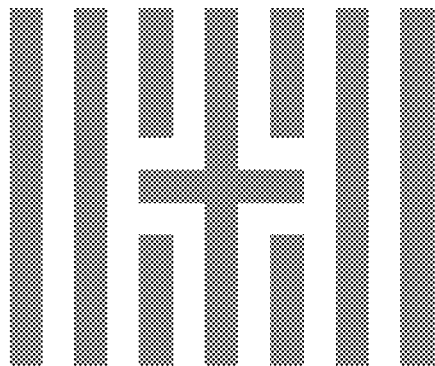
FIGS. 6A-6E depict views of a layered semiconductor material which is processed to form a wiring layer using a single spacer, Damascene process, with five cut wires.
Figure 6B:
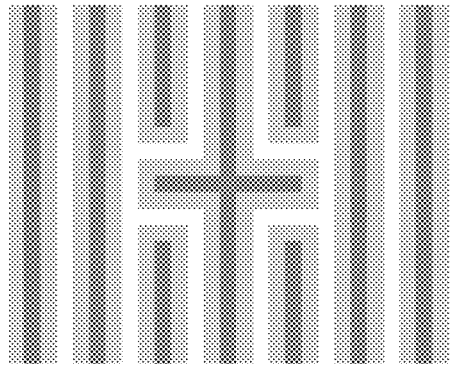
Figure 6C:
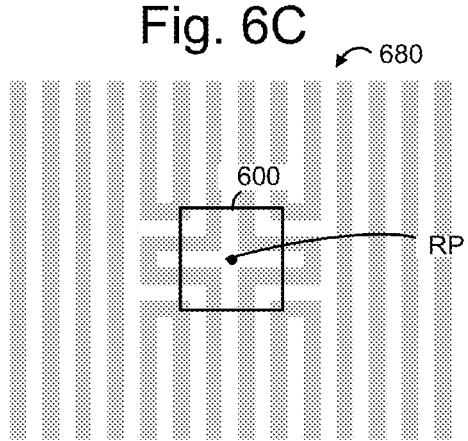

FIG. 1A1 depicts an example of a split loop pattern 680 as an enlarged view of the pattern of FIG. 6C, showing a minimum cut out area 1, a maximum cut out area 4, an average cut out area 2, and x- and y-direction tolerances, tx and ty, respectively, between the maximum cut out area and the average cut out area. A split loop pattern generally includes a symmetric arrangement of one or more loops such as LP1-LP4 with respect to a reference point (RP). The pattern extends in a patterned area which includes four quadrants Q1-Q4 which are defined relative to the RP. Q1 and Q2 are adjacent to one another (they have a common side), Q2 and Q4 are adjacent to one another, Q3 and Q4 are adjacent to one another, and Q1 and Q3 are adjacent to one another. Q1 and Q4 are diagonal to one another (they meet only at a corner point), and Q2 and Q3 are diagonal to one another. RP can be at the origin of the x-y coordinate system. A portion of the pattern in each quadrant comprises one or more loops. Each quadrant encompasses one-fourth of the area of the pattern. In this example, the portion of the pattern in each quadrant is symmetric with respect to both the x and y axes and the RP. Other options are shown in FIGS. 16A-E.

This example pattern is used in a Damascene process, with five cut lines, so that the resulting wiring layer pattern has metal in the unshaded regions, outside the shaded regions which represent raised features/lines. If not cut, the loops pattern would result in loops in the metal wiring layer. The minimum cut out area 1 has dimensions of x1 by y1, the maximum cut out area has dimensions of x2 by y2 and the average cut out area has dimensions of x3 by y3, where x3 is the average of x1 and x2, and y3 is the average of y1 and y2. A central cross shape having a left half CRL and a right half CRR is also shown. The maximum area is the largest extent of the cut out area which will not interfere with the adjacent lines such as LNL and LNR, and with contacts C.

It can be seen that if the cutout area is shifted too far from its ideal position, an open or short circuit can result in the subsequently-formed metal wiring layer. The tolerances, or margins, are measures of how far the average cutout area can be shifted, e.g., without causing an open or short circuit. These tolerances provide a shift budget. The size of the semiconductor device or chip may need to increase to allow for an adequate shift budget. It is desirable to avoid this increase by reducing the size of the cut out area and/or maximizing the tolerances. One approach is to maximize the smallest tolerances.

Other techniques which seek to avoid an open or short circuit provide a pattern which bends the lines to provide a space between the active area and the cut out area. However, as the number of cut wires increases, the space around the cut out area becomes larger and a more complicated pattern results.

FIG. 1A2 depicts a table listing a minimum cut out area, maximum cut out area, an average cut out area, and x- and y-direction tolerances, tx and ty, respectively, for different configurations of a split loop structure such as shown in FIG. 1A1. The different configurations include different line targets/widths (20, 10 and 5 nm), different numbers of spacer processes (single, double and triple), and different numbers of cut lines. For the single spacer process, the number of cut lines is 5, 7, 9, 11 and 13. For the double spacer process, the number of cut lines is 11, 15, 19, 23 and 27. For the triple spacer process, the number of cut lines is 23, 31, 39, 47 and 55. This refers to the number of cut lines in the final metal wiring layer. A metal line is cut by the cut out area by forming a separation between line portions (straight or in a loop) of the metal wiring layer, where the separation is the size of, and at the location of, the cut out area. In other words, if the spacer pattern was used to form the metal wiring layer pattern in the absence of the use of the cut out area, the line portions would be joined to form one continuous line. The first entry in the table corresponds to the structure of the previous figure.

The split loop structure provides the loops on opposite sides of the x and y axes. The range of tolerances in the x direction is desirably greater than for the individualized loop structure (e.g., 60-140 nm vs. 45-60 nm) (see FIGS. 1A3-1A5). Also, the range of tolerances in the y direction is desirably greater than for the nested loop structure (e.g., 120-200 nm vs. 0-160 nm) (see FIGS. 1A6-1A8). The split loop structure can be considered to be a hybrid of the individualized loop structure and the nested loop structure.

In situations where the individualized loop structure and the nested loop structure have an advantage over the split loop structure, these structures have the disadvantage that the cut out area becomes larger in one dimension. Therefore, in the case of a layout restriction along the x or y directions, these structures are not compatible. In contrast, the split loop structure provides a more flexible design. Generally, regarding an overlay margin (tx) in the x direction, the nested loop structure is optimal, followed by the split loop structure and then the individualized loop structure. Regarding an overlay margin (ty) in the y direction, the individualized loop structure is optimal, followed by the split loop structure and then the nested loop structure. Regarding the minimum cut out area in the x-direction, the split loop structure is optimal, followed by the individualized loop structure. Regarding the minimum cut out area in the y-direction, the split loop structure is optimal, followed by the nested loop structure.

The major axis of the cut out area becomes smaller compared to the other structures. Therefore, longest dimension of the minimum cut out area is reduced, while the overlay margin of the contact at the upper/lower layer is adequate. Since the split loop structure is a hybrid between the individualized loop structure and nested loop structure, the cut out area can be designed with more flexibility as a function of layout restrictions in x or y directions. The split loop structure provides better design flexibility and compatibility. Moreover, a process friendly layout is achieved. It is difficult to control the shape and dimension of the pattern around the cut out area when there is a large space for overlay shift. The split loop structure provides greater control due to the reduced space around the cut out area while satisfying the overlay margin. Moreover, the split loop structure can reduce the complexity of the patterns.

FIG. 1A3 depicts a core pattern for an example individualized loop structure.

FIG. 1A4 depicts a pattern 12 for an individualized loop structure based on the core pattern of FIG. 1A3, showing a minimum cut out area 6, a maximum cut out area 10, an average cut out area 8, and x- and y-direction tolerances, tx and ty, respectively, between the maximum cut out area and the average cut out area. This is also an example of a five-cut, Damascene process. A core pattern can be used to form a metal wiring layer using techniques shown further below. The individualized loop structure includes a number of adjacent loops LP5-LP10, including LP5-LP7 in a mirror image with LP8-LP10 with respect to the x axis. The individualized loop structure uses opposing rows of individual loops. The loops are individual because they are not nested, one inside another.

FIG. 1A5 depicts a version of the table of FIG. 1A2 for the individualized loop pattern of FIG. 1A4. The first entry in the table corresponds to the structure of the previous figure. The range of tolerances in the y direction is relatively wide (e.g. 217.5-240 nm). However, the range of tolerances in the x direction is relatively narrow (e.g. 45-60 nm) so there is relatively little concern with creating a short between the cut pattern and the active area, outside the cut out area. For a given line target and spacer process, as the number of closed loops increases, the x-axis dimension of the cut out area becomes larger. For example, the average x-axis dimension increases from 160-480 nm, 180-500 nm and 190-510 nm for line targets of 20, 10 and 5 nm, respectively.

FIG. 1A6 depicts a core pattern for an example nested loop structure.

FIG. 1A7 depicts a pattern 19 for a nested loop structure based on the core pattern of FIG. 1A6, showing a minimum cut out area 14, a maximum cut out area 18, an average cut out area 16, and x- and y-direction tolerances, tx and ty, respectively, between the maximum cut out area and the average cut out area. This is also an example of a five-cut, Damascene process. The nested loop structure includes a number of nested loops LP11-LP16, including nested loops LP11-LP13 in a mirror image with nested loops LP14-LP16 with respect to the x axis. A nesting loop structure comprises a loop within a loop.

FIG. 1A8 depicts a version of the table of FIG. 1A2 for the nested loop pattern of FIG. 1A7. The nested loop structure comprises loops which are aligned along a central axis. A range of tolerances in the x direction is relatively wide (e.g. 100-267.5 nm) but relatively narrow in the y direction (e.g., 160 nm or less) so there is relatively little concern with creating a short between the cut pattern and the contact, outside the cut out area. With this structure, as the number of nested loops increases, the major axis (y axis) of the cut out area become larger, leading to an increase in the chip size. For example, the average y-axis dimension increases from 340-500 nm, 355-515 nm, and 362.5-522.5 nm for line targets of 20, 10 and 5 nm, respectively.

FIG. 1A9 depicts a table which compares minimum tolerances from the three previously shown tables. The first entry in the table corresponds to the structure of the previous figure. An asterisk indicates which approach is optimal in terms of providing the largest minimum tolerance. The split loop approach generally is optimal as the number of cut lines increases.

Figure 1B:
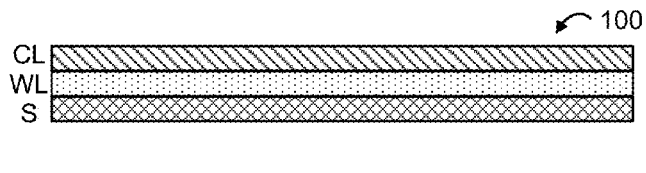
Figure 1B:
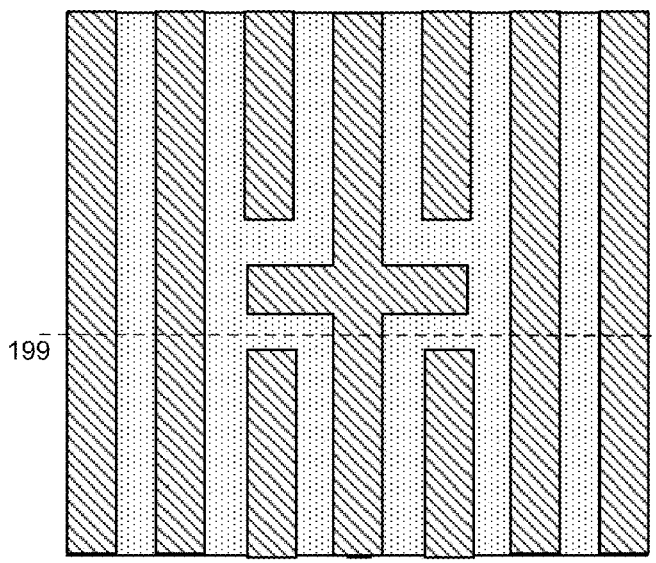

FIG. 1A10 depicts a fabrication process using Damascene processing, corresponding to the embodiment of FIGS. 1A-1Q, 3A-3V and 5A-13G. The steps include: Lithography to obtain core pattern, 20 (see, e.g., FIGS. 1B and 3B); Slimming of core pattern, 22 (see, e.g., FIGS. 1D and 3D); Deposit spacer material, 24 (see, e.g., FIGS. 1F and 3F); Etch spacer material to form sidewall spacers, 26 (see, e.g., FIGS. 1H and 3H); Remove core pattern, leaving pattern of spacers, 28 (see, e.g., FIGS. 1J and 3J); Additional spacer deposition and etching of spacer material, leaving pattern of spacers, 30 (see, e.g., FIGS. 3K and 3M); Mask pattern to define cut out area (deposit PR in cut out area), 32 (see, e.g., FIGS. 1L and 3P); Etch wiring layer outside cut out area using pattern of spacers as a mask, forming a pattern in the wiring layer, 34 (see, e.g., FIGS. 1N and 3S); Deposit metal in pattern of wiring layer, 36 (see, e.g., FIGS. 1O and 3T); and Perform CMP, resulting in final wiring layer pattern, 38 (see, e.g., FIGS. 1Q and 3V).

FIG. 1A11 depicts a fabrication process using subtractive etch processing, corresponding to the embodiment of FIGS. 2A-2W, 4A-4Z and 14A-15H. The steps include: Lithography to obtain core pattern, 40 (see, e.g., FIGS. 2B and 4B); Slimming of core pattern, 42 (see, e.g., FIGS. 2D and 4D); Deposit spacer material, 44 (see, e.g., FIGS. 2F and 4F); Etch spacer material to form sidewall spacers, 46 (see, e.g., FIGS. 2H and 4H); Remove core pattern, leaving pattern of spacers, 48 (see, e.g., FIGS. 2J and 4J); Additional spacer deposition and etching of spacer material, leaving pattern of spacers, 50 (see, e.g., FIGS. 4K and 4M); Mask pattern to define cut out area (deposit PR outside cut out area), 52 (see, e.g., FIGS. 2K and 4P); Etch pattern of spacers in cut out area, 54 (see, e.g., FIGS. 2N and 4S); Remove photoresist, 56 (see, e.g., FIGS. 2P and 4U); Etch metal layer using pattern of spacers outside cut out area as a mask, forming a wiring layer pattern in the metal layer, 58 (see, e.g., FIGS. 2R and 4W); Remove pattern of spacers, 60 (see, e.g., FIGS. 2T and 4Y); Deposit insulation in pattern of wiring layer, 62 (see, e.g., FIG. 2U); and Perform CMP, resulting in final wiring layer pattern, 64 (see, e.g., FIGS. 2W and 4Z).

FIGS. 1A12-1R depict views of a layered semiconductor material which is processed to form a wiring layer using a single spacer, Damascene process, with five cut wires. To assist in identifying common elements, some of the elements are filled in with a pattern which is consistent across this set of figures.

FIG. 1A12 depicts a cross-sectional view of a layered semiconductor material 100 at a start of the process. As indicated by an x-y-z Cartesian coordinate system, the material extends horizontally in an x-direction and a y-direction, and vertically in a z-direction. As an example, the layered semiconductor material includes a substrate (S), a wiring layer (WL) and a core layer (CL). As an example, the substrate can comprise silicon, the wiring layer can comprise a dielectric material, and the core layer can comprise amorphous silicon film, SiN or spin-on-carbon (SOC).

FIG. 1B depicts a top view of the layered semiconductor material 100 after a pattern is formed in the CL. The pattern is formed by removing portions of the CL using lithography.

Figure 1C:
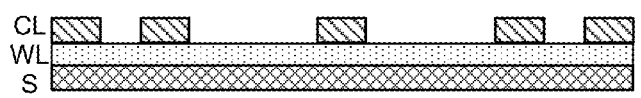

FIG. 1C depicts a cross-sectional view of the layered semiconductor material of FIG. 1B along line 199.

Figure 1D:
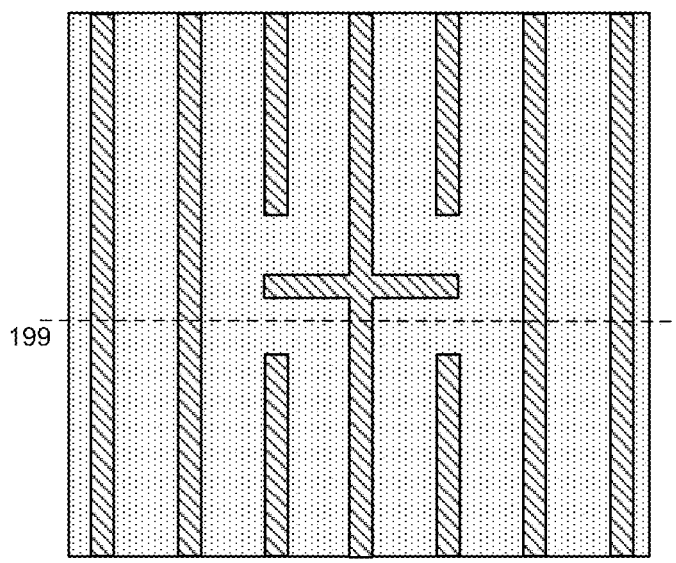

FIG. 1D depicts a top view of the layered semiconductor material of FIGS. 1B and 1C after performing a slimming process which reduces the thickness of the features of the CL. For example, a wet slimming process may be used.

Figure 1E:
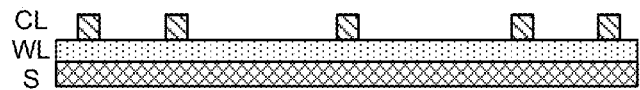

FIG. 1E depicts a cross-sectional view of the layered semiconductor material of FIG. 1D along line 199.

Figure 1F:
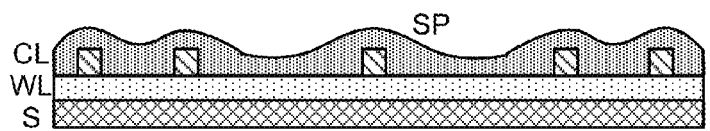

FIG. 1F depicts the cross-sectional view of FIG. 1E after deposition of a sidewall material. An example material is silicon nitride film, amorphous Si and doped poly-Si (dopant: C, P or B).

Figure 1G:
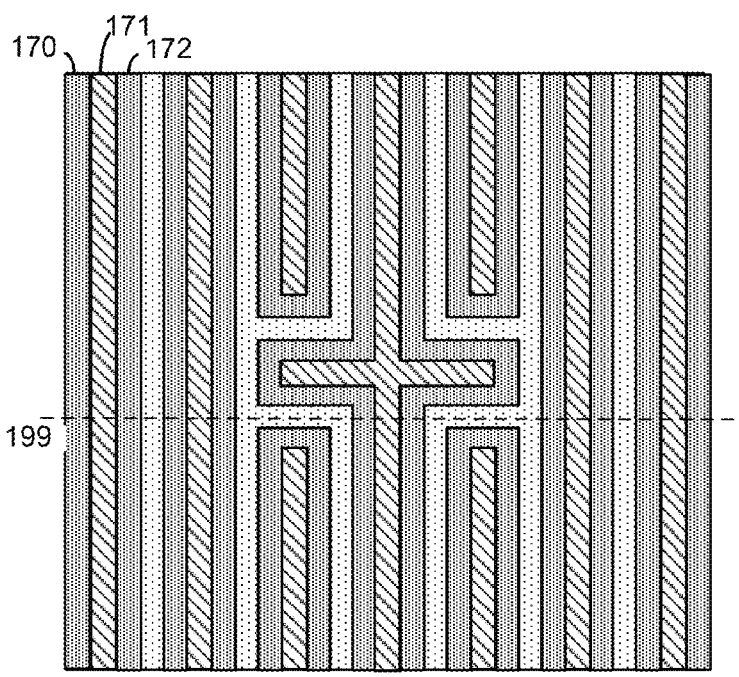

FIG. 1G depicts a top view of the layered semiconductor material of FIG. 1F after etching. An example uses reactive ion etching. This step results in the formation of spacers on the sidewalls of the lines in the core layer. For example spacers 170 and 172 are formed on sidewalls of a line 141 of the core layer material.

Figure 1H:
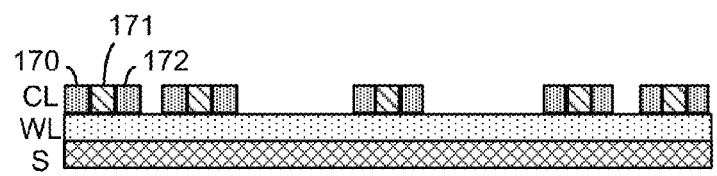

FIG. 1H depicts a cross-sectional view of the layered semiconductor material of FIG. 1G along line 199.

Figure 1I:
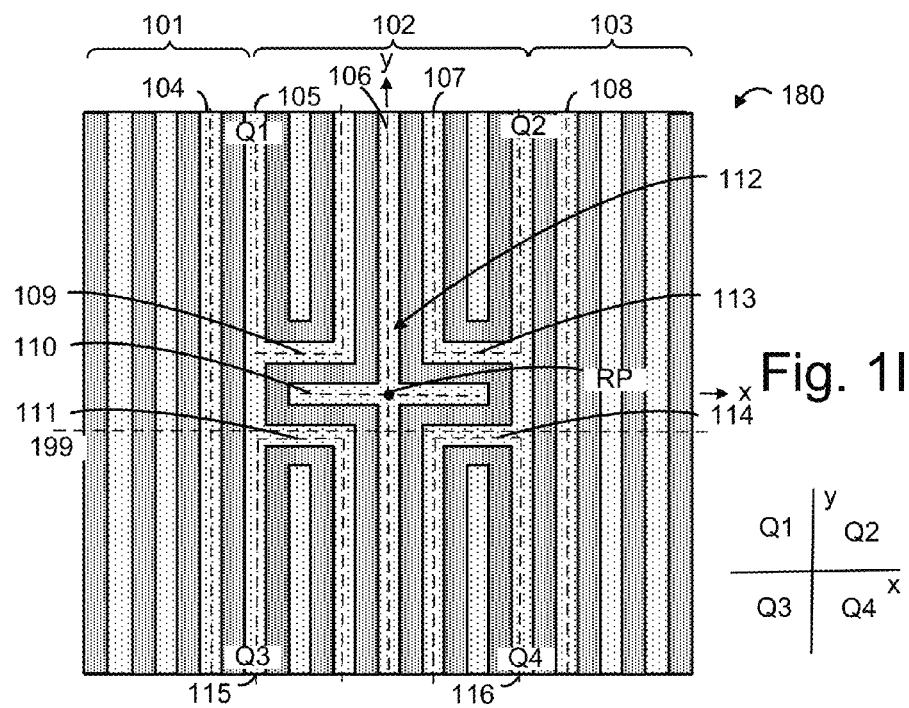

FIG. 1I depicts a top view of the layered semiconductor material of FIG. 1G after removing the core layer material. An example approach uses reactive ion etching. This results in a pattern of spacers in the SP layer. The layered semiconductor material 180 encompasses an area which includes a central area 102, a left-side lateral area 101 adjacent to and on a left side of the central area, and a right-side lateral area 103 adjacent to and on a right side of the central area. The central area has a reference point (RP) which may be at a center of the central area. RP may denote the origin of a Cartesian coordinate system having the x, y and z axes.

The layered semiconductor material 180 has a pattern with various features. The pattern is provided in an area of the layered semiconductor material which extends in a first direction (y-direction) and in a second direction (x-direction), transverse to the first direction.

Generally, features of a pattern can be provided by peaks and/or trenches in the pattern. For example, portions of the pattern in the left-side and right-side lateral areas comprise lines 104 and 108 as trenches which extend uninterrupted through the left-side and right-side lateral areas, 101 and 103, respectively. The central area comprises four quadrants Q1-Q4 relative to the reference point. A portion of the pattern in each quadrant comprises a loop. For example, Q1 has a loop indicated by dashed line 105, Q2 has a loop indicated by dashed line 107, Q3 has a loop indicated by dashed line 115, and Q4 has a loop indicated by dashed line 116. The loops in this example are formed by trenches in the pattern, e.g., by portions of the WL which are between portions of the SP layer. Each loop comprises a closed end in the central area. For example, loops 105, 107, 115 and 116 have closed ends 109, 113, 111 and 114, respectively. A loop can be U-shaped, with two parallel legs and a closed end which joins the two parallel legs. The closed end may be transverse to the legs. Further, a portion of the pattern in the central area comprises a cross 112 which extends uninterrupted through the central area. The cross is symmetric with respect to both the x- and y-axes. The cross generally has two straight portions 106 and 110 which are transverse to one another.

Figure 1J:
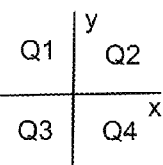
Figure 1J:
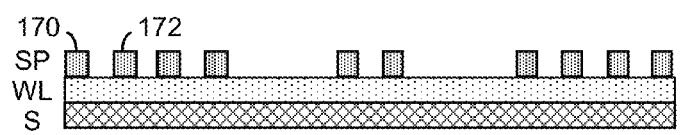

FIG. 1J depicts a cross-sectional view of the layered semiconductor material of FIG. 1I along line 199.

Figure 1K:
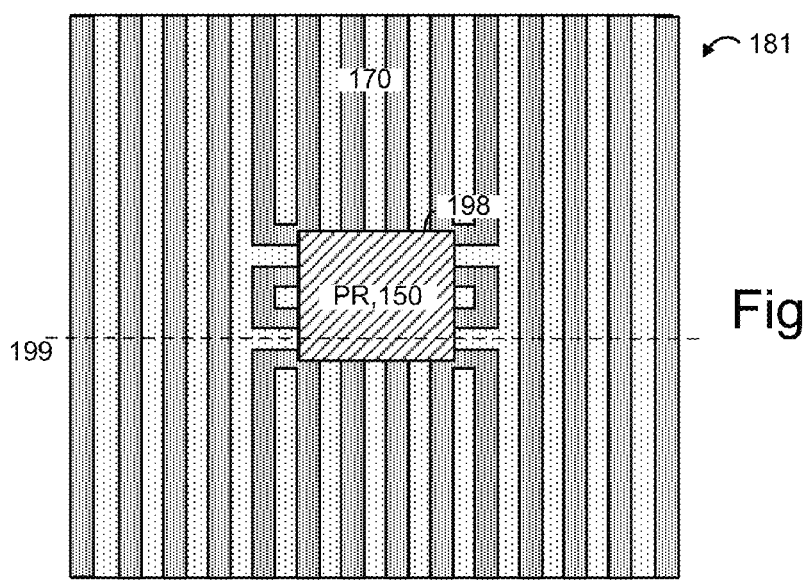

FIG. 1K depicts a top view of the layered semiconductor material of FIGS. 1I and 1J after masking the pattern of FIGS. 1I and 1J to define a cut out area 198. A masked pattern 181 is depicted. The cut out area, or overlay area, is an area in which a pattern of a metal wiring layer is excluded and therefore not provided, when the pattern is subsequently formed in the WL. In one approach, the cut out area is rectangular (e.g., a square or an oblong rectangle) and is defined by depositing photoresist 150 whose perimeter and area are coincident with the perimeter and area of the cut out area. The cut out area 198 is contained within the central area 102 and extends from the RP outward to overlap the closed ends 109, 113, 111 and 114 in the quadrants Q1, Q2, Q3 and Q4, respectively. Additionally, the cut out area overlaps portions of the cross 112 which are between the RP and the closed ends. An area 170 is outside the cut out area 198.

Figure 1L:
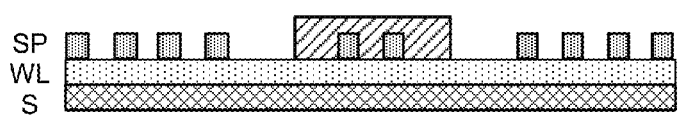

FIG. 1L depicts a cross-sectional view of the layered semiconductor material of FIG. 1K along line 199.

Figure 1M:
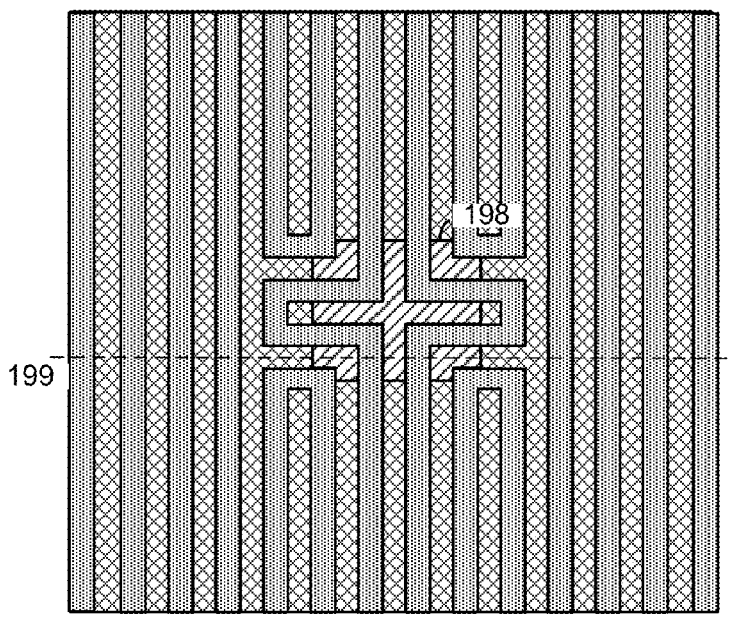

FIG. 1M depicts a top view of the layered semiconductor material of FIGS. 1K and 1L after performing Damascene etching. Damascene etching provides a pattern in an underlying layer corresponding to a pattern in an overlying layer. The pattern in the underlying layer includes trenches or low regions which are subsequently filled with a material such as metal. A pattern formed by the metal therefore corresponds to a pattern of trenches in the overlying layer. WL is a patterned metal wiring layer in the layered semiconductor material. In this case, SP is the overlying layer and WL is the underlying layer. The etching also reduces a height of the PR in the cut out area. The substrate (S) is exposed.

Figure 1N:
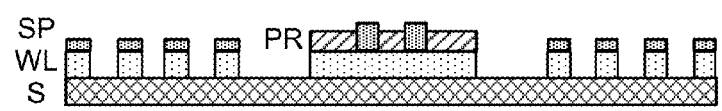

FIG. 1N depicts a cross-sectional view of the layered semiconductor material of FIG. 1M along line 199. Portions of the SP layer may remain on top of the peaks in the WL.

Figure 1O:
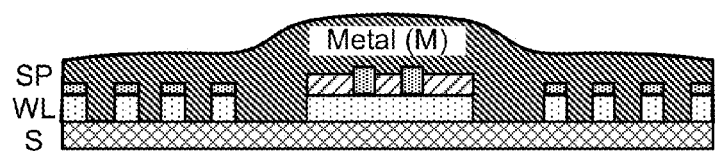

FIG. 1O depicts the cross-sectional view of the layered semiconductor material of FIG. 1O after depositing metal (M). A metal such as copper, tungsten or aluminum may be used.

Figure 1P:
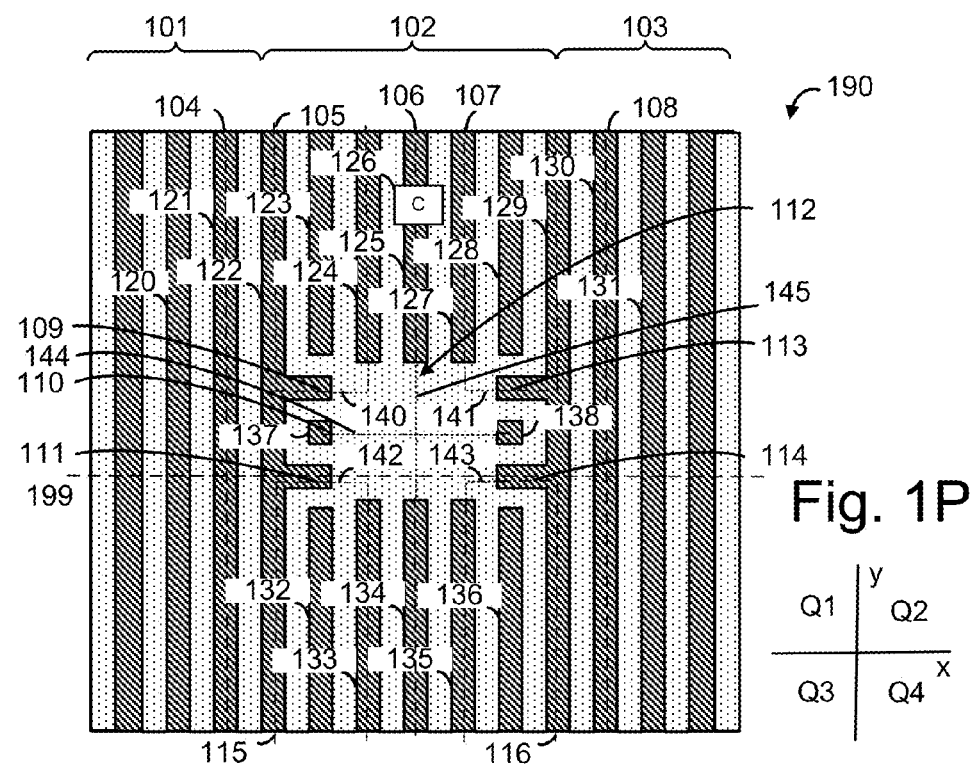

FIG. 1P depicts a top view of the layered semiconductor material of FIG. 1N after performing chemical-mechanical polishing (CMP) to planarize a top surface of the material. Portions of the SP and PR that remained in FIG. 1N are also removed. This results in a metal wiring layer WL with metal lines or regions between the remaining dielectric portions of the wiring layer. The metal wiring layer 190 includes metal lines which extend uninterrupted through the left-side lateral area 101 (such as lines 120 and 121) and the right-side lateral area 103 (such as lines 130 and 131). These can be active (e.g., signal or power carrying) lines in the resulting semiconductor device. Metal lines 121 and 130 are coincident with straight line trenches 104 and 108, respectively, in FIG. 1I.

Generally, the Damascene, single space process can be used to provide a patterned metal wiring layer having 5+2N cut lines in the central area, where N is an integer having a value of zero or more.

Moreover, in Q1, part of metal wiring layer portion 122 in the y direction, part of metal wiring layer portion 122 in the x direction, and all of metal wiring layer portion 124 are coincident with the loop trench 105 in FIG. 1I (as shown by the overlay of the dashed lines). Similarly, in Q2, part of metal wiring layer portion 129 in the y direction, part of metal wiring layer portion 129 in the x direction, and all of metal wiring layer portion 127 are coincident with the loop trench 107 in FIG. 1I. Similarly, in Q3, part of metal wiring layer portion 122 in the y direction, part of metal wiring layer portion 122 in the x direction, and all of metal wiring layer portion 133 are coincident with the loop trench 115 in FIG. 1I. Similarly, in Q4, part of metal wiring layer portion 129 in the y direction, part of metal wiring layer portion 129 in the x direction, and all of metal wiring layer portion 139 are coincident with the loop trench 116 in FIG. 1I.

Regarding the loops 105, 107, 115 and 116, the long dashed lines represent portions of the loops which have a corresponding metal wiring layer portion and the short dashed lines represent portions of the loops which do not have a corresponding metal wiring layer portion. These metal wiring layer portions can be said to form broken loops with a broken end in the central area 102. The short dashed lines 140, 141, 142 and 143 represent broken regions of the loops 105, 107, 115 and 116, respectively.

The breaks in the loops are a result of the masking of the cut out area to exclude any portion of the metal wiring layer in the cut out area. A broken loop comprises metal wiring layer portions which would form a loop in the absence of the use of the cut out area. The broken or omitted portions of the loops are co-located with the cut out area.

Metal wiring layer portions 123, 128, 132 and 136 are straight lines which terminate within the broken loops 105, 107, 115 and 116, respectively.

Further, metal wiring layer portions 124 and 133 extend in the y-direction, co-linearly, but are separated from one another by the cut out area. Metal wiring layer portions 125 and 134 extend in the y-direction, co-linearly, but are separated from one another by the cut out area. Metal wiring layer portions 127 and 135 extend in the y-direction, co-linearly, but are separated from one another by the cut out area.

Metal wiring layer portions 125 and 134 are coincident with the trench line 106 of FIG. 1I, while metal wiring layer portions 137 and 138 are coincident with the trench line 110 of FIG. 1I. The long dashed lines represent portions of the cross 112 which have a corresponding metal wiring layer portion and the short dashed lines represent portions of the cross which do not have a corresponding metal wiring layer portion. These metal wiring layer portions (137, 138, 125, 134) can be said to form a broken cross in the central area 102. The short dashed lines 144 (x direction) and 145 (y direction) represent broken or omitted regions of the cross. The breaks in the cross are a result of the masking of the cut out area to exclude any portion of the metal wiring layer in the cut out area. A broken cross comprises metal wiring layer portions which would form a cross in the absence of the use of the cut out area. The broken portions of the cross are co-located with the cut out area.

A contact 126 which is connected to the wiring layer portion 125, for instance, may be provided.

This process results in a wiring layer with five cut wires, as depicted by wiring layer portions 123-125, 127 and 128.

Figure 1Q:
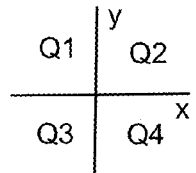

FIG. 1Q depicts a cross-sectional view of the layered semiconductor material of FIG. 1P along line 199.

FIG. 1R depicts the view of FIG. 1P in further detail, showing broken loop and cross regions. The loop 105 includes a broken region 160 at the broken end 109, the loop 107 includes a broken region 161 at the broken end 113, the loop 115 includes a broken region 162 at the broken end 111, and the loop 116 includes a broken region 163 at the broken end 114. Additionally, the cross 112 includes a broken region 164 which include a first portion extending in the y direction along the y axis and a second portion extending in the x direction along the x axis, transverse to the first portion, and intersecting the first portion. The broken region can be, e.g., a corner of the loop end, or all of the loop end. The broken region part of the parallel legs of the broken loop.

Figure 2A:
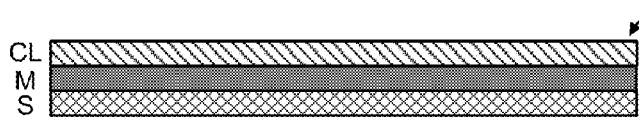
FIGS. 2A-2X depict views of a layered semiconductor material which is processed to form a wiring layer using a single spacer, subtractive etch process, with six cut wires.
Figure 2B:
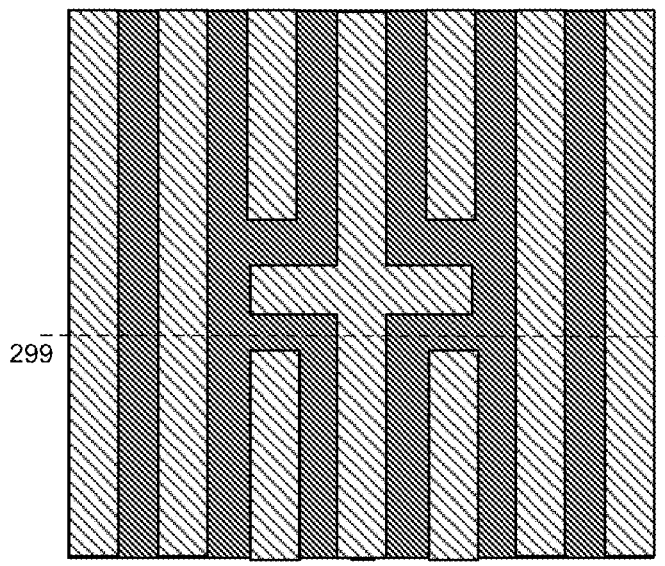
Figure 2C:
Figure 2D:
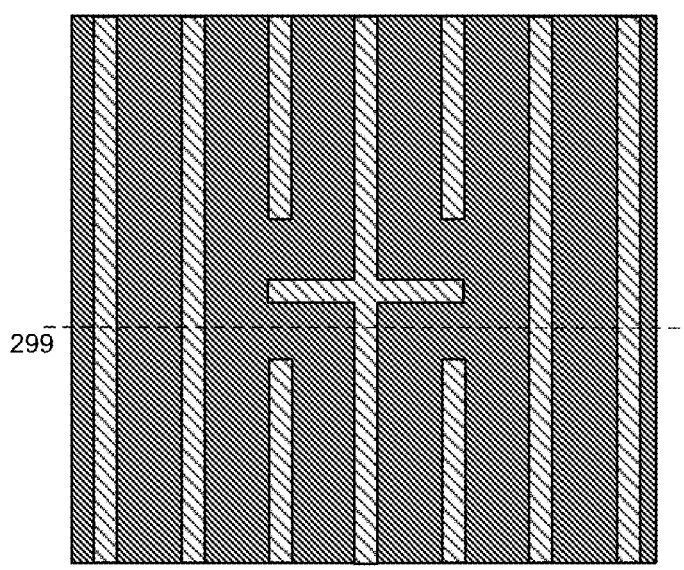
Figure 2E:
Figure 2F:
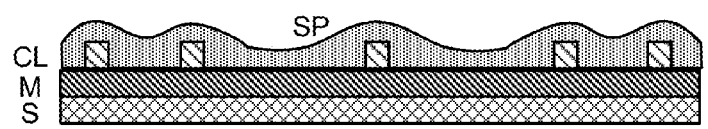
Figure 2G:
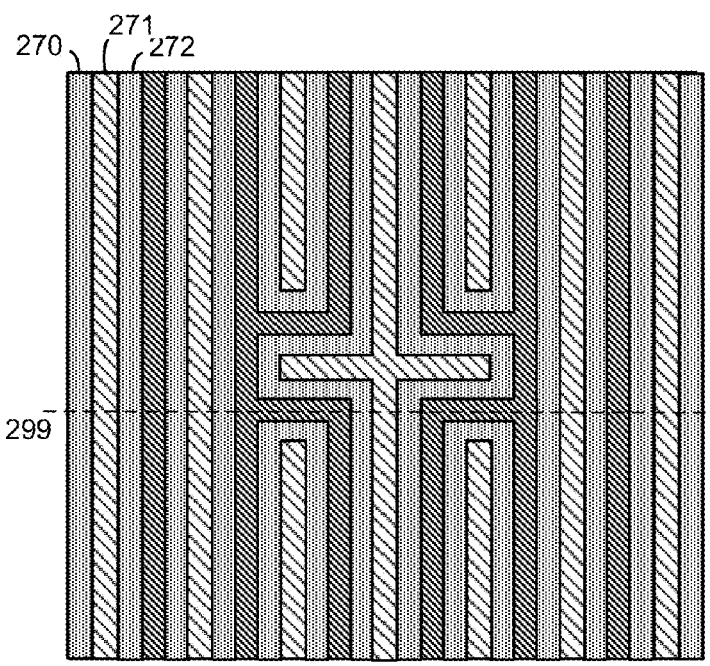
Figure 2H:
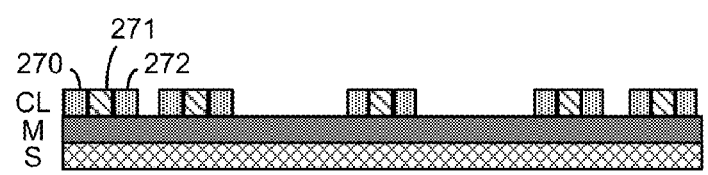
Figure 2I:
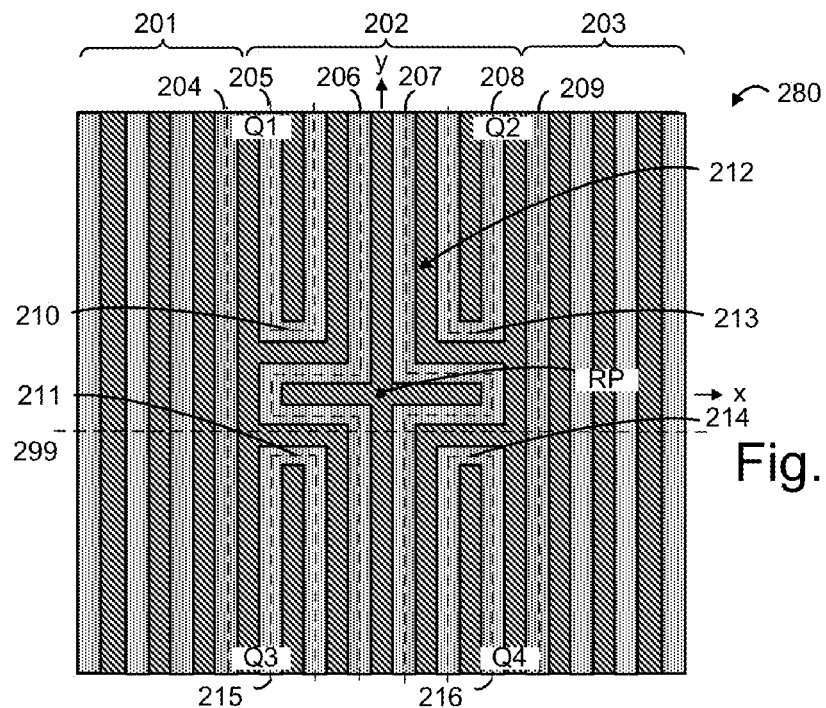
Figure 2J:
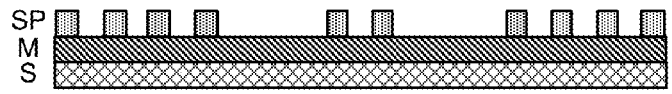
Figure 2K:
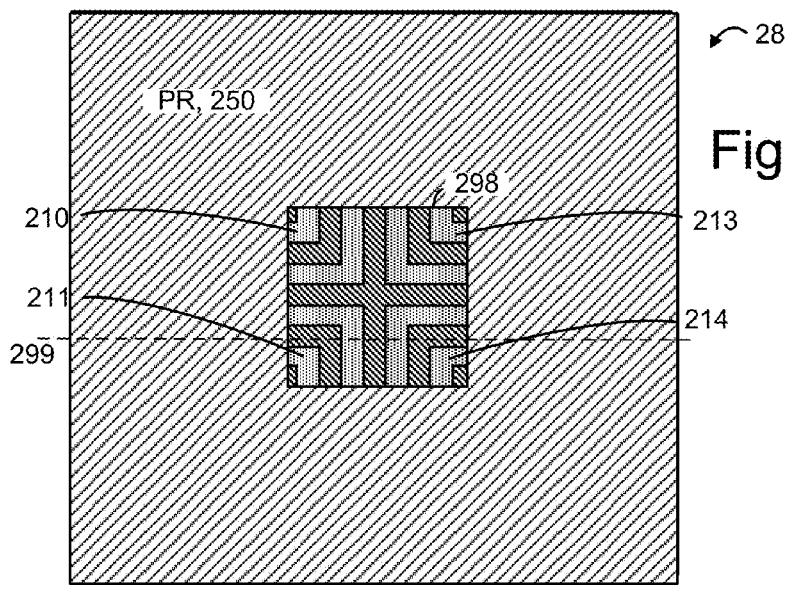
Figure 2L:
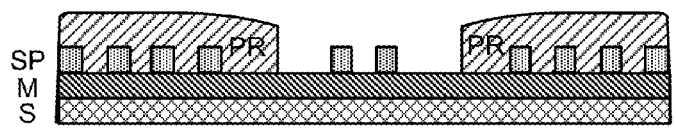
Figure 2M:
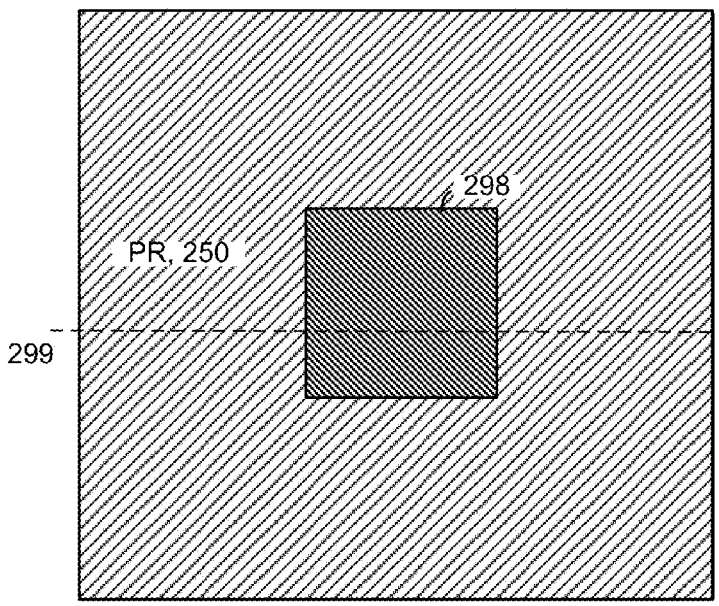
Figure 2N:
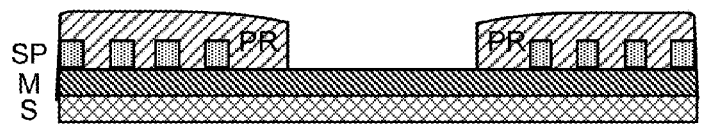
Figure 2O:
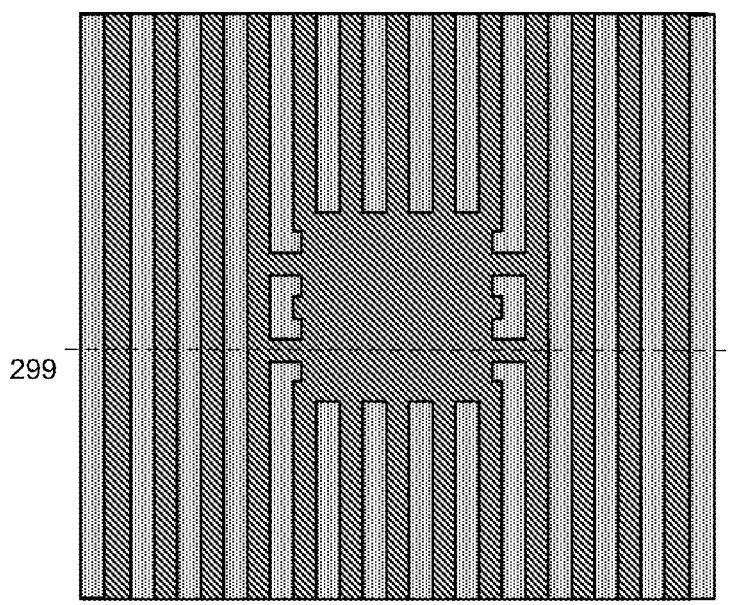
Figure 2P:
Figure 2Q:
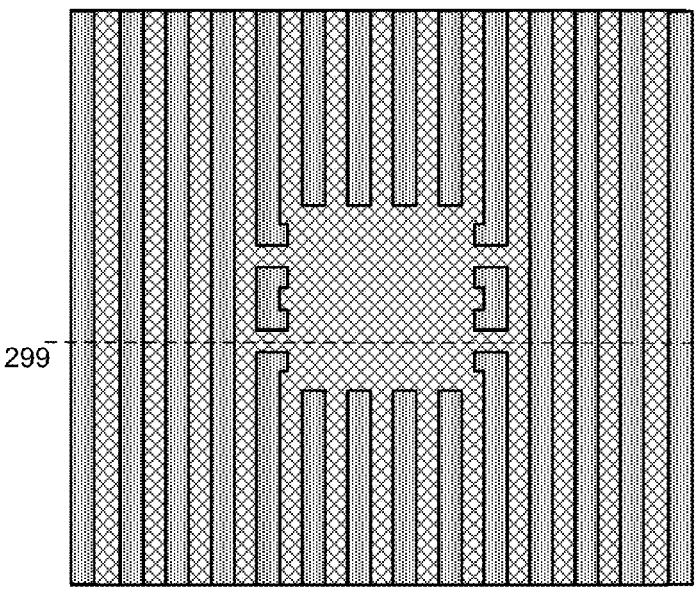
Figure 2R:
Figure 2S:
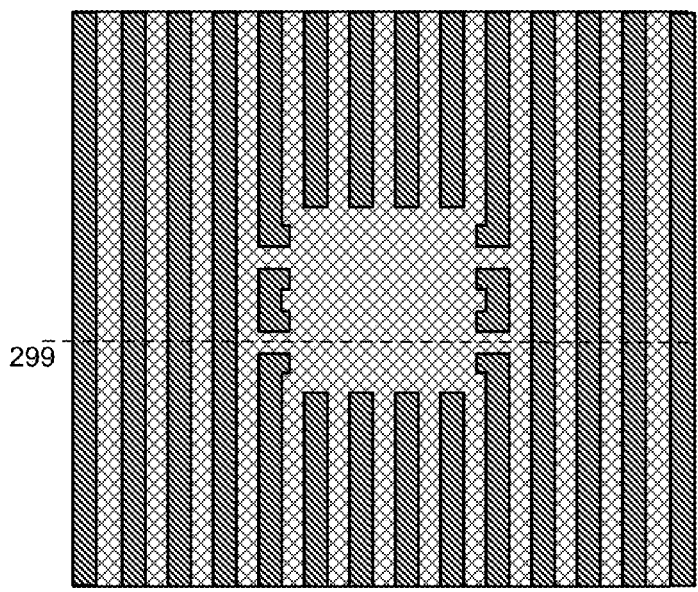
Figure 2T:
Figure 2U:
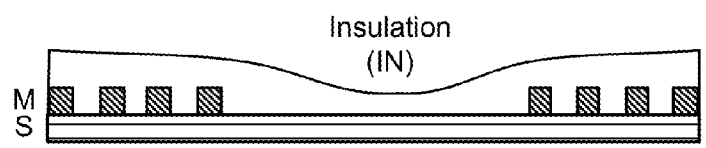
Figure 2V:
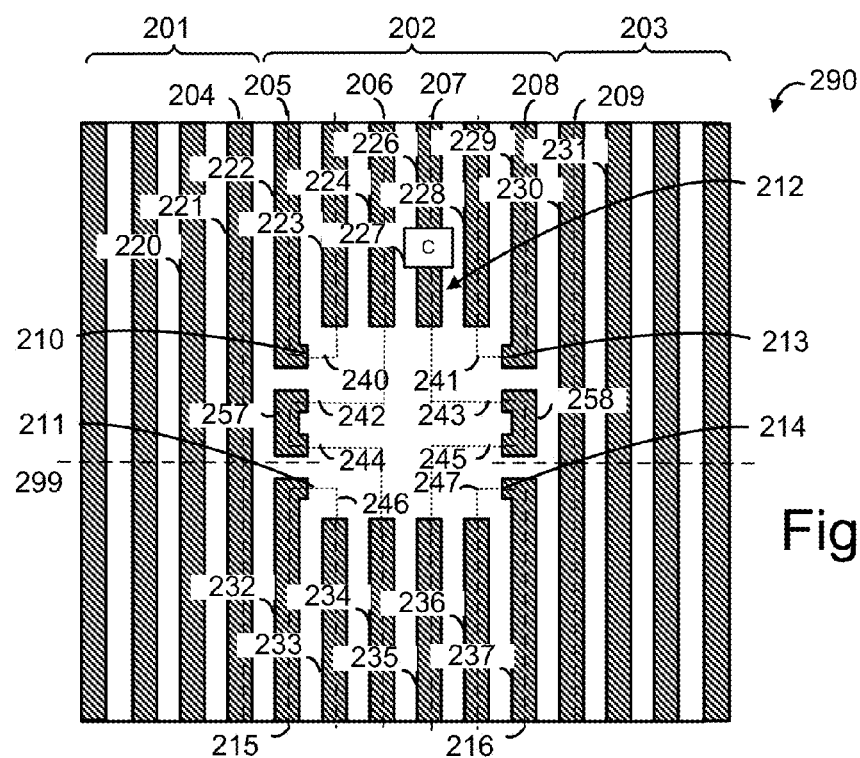
Figure 2W:
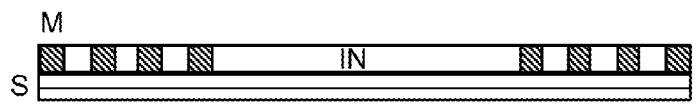
Figure 2X:
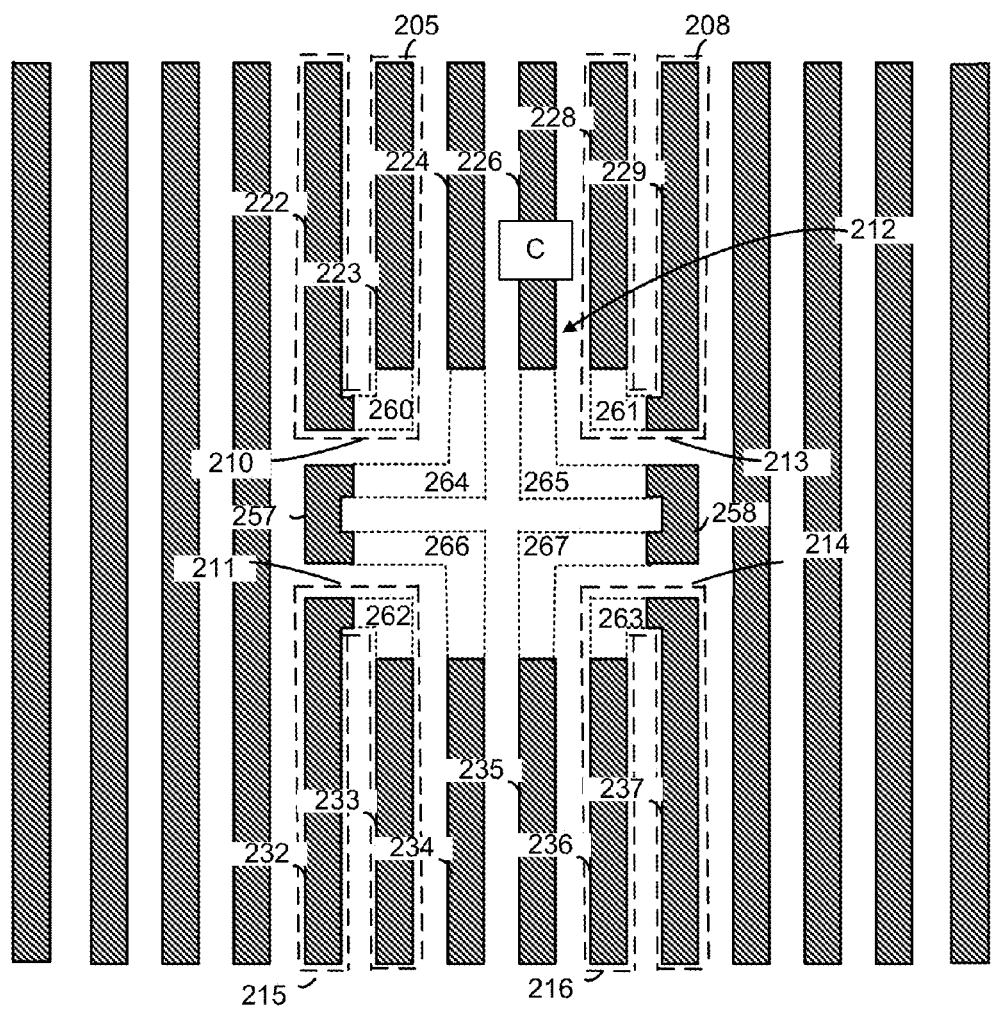

FIGS. 2A-2X depict views of a layered semiconductor material which is processed to form a wiring layer using a single spacer, subtractive etch process, with six cut wires. To assist in identifying common elements, some of the elements are filled in with a pattern which is consistent across this set of figures. A subtractive etch process can be used to pattern a metal layer which is an underlying layer in a layered semiconductor device.

FIG. 2A provides an example layered semiconductor device 200 which includes a substrate, a metal layer and a core layer (CL).

FIG. 2B depicts a top view of the layered semiconductor material 200 after a pattern is formed in the CL. The pattern is formed by removing portions of the CL using lithography.

FIG. 2C depicts a cross-sectional view of the layered semiconductor material of FIG. 2B along line 299.

FIG. 2D depicts a top view of the layered semiconductor material of FIGS. 2B and 2C after performing a slimming process which reduces the thickness of the features of the CL.

FIG. 2E depicts a cross-sectional view of the layered semiconductor material of FIG. 2D along line 299.

FIG. 2F depicts the cross-sectional view of FIG. 2E after deposition of a sidewall material.

FIG. 2G depicts a top view of the layered semiconductor material of FIG. 2F after etching. An example uses reactive ion etching. This step results in the formation of spacers on the sidewalls of the lines in the core layer. For example spacers 270 and 272 are formed on sidewalls of a line 271 of the core layer material.

FIG. 2H depicts a cross-sectional view of the layered semiconductor material of FIG. 2G along line 299.

FIG. 2I depicts a top view of the layered semiconductor material of FIG. 2G after removing the core layer material. An example approach uses reactive ion etching. This results in a pattern of spacers in the SP layer. The layered semiconductor material 280 encompasses an area which includes a central area 202, a left-side lateral area 201 adjacent to and on a left side of the central area, and a right-side lateral area 203 adjacent to and on a right side of the central area. The central area has a reference point (RP) which may be at a center of the central area.

The layered semiconductor material 280 has a pattern with various features. The pattern is provided in an area of the layered semiconductor material which extends in a first direction (y-direction) and in a second direction (x-direction), transverse to the first direction.

For example, portions of the pattern in the left-side and right-side lateral areas comprise lines (e.g., peaks) 204 and 208 which extend uninterrupted through the left-side and right-side lateral areas, 201 and 203, respectively. The central area comprises four quadrants Q1-Q4 relative to the reference point. A portion of the pattern in each quadrant comprises a loop. For example, Q1 has a loop indicated by dashed line 205, Q2 has a loop indicated by dashed line 208, Q3 has a loop indicated by dashed line 215, and Q4 has a loop indicated by dashed line 216. The loops in this example are formed by peaks in the pattern, e.g., by portions of the SP layer which are above the metal (M) layer. Each loop comprises a closed end in the central area. For example, loops 205, 208, 215 and 216 have closed ends 210, 213, 211 and 214, respectively. Further, a portion of the pattern in the central area comprises a cross 212 which extends uninterrupted through the central area. The cross is symmetric with respect to both the x- and y-axes.

The cross generally has two opposing sides 206 and 207 which are mirror images of one another with respect to the x and y axes. The two opposing sides in this example are formed by peaks in the pattern. In other words, the cross comprises left and right side features (206 and 207, respectively) which are mirror images of one another with respect to the first and second axes, where the left and right side features extend uninterrupted through the central area, between the loops.

Alternatively a cross can be defined which comprises a single straight line/trench in the y direction, between lines/peaks 206 and 207, and a single straight line/trench in the x direction, where these lines intersect at RP.

FIG. 2J depicts a cross-sectional view of the layered semiconductor material of FIG. 2I along line 299.

FIG. 2K depicts a top view of the layered semiconductor material of FIGS. 2I and 2J after masking the pattern of FIGS. 2I and 2J to define a cut out area 298. A masked pattern 181 is depicted. In one approach, the cut out area is defined by depositing photoresist 250 outside the cut out area, so that the photoresist has an opening (an inner edge) which is coincident with a perimeter of the cut out area 298.

The cut out area 298 is contained within the central area 202 and extends from the RP outward to overlap the closed ends 210, 213, 211 and 214 in the quadrants Q1, Q2, Q3 and Q4, respectively. Additionally, the cut out area overlaps portions of the cross 212 which are between the RP and the closed ends.

FIG. 2L depicts a cross-sectional view of the layered semiconductor material of FIG. 2K along line 299.

FIG. 2M depicts a top view of the layered semiconductor material of FIGS. 2K and 2L after performing etching to remove portions of the spacers in the cut out area, e.g., unmasked portions of the SP layer.

FIG. 2N depicts a cross-sectional view of the layered semiconductor material of FIG. 2N along line 299.

FIG. 2O depicts a top view of the layered semiconductor material of FIGS. 2M and 2N after removing the photoresist, leaving a spacer pattern in the SP layer outside the cutout area.

FIG. 2P depicts a cross-sectional view of the layered semiconductor material of FIG. 2O along line 299.

FIG. 2Q depicts a top view of the layered semiconductor material of FIGS. 2O and 2P after etching the metal layer using the spacers in the SP layer as a mask, resulting in a pattern of peaks in the M and SP layers.

FIG. 2R depicts a cross-sectional view of the layered semiconductor material of FIG. 2Q along line 299.

FIG. 2S depicts a top view of the layered semiconductor material of FIGS. 2Q and 2R after removing the spacer material from the SP layer, resulting in a pattern of peaks in the M layer. These peaks form the pattern of the metal wiring layer.

FIG. 2T depicts a cross-sectional view of the layered semiconductor material of FIG. 2S along line 299.

FIG. 2U depicts a cross-sectional view of the layered semiconductor material of FIGS. 2S and 2T after depositing insulation (IN).

FIG. 2V depicts a top view of the layered semiconductor material of FIG. 2U after performing CMP to planarize a top surface of the material, resulting in the final metal wiring layer 290.

The metal wiring layer 290 includes metal lines which extend uninterrupted through the left-side lateral area 201 (such as lines 220 and 221) and the right-side lateral area 203 (such as lines 230 and 231). These can be active lines in the resulting semiconductor device. Metal lines 221 and 230 are coincident with straight line peaks 204 and 208, respectively, in FIG. 2I.

Moreover, in Q1, metal wiring layer portions 222 and 223 are coincident with the loop peaks 205 in FIG. 2I (as shown by the overlay of the dashed lines). Similarly, in Q2, metal wiring layer portions 228 and 229 are coincident with the loop peak 208 in FIG. 2I. Similarly, in Q3, metal wiring layer portions 232 and 233 are coincident with the loop peak 215 in FIG. 2I. Similarly, in Q4, metal wiring layer portions 236 and 237 are coincident with the loop peak 216 in FIG. 2I.

Regarding the loops 205, 208, 215 and 216, the long dashed lines represent portions of the loops which have a corresponding metal wiring layer portion and the short dashed lines represent portions of the loops which do not have a corresponding metal wiring layer portion. These metal wiring layer portions can be said to form broken loops with a broken end in the central area 202. The short dashed lines 240, 241, 246 and 247 represent broken regions of the loops 205, 208, 215 and 216, respectively.

The breaks in the loops are a result of the masking of the cut out area to exclude any portion of the metal wiring layer in the cut out area. A broken loop comprises metal wiring layer portions which would form a loop in the absence of the use of the cut out area. The broken or omitted portions of the loops are co-located with the cut out area.

Further, metal wiring layer portions 224 and 234 extend in the y-direction, co-linearly, but are separated from one another by the cut out area. Metal wiring layer portions 226 and 235 extend in the y-direction, co-linearly, but are separated from one another by the cut out area.

Metal wiring layer portions 224, 257 and 234 are coincident with the line 206 of FIG. 2I, which defines the left side of the cross 212, while metal wiring layer portions 226, 258 and 236 are coincident with the line 207 of FIG. 2I, which defines the right side of the cross 212.

The long dashed lines represent portions of the cross 212 which have a corresponding metal wiring layer portion and the short dashed lines represent portions of the cross which do not have a corresponding metal wiring layer portion. These metal wiring layer portions (224, 257 and 234; 226, 258 and 236) can be said to form a broken cross in the central area 202. The short dashed lines 242-245 represent broken or omitted regions of the cross. The breaks in the cross are a result of the masking of the cut out area to exclude any portion of the metal wiring layer in the cut out area. A broken cross comprises metal wiring layer portions which would form a cross in the absence of the use of the cut out area. The broken portions of the cross are co-located with the cut out area.

A contact 227 which is connected to the wiring layer portion 226, for instance, may be provided.

This process results in a wiring layer with six cut wires, as depicted by wiring layer portions 222-224, 226, 228 and 229.

FIG. 2W depicts a cross-sectional view of the layered semiconductor material of FIG. 2V along line 299.

FIG. 2X depicts the view of FIG. 2V in further detail, showing broken loop and cross regions. The loop 205 includes a broken region 260 at the broken end 210, the loop 208 includes a broken region 261 at the broken end 213, the loop 215 includes a broken region 262 at the broken end 211, and the loop 216 includes a broken region 263 at the broken end 214. Additionally, the cross 212 includes broken regions 264-267. Each broken region includes a first portion extending in the y direction along the y axis and a second portion extending in the x direction along the x axis, transverse to the first portion, and intersecting the first portion. The first and second broken regions form a right angle or L-shape.

Figure 3D:
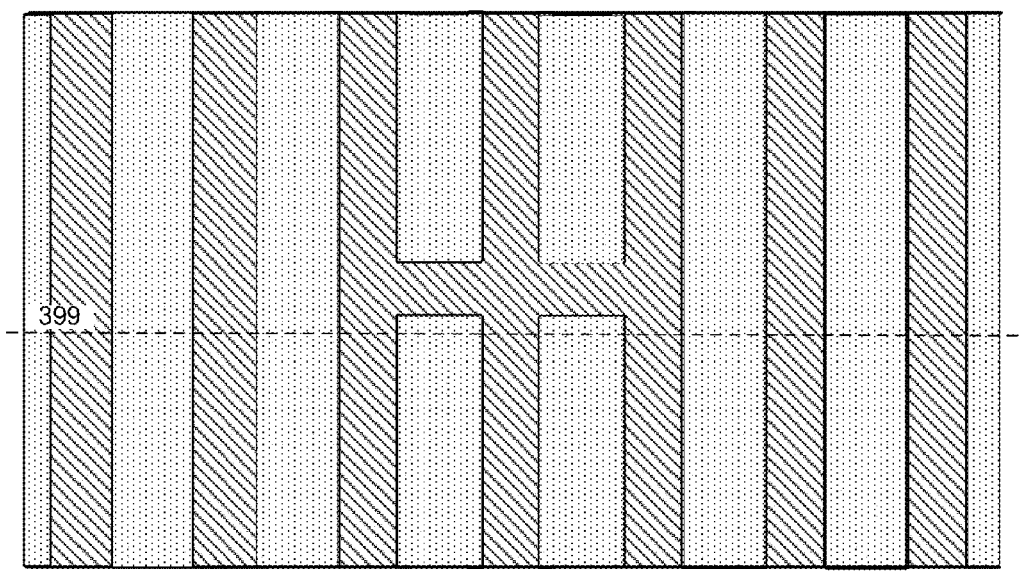
Figure 3E:
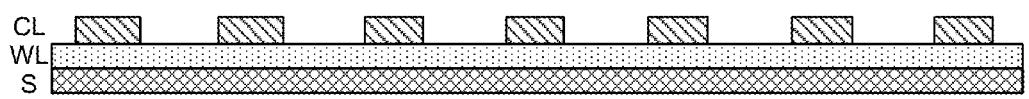
Figure 3F:
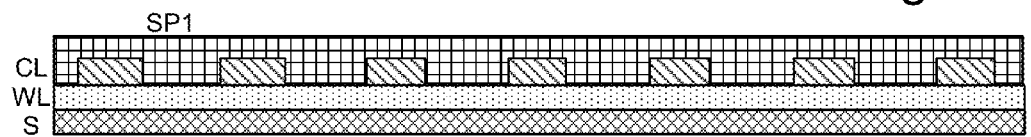
Figure 3G:
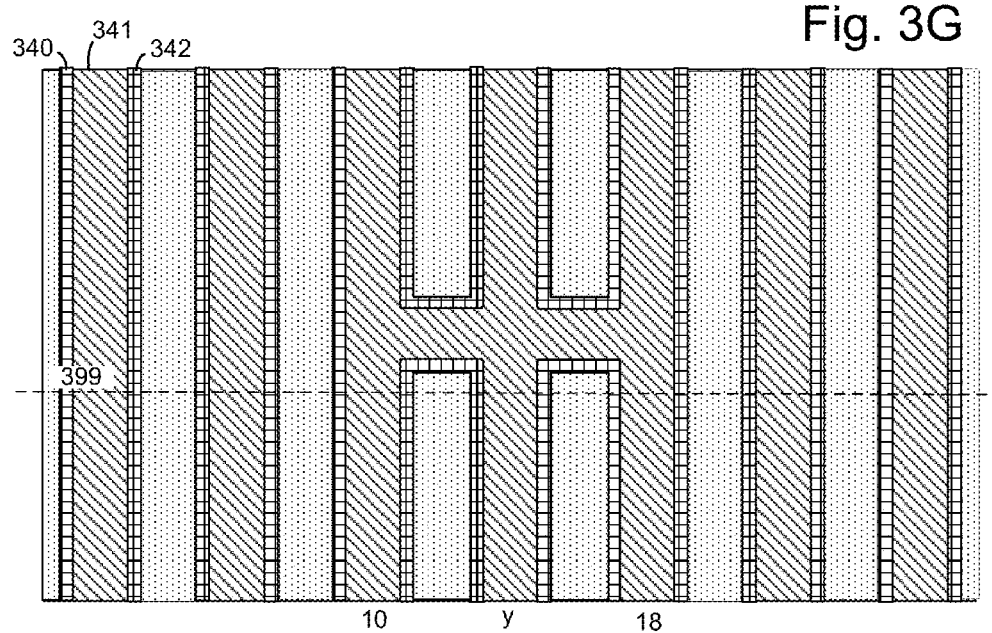
Figure 3H:
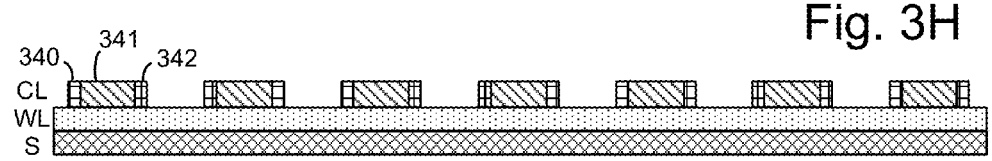
Figure 3I:
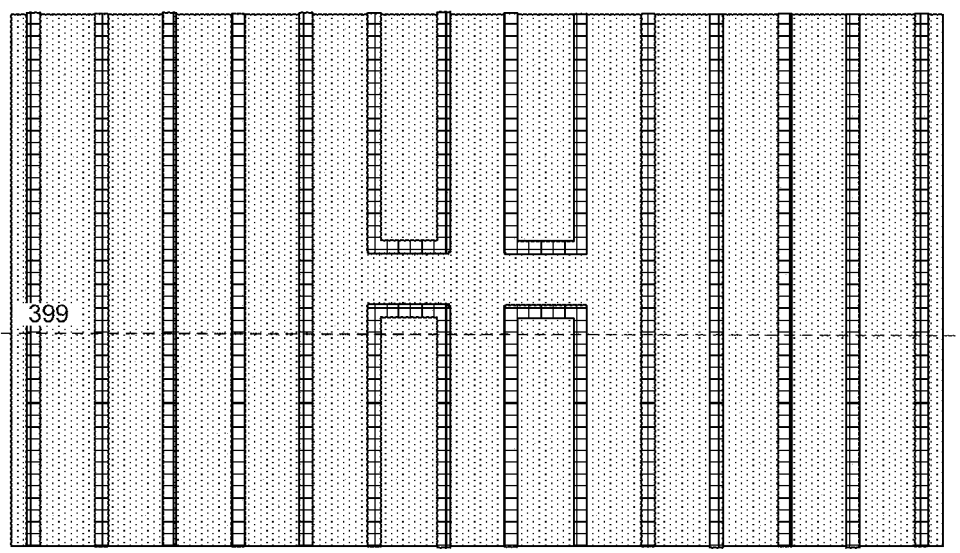
Figure 3J:
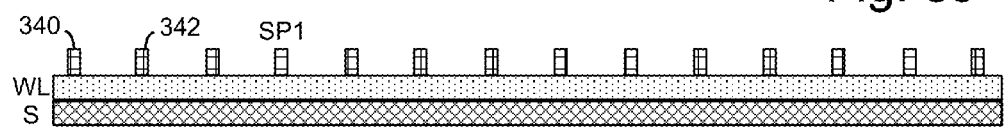
Figure 3K:
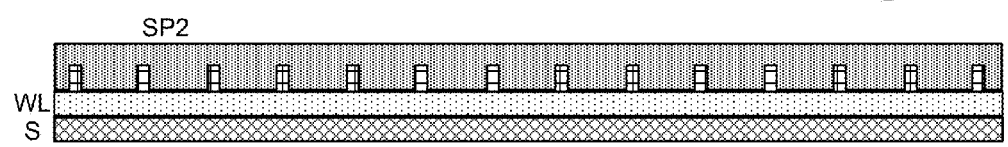
Figure 3L:
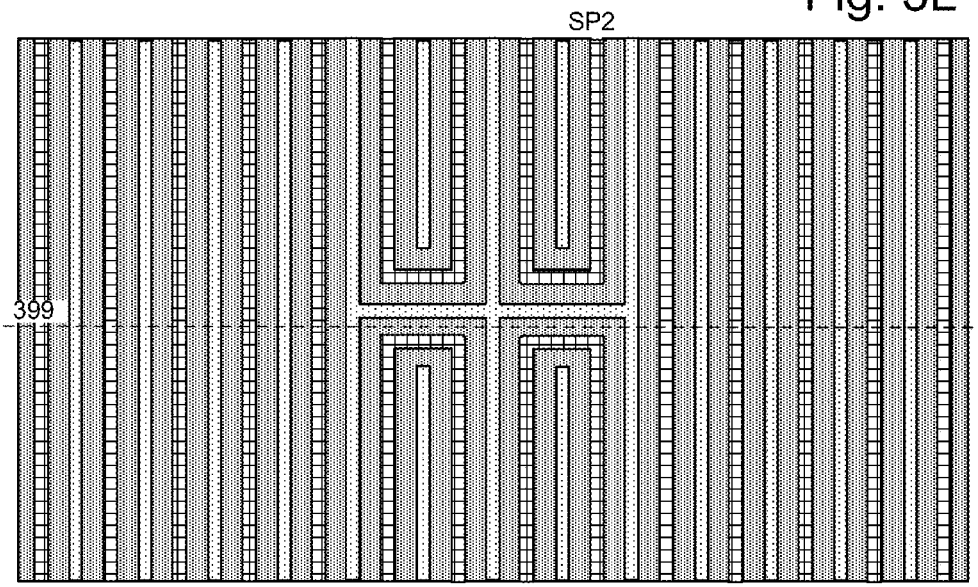
Figure 3M:
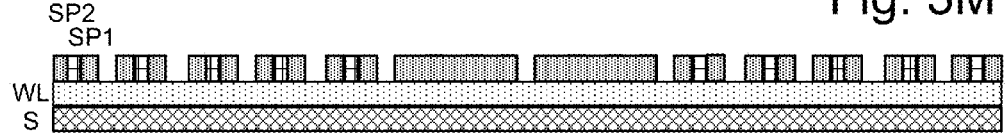
Figure 3N:
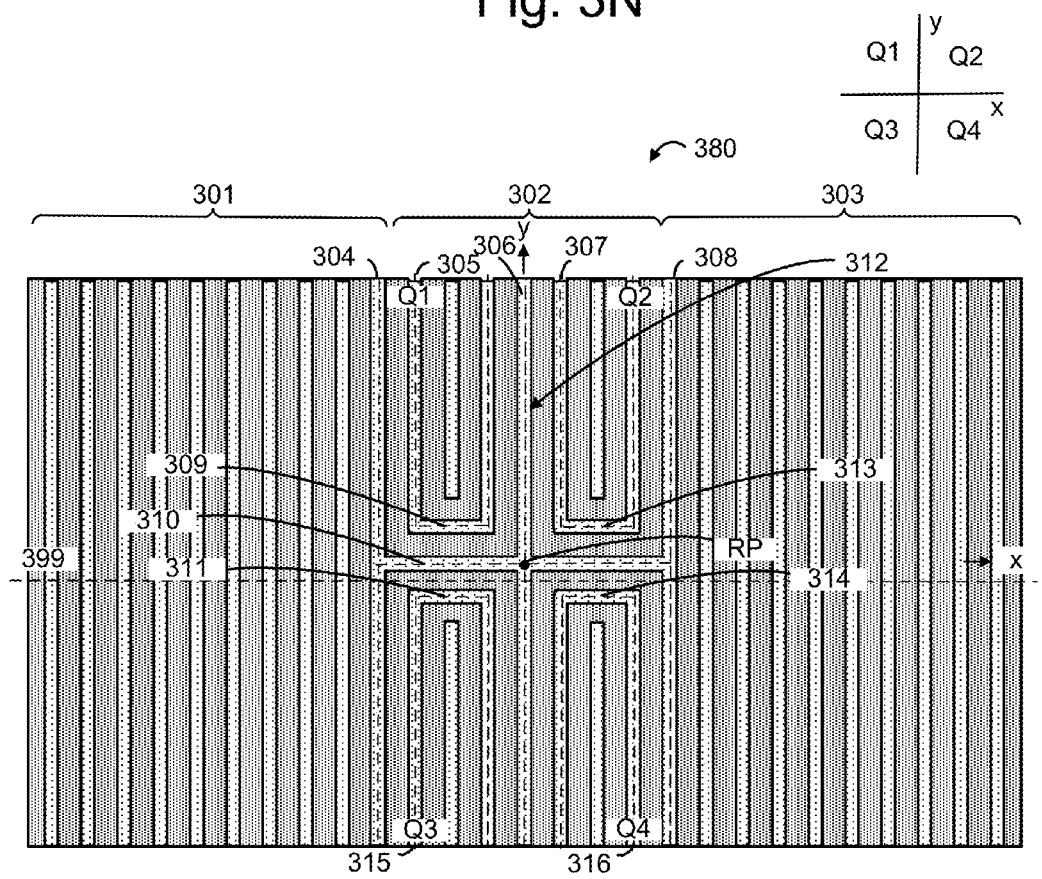
Figure 3O:
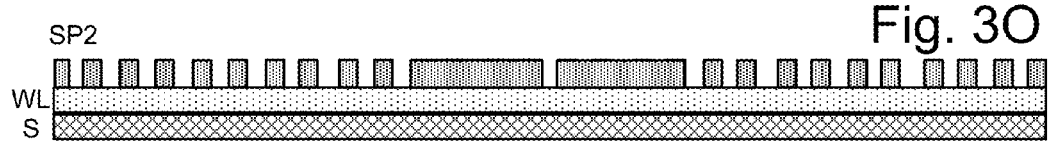
Figure 3P:
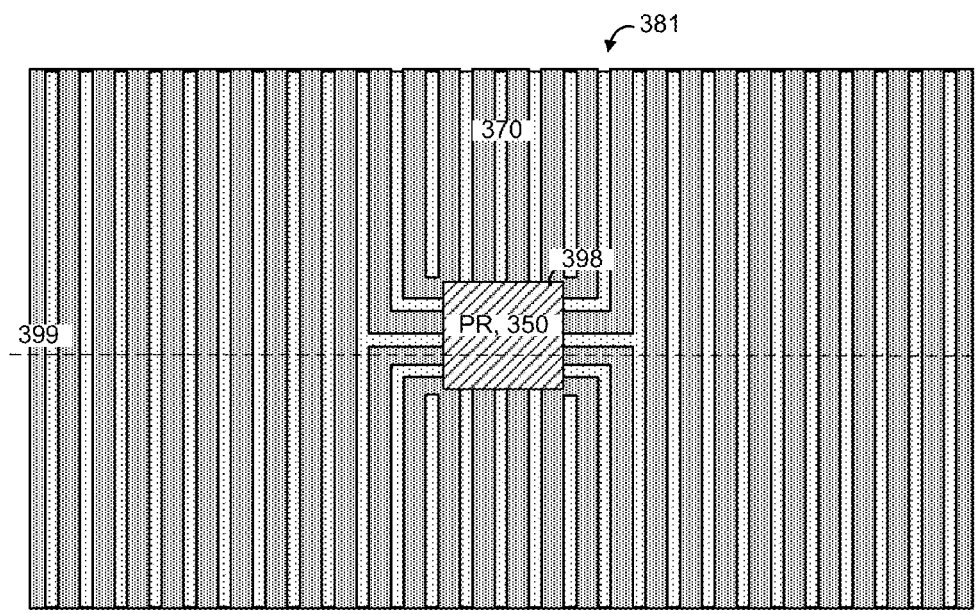
Figure 3Q:
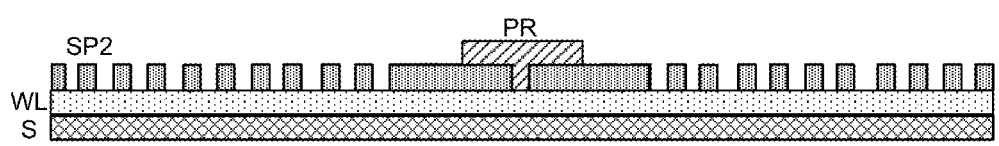
Figure 3R:
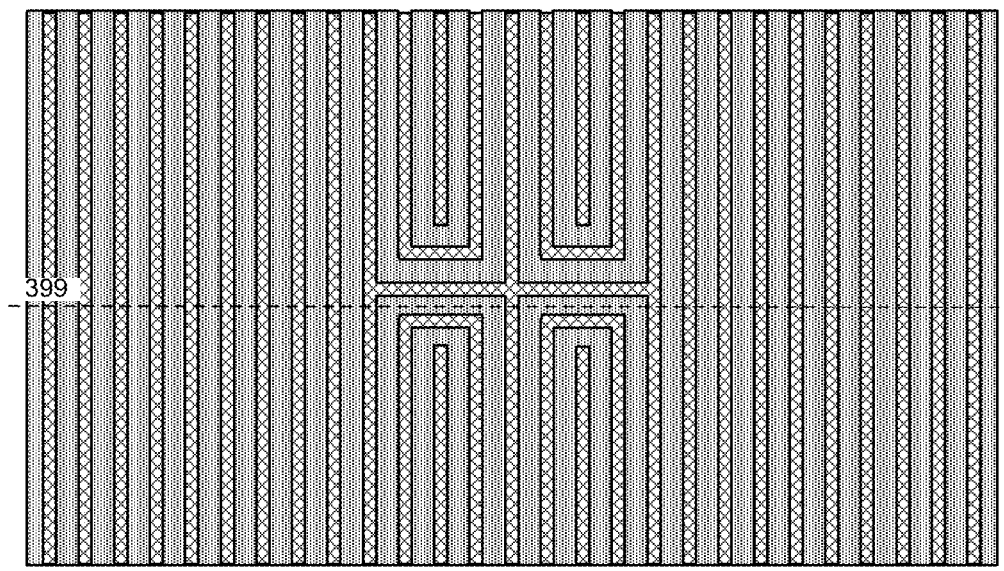
Figure 3S:
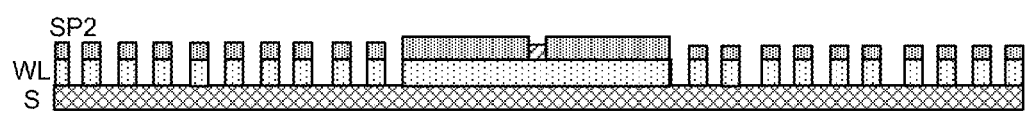
Figure 3T:
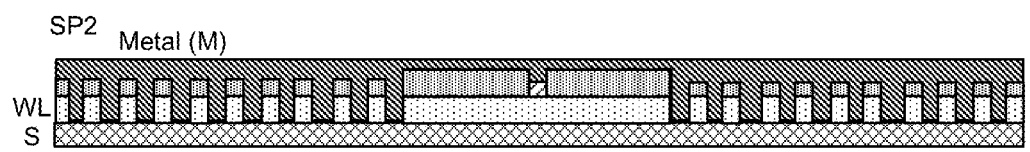
Figure 3U:
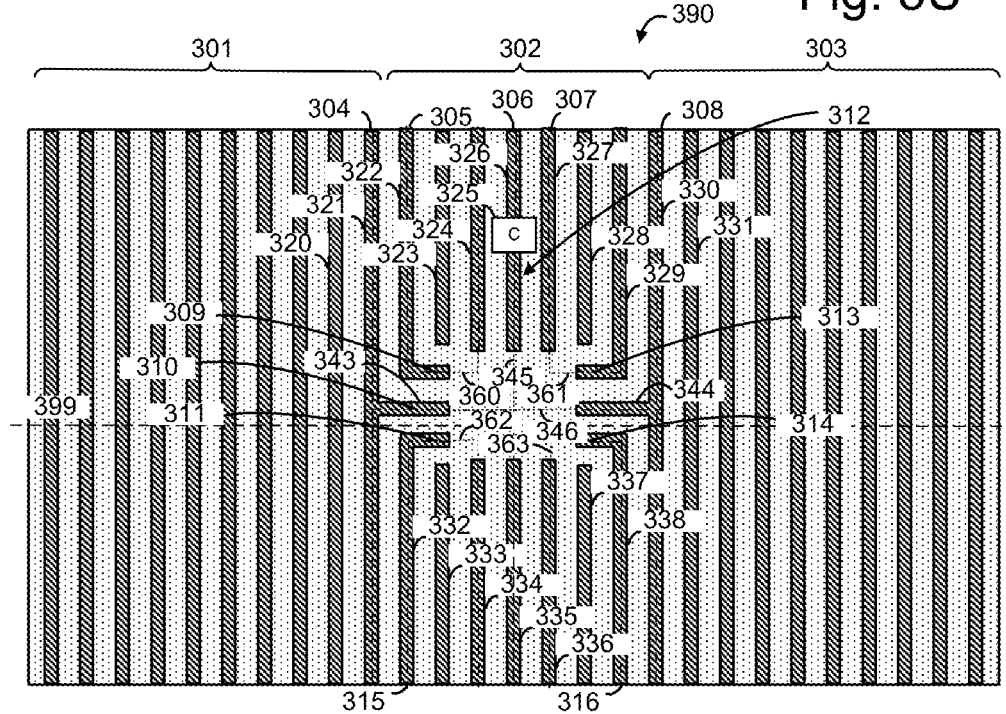
Figure 3V:
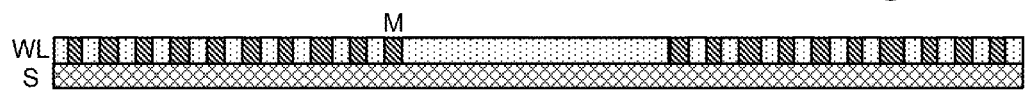

FIGS. 3A-3V depict views of a layered semiconductor material which is processed to form a wiring layer using a double spacer, Damascene process, with seven cut wires. While a double spacer process is depicted, the techniques can be extended to triple spacer or higher order spacer processes as well. To assist in identifying common elements, some of the elements are filled in with a pattern which is consistent across this set of figures.

FIG. 3A depicts a cross-sectional view of a layered semiconductor material 300 at a start of the process. As an example, the layered semiconductor material includes a substrate (S), a wiring layer (WL) and a core layer (CL).

FIG. 3B depicts a top view of the layered semiconductor material 300 after a pattern is formed in the CL. The pattern is formed by removing portions of the CL using lithography.

FIG. 3C depicts a cross-sectional view of the layered semiconductor material of FIG. 3B along line 399.

FIG. 3D depicts a top view of the layered semiconductor material of FIGS. 3B and 3C after performing a slimming process which reduces the thickness of the features of the CL.

FIG. 3E depicts a cross-sectional view of the layered semiconductor material of FIG. 3D along line 399.

FIG. 3F depicts the cross-sectional view of FIG. 3E after deposition of a first sidewall material (SP1).

FIG. 3G depicts a top view of the layered semiconductor material of FIG. 3F after etching. An example uses reactive ion etching. This step results in the formation of a first set of spacers (SP1) on the sidewalls of the lines in the core layer. For example spacers 340 and 342 are formed on sidewalls of a line 341 of the core layer material.

FIG. 3H depicts a cross-sectional view of the layered semiconductor material of FIG. 3G along line 399.

FIG. 3I depicts a top view of the layered semiconductor material of FIG. 3G after removing the core layer material, leaving the first set of spacers.

FIG. 3J depicts a cross-sectional view of the layered semiconductor material of FIG. 3I along line 399.

FIG. 3K depicts the cross-sectional view of FIG. 3J after depositing a second sidewall spacer material (SP2).

FIG. 3L depicts a top view of the layered semiconductor material of FIG. 3K after performing etching to remove portions of the second sidewall spacer material.

FIG. 3M depicts a cross-sectional view of the layered semiconductor material of FIG. 3L along line 399.

FIG. 3N depicts a top view of the layered semiconductor material of FIGS. 3L and 3M after removing the first sidewall space material, leaving a pattern of the second sidewall layer material. The layered semiconductor material 380 encompasses an area which includes a central area 302, a left-side lateral area 301 adjacent to and on a left side of the central area, and a right-side lateral area 303 adjacent to and on a right side of the central area. The central area has a reference point (RP) which may be at a center of the central area. RP may denote the origin of a Cartesian coordinate system having the x, y and z axes.

The layered semiconductor material 380 has a pattern with various features. The pattern is provided in an area of the layered semiconductor material which extends in a first direction (y-direction) and in a second direction (x-direction), transverse to the first direction.

For example, portions of the pattern in the left-side and right-side lateral areas comprise lines 304 and 308 as trenches which extend uninterrupted through the left-side and right-side lateral areas, 301 and 303, respectively. The central area comprises four quadrants Q1-Q4 relative to the reference point. A portion of the pattern in each quadrant comprises a loop. For example, Q1 has a loop indicated by dashed line 305, Q2 has a loop indicated by dashed line 307, Q3 has a loop indicated by dashed line 315, and Q4 has a loop indicated by dashed line 316. The loops in this example are formed by trenches in the pattern, e.g., by portions of the WL which are between portions of the SP2 layer. Each loop comprises a closed end in the central area. For example, loops 305, 307, 315 and 316 have closed ends 309, 313, 311 and 314, respectively. Further, a portion of the pattern in the central area comprises a cross 312 which extends uninterrupted through the central area. The cross is symmetric with respect to both the x- and y-axes. The cross generally has two straight portions 306 and 310 which are transverse to one another.

FIG. 3O depicts a cross-sectional view of the layered semiconductor material of FIG. 3N along line 399.

FIG. 3P depicts a top view of the layered semiconductor material of FIGS. 3N and 3O after masking the pattern of FIGS. 3N and 3O to define a cut out area 398. A masked pattern 381 is depicted. In one approach, the cut out area is rectangular and is defined by depositing photoresist 350 whose perimeter is coincident with a perimeter of the cut out area. The cut out area 398 is contained within the central area 302 and extends from the RP outward to overlap the closed ends 309, 313, 311 and 314 in the quadrants Q1, Q2, Q3 and Q4, respectively. Additionally, the cut out area overlaps portions of the cross 312 which are between the RP and the closed ends. An area 370 is outside the cut out area 398.

FIG. 3Q depicts a cross-sectional view of the layered semiconductor material of FIG. 3P along line 399.

FIG. 3R depicts a top view of the layered semiconductor material of FIGS. 3P and 3Q after performing Damascene etching. In this case, SP is the overlying layer and WL is the underlying layer. The etching also reduces a height of the PR in the cut out area. The substrate (S) is exposed.

FIG. 3S depicts a cross-sectional view of the layered semiconductor material of FIG. 3R along line 399. Portions of the SP layer may remain on top of the peaks in the WL.

FIG. 3T depicts the cross-sectional view of the layered semiconductor material of FIG. 3S after depositing metal (M).

FIG. 3U depicts a top view of the layered semiconductor material of FIG. 3T after performing CMP to planarize a top surface of the material. Portions of the SP and PR that remained in FIG. 3T are also removed. This results in a metal wiring layer WL with metal lines or regions between the remaining dielectric portions of the wiring layer. The metal wiring layer 390 includes metal lines which extend uninterrupted through the left-side lateral area 301 (such as lines 320 and 321) and the right-side lateral area 303 (such as lines 330 and 331). These can be active lines in the resulting semiconductor device. Metal lines 321 and 330 are coincident with straight line trenches 304 and 308, respectively, in FIG. 3N.

Moreover, in Q1, part of metal wiring layer portion 322 in the y direction, part of metal wiring layer portion 322 in the x direction, and all of metal wiring layer portion 324 are coincident with the loop trench 305 in FIG. 3N (as shown by the overlay of the dashed lines). Similarly, in Q2, part of metal wiring layer portion 329 in the y direction, part of metal wiring layer portion 329 in the x direction, and all of metal wiring layer portion 327 are coincident with the loop trench 307 in FIG. 3N. Similarly, in Q3, part of metal wiring layer portion 322 in the y direction, part of metal wiring layer portion 322 in the x direction, and all of metal wiring layer portion 333 are coincident with the loop trench 315 in FIG. 3N. Similarly, in Q4, part of metal wiring layer portion 328 in the y direction, part of metal wiring layer portion 328 in the x direction, and all of metal wiring layer portion 336 are coincident with the loop trench 316 in FIG. 3N.

Regarding the loops 305, 307, 315 and 316, the long dashed lines represent portions of the loops which have a corresponding metal wiring layer portion and the short dashed lines represent portions of the loops which do not have a corresponding metal wiring layer portion. These metal wiring layer portions can be said to form broken loops with a broken end in the central area 302. The short dashed lines 360, 361, 362 and 363 represent broken regions of the loops 305, 307, 315 and 316, respectively.

The loop 305 includes a broken region 360 at the broken end 309, the loop 307 includes a broken region 361 at the broken end 313, the loop 315 includes a broken region 362 at the broken end 311, and the loop 316 includes a broken region 363 at the broken end 314.

The breaks in the loops are a result of the masking of the cut out area to exclude any portion of the metal wiring layer in the cut out area. A broken loop comprises metal wiring layer portions which would form a loop in the absence of the use of the cut out area. The broken or omitted portions of the loops are co-located with the cut out area.

Metal wiring layer portions 323, 328, 333 and 337 are straight lines which terminate within the broken loops 305, 307, 315 and 316, respectively.

Further, metal wiring layer portions 324 and 334 extend in the y-direction, co-linearly, but are separated from one another by the cut out area. Metal wiring layer portions 326 and 335 extend in the y-direction, co-linearly, but are separated from one another by the cut out area. Metal wiring layer portions 327 and 336 extend in the y-direction, co-linearly, but are separated from one another by the cut out area.

Metal wiring layer portions 326 and 335 in are coincident with the trench line 306 of FIG. 3N, while metal wiring layer portions 343 and 344 extend in the x direction and are coincident with the trench line 310 of FIG. 3N.

The long dashed lines represent portions of the cross 312 which have a corresponding metal wiring layer portion and the short dashed lines represent portions of the cross which do not have a corresponding metal wiring layer portion. These metal wiring layer portions (326, 335, 343, 344) can be said to form a broken cross in the central area 302. The short dashed lines 346 (x direction) and 345 (y direction) represent broken or omitted regions of the cross.

Additionally, the cross 312 includes a broken region 364 which include a first portion extending in the y direction along the y axis and a second portion extending in the x direction along the x axis, transverse to the first portion, and intersecting the first portion.

The breaks in the cross are a result of the masking of the cut out area to exclude any portion of the metal wiring layer in the cut out area. A broken cross comprises metal wiring layer portions which would form a cross in the absence of the use of the cut out area. The broken portions of the cross are co-located with the cut out area.

A contact 325 which is connected to the wiring layer portion 326, for instance, may be provided.

This process results in a wiring layer with seven cut wires, as depicted by wiring layer portions 322-324 and 326-329.

FIG. 3V depicts a cross-sectional view of the layered semiconductor material of FIG. 3U along line 399.

Figure 4A:
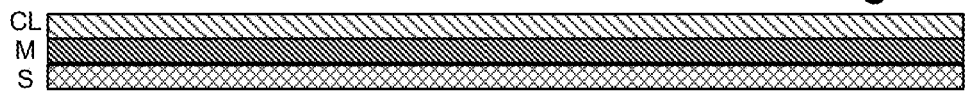
FIGS. 4A-4Z depict views of a layered semiconductor material which is processed to form a wiring layer using a double spacer, subtractive etch process, with twelve cut wires.
Figure 4B:
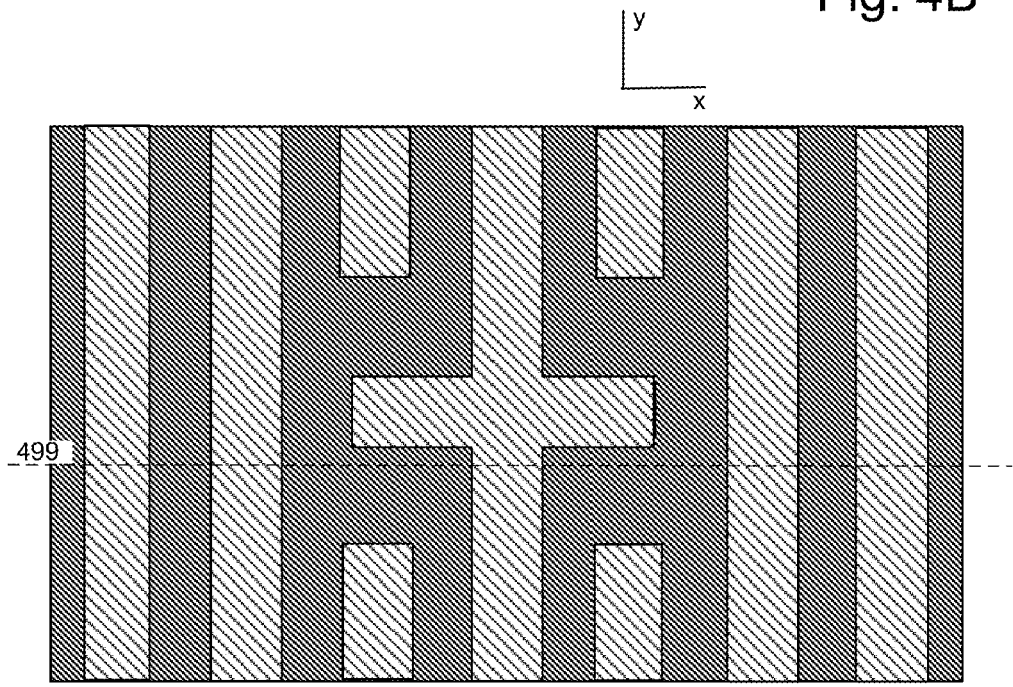
Figure 4C:
Figure 4D:
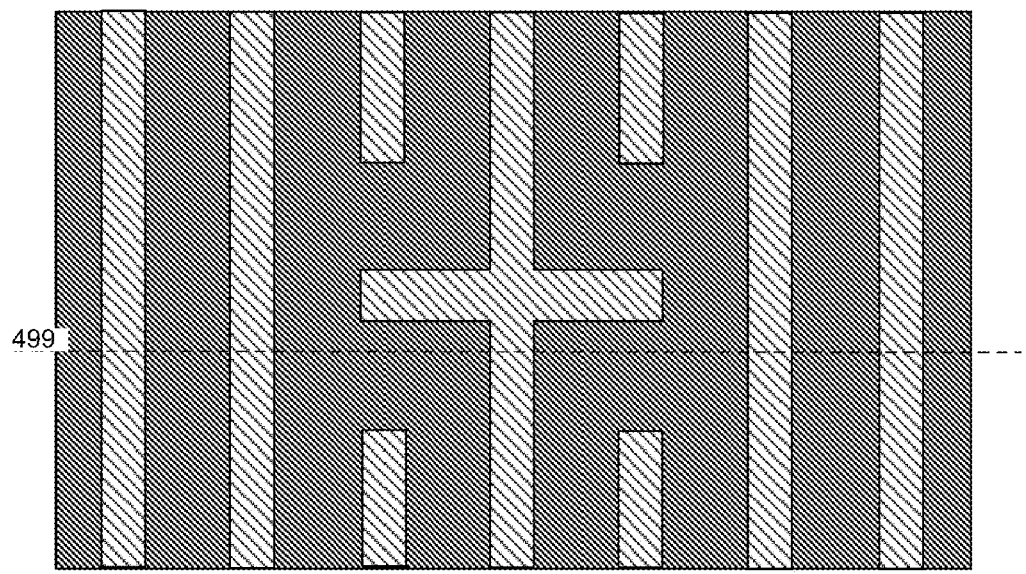
Figure 4E:
Figure 4F:
Figure 4K:
Figure 4L:
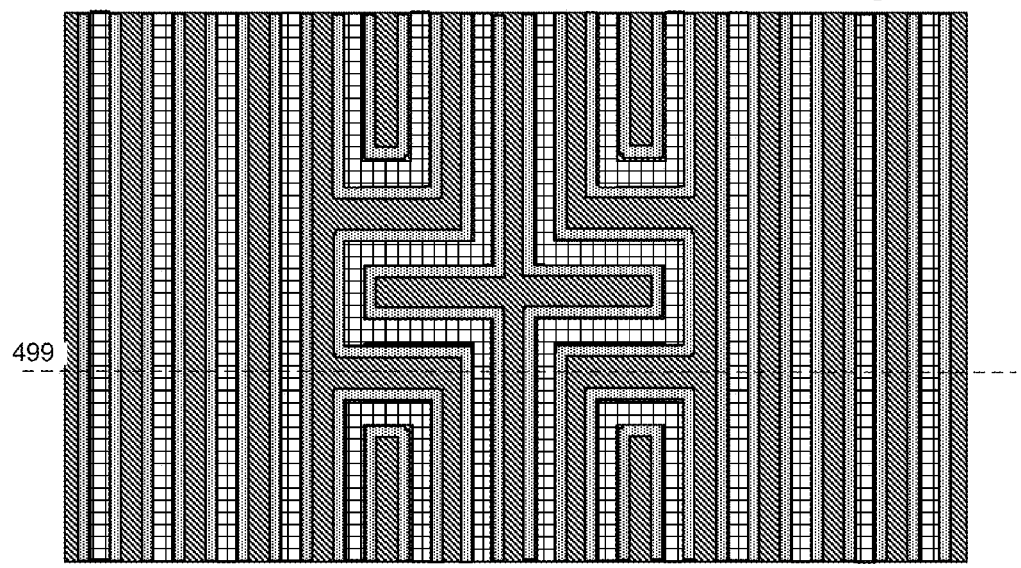
Figure 4M:
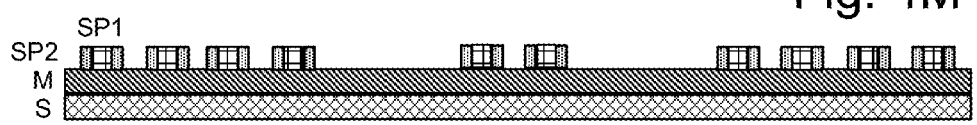
Figure 4N:
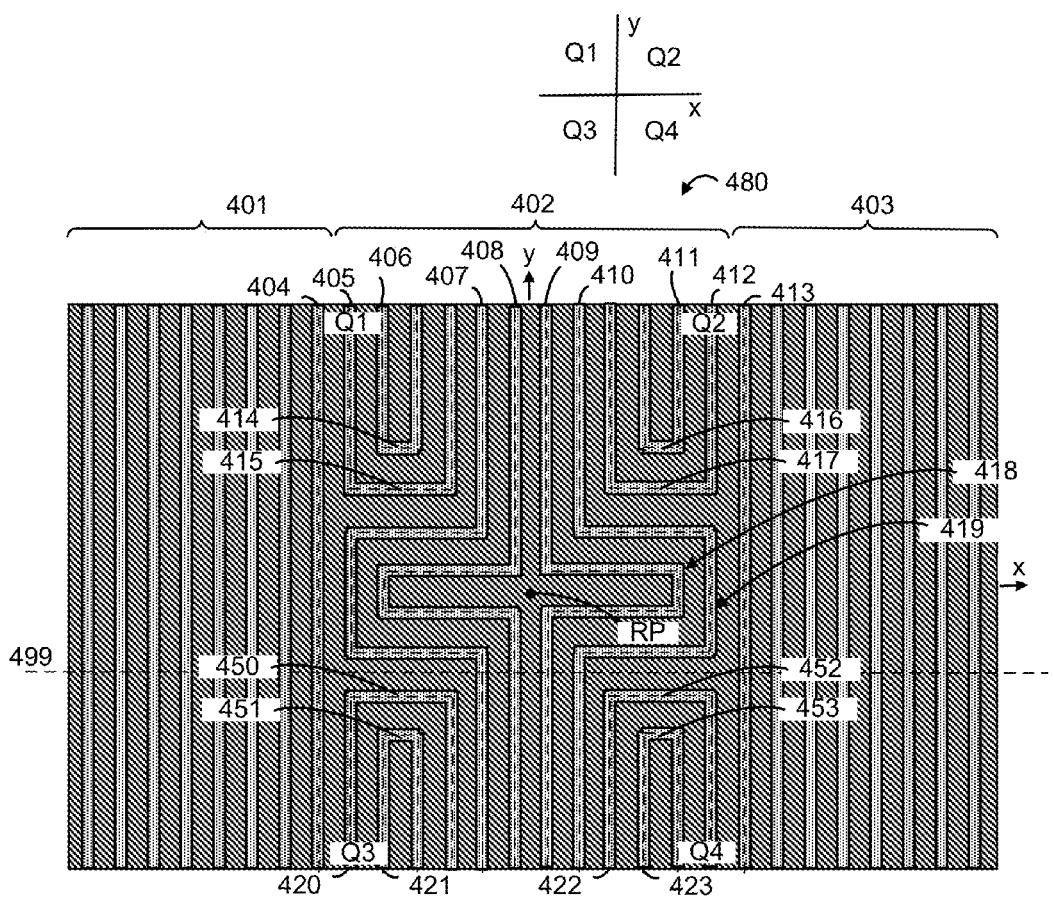
Figure 4O:
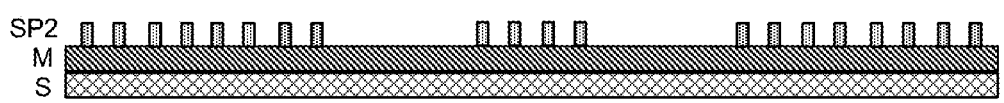
Figure 4P:
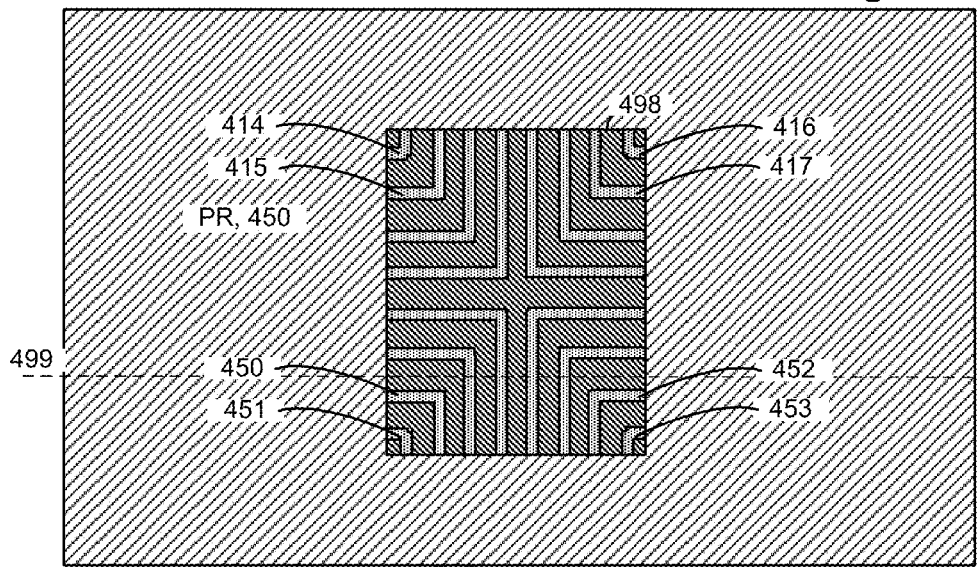
Figure 4Q:
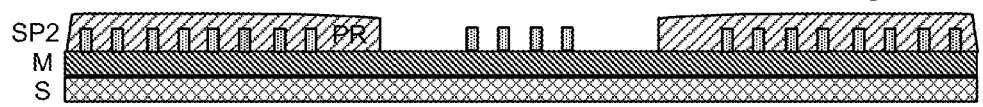
Figure 4R:
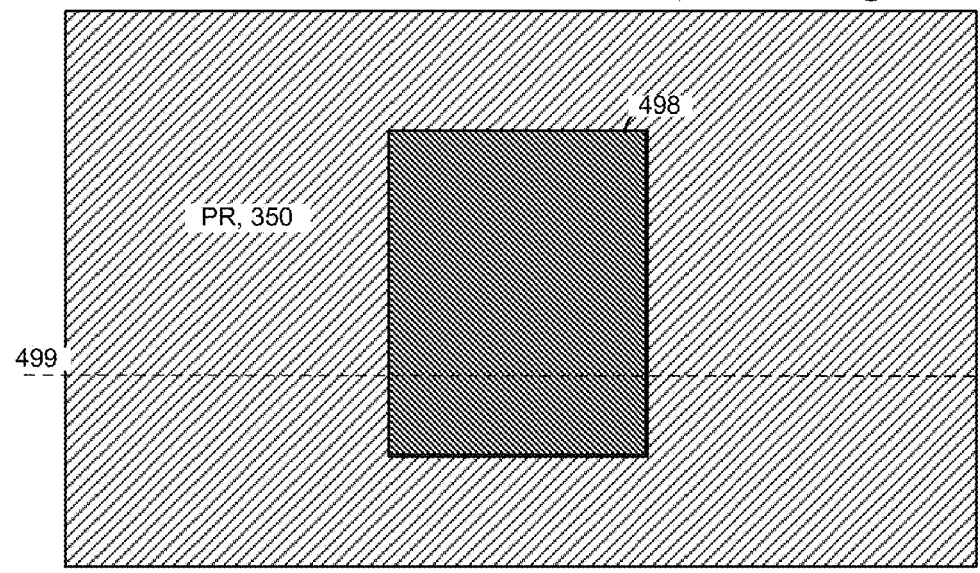
Figure 4S:
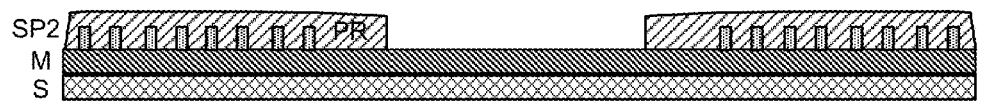
Figure 4T:
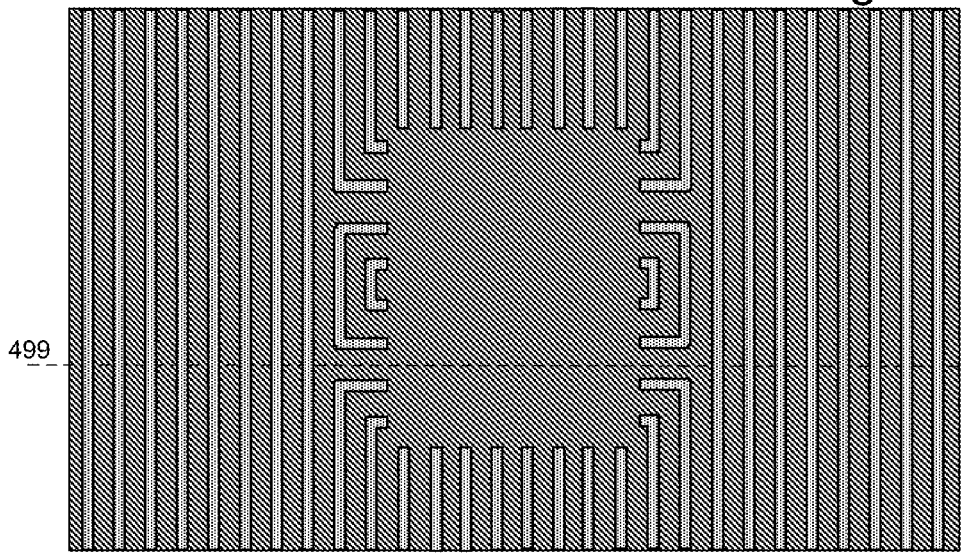
Figure 4U:
Figure 4V:
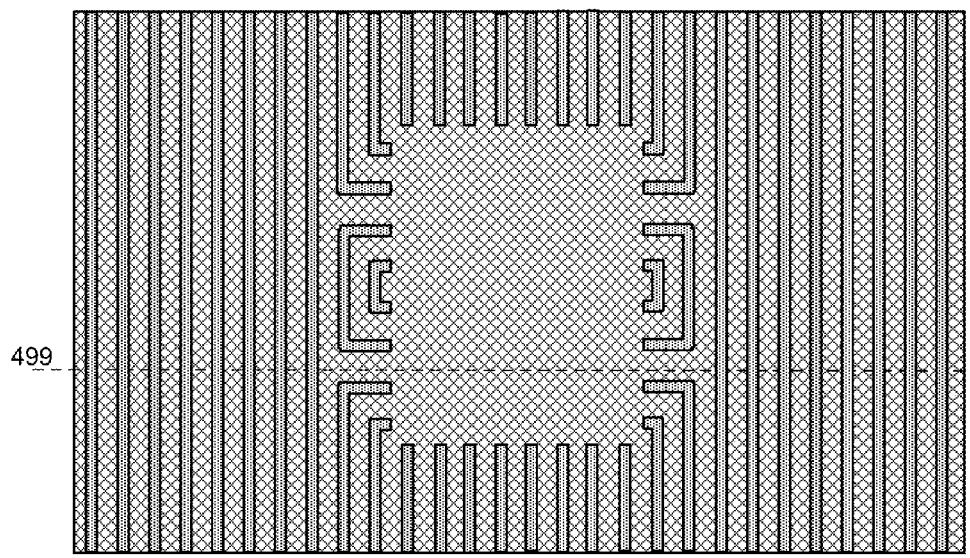
Figure 4W:
Figure 4X:
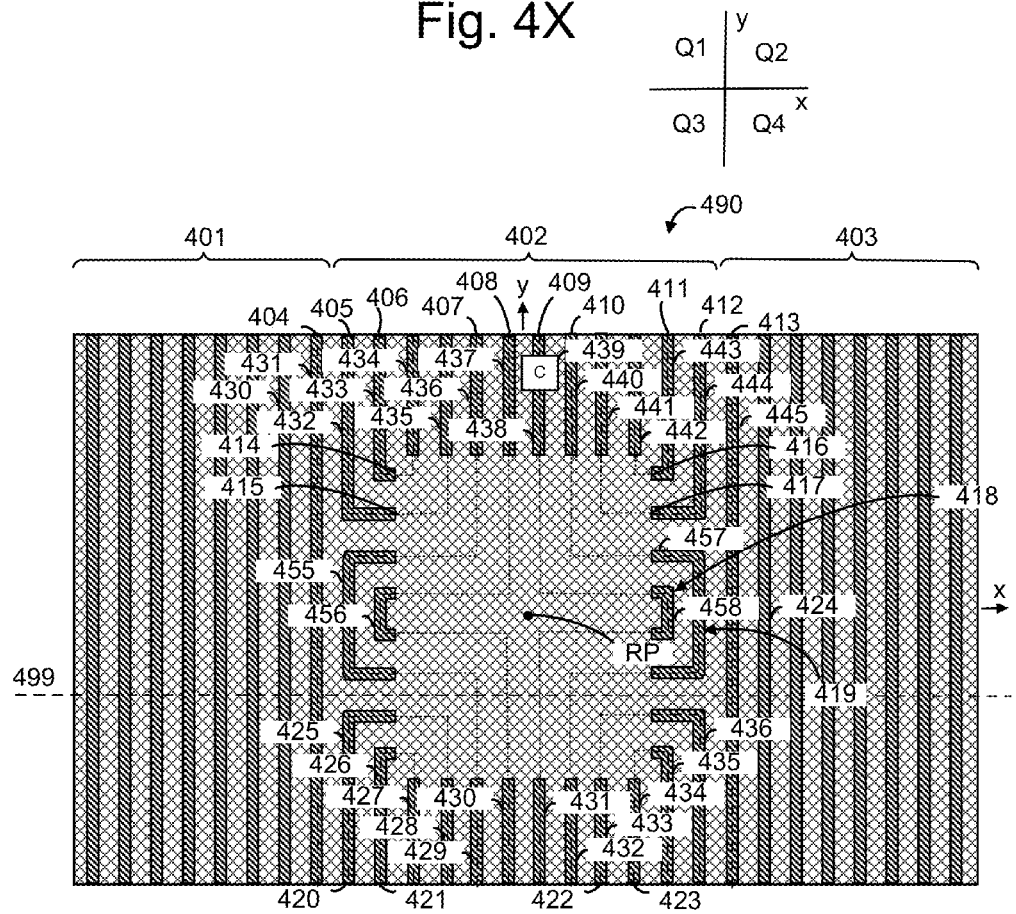
Figure 4Y:
Figure 4Z:

FIGS. 4A-4Z depict views of a layered semiconductor material which is processed to form a wiring layer using a double spacer, subtractive etch process, with twelve cut wires. To assist in identifying common elements, some of the elements are filled in with a pattern which is consistent across this set of figures.

FIG. 4A provides an example layered semiconductor device 400 which includes a substrate, a metal layer and a core layer.

FIG. 4B depicts a top view of the layered semiconductor material 400 after a pattern is formed in the CL. The pattern is formed by removing portions of the CL using lithography.

FIG. 4C depicts a cross-sectional view of the layered semiconductor material of FIG. 4B along line 499.

FIG. 4D depicts a top view of the layered semiconductor material of FIGS. 4B and 4C after performing a slimming process which reduces the thickness of the features of the CL.

FIG. 4E depicts a cross-sectional view of the layered semiconductor material of FIG. 4D along line 499.

FIG. 4F depicts the cross-sectional view of FIG. 4E after deposition of a first sidewall material SP1.

FIG. 4G depicts a top view of the layered semiconductor material of FIG. 4F after etching. An example uses reactive ion etching. This step results in the formation of a first set of spacers on the sidewalls of the lines in the core layer. For example spacers 470 and 472 are formed on sidewalls of a line 471 of the core layer material.

FIG. 4H depicts a cross-sectional view of the layered semiconductor material of FIG. 4G along line 499.

FIG. 4I depicts a top view of the layered semiconductor material of FIG. 4G after removing the core layer material. An example approach uses reactive ion etching. This results in a first pattern of spacers in the SP1 layer.

FIG. 4J depicts a cross-sectional view of the layered semiconductor material of FIG. 4I along line 499.

FIG. 4K depicts the cross-sectional view of FIG. 4J after depositing a second sidewall spacer material (SP2).

FIG. 4L depicts a top view of the layered semiconductor material of FIG. 4K after performing etching to remove portions of the second sidewall spacer material.

FIG. 4M depicts a cross-sectional view of the layered semiconductor material of FIG. 4L along line 499.

FIG. 4N depicts a top view of the layered semiconductor material of FIGS. 4L and 4M after removing the first sidewall space material, leaving a pattern of the second sidewall layer material. The layered semiconductor material 480 encompasses an area which includes a central area 402, a left-side lateral area 401 adjacent to and on a left side of the central area, and a right-side lateral area 403 adjacent to and on a right side of the central area. The central area has a reference point (RP) which may be at a center of the central area.

The layered semiconductor material 480 has a pattern with various features. The pattern is provided in an area of the layered semiconductor material which extends in a first direction (y-direction) and in a second direction (x-direction), transverse to the first direction.

For example, portions of the pattern in the left-side and right-side lateral areas comprise lines (e.g., peaks) 404 and 413 which extend uninterrupted through the left-side and right-side lateral areas, 401 and 403, respectively. The central area comprises four quadrants Q1-Q4 relative to the reference point. A portion of the pattern in each quadrant comprises two loops, one nested inside the other. Each quadrant therefore comprises a plurality of nested loops. In this example, an inner loop is nested inside and outer loop.

For example, Q1 has outer and inner loops indicated by dashed lines 405 and 406, respectively, Q2 has outer and inner loops indicated by dashed lines 417 and 416, respectively, Q3 has outer and inner loops indicated by dashed lines 420 and 421, respectively, and Q4 has outer and inner loops indicated by dashed lines 422 and 423. The loops in this example are formed by peaks in the pattern, e.g., by portions of the SP2 layer which are above the metal (M) layer. Each loop comprises a closed end in the central area. For example, loops 405, 406, 417, 416, 420, 421, 422 and 423 have closed ends 415, 414, 417, 416, 450, 451, 452 and 453, respectively. Further, a portion of the pattern in the central area comprises nested crosses, including an inner cross 418 inside an outer cross 419, which extend uninterrupted through the central area and between the loops. The crosses are symmetric with respect to both the x- and y-axes.

The cross 418 generally has two opposing sides 408 and 409 which are mirror images of one another with respect to the x and y axes. In other words, the cross 418 comprises left and right side features which are mirror images of one another with respect to the first and second axes.

Similarly, the cross 419 generally has two opposing sides 407 and 410 which are mirror images of one another with respect to the x and y axes. In other words, the cross 419 comprises left and right side features which are mirror images of one another with respect to the first and second axes.

Alternatively a cross can be defined which comprises a single straight line/trench in the y direction, between lines/peaks 408 and 409, and a single straight line/trench in the x direction, where these lines intersect at RP.

FIG. 4O depicts a cross-sectional view of the layered semiconductor material of FIG. 4N along line 499.

FIG. 4P depicts a top view of the layered semiconductor material of FIGS. 4N and 4O after masking the pattern of FIGS. 4N and 4O to define a cut out area 498. In one approach, the cut out area is defined by depositing photoresist 450 outside the cut out area, so that the photoresist has an opening (an inner edge) which is coincident with a perimeter of the cut out area 498.

The cut out area 498 is contained within the central area 402 and extends from the RP outward to overlap the closed ends 415, 414; 417, 416; 450, 451; and 452 and 453, in the quadrants Q1, Q2, Q3 and Q4, respectively. Additionally, the cut out area overlaps portions of the crosses 418 and 419 which are between the RP and the closed ends.

FIG. 4Q depicts a cross-sectional view of the layered semiconductor material of FIG. 4P along line 499.

FIG. 4R depicts a top view of the layered semiconductor material of FIGS. 4P and 4Q after performing etching to remove portions of the spacers in the cut out area, e.g., unmasked portions of the SP2 layer. A masked pattern 481 is depicted.

FIG. 4S depicts a cross-sectional view of the layered semiconductor material of FIG. 4R along line 499.

FIG. 4T depicts a top view of the layered semiconductor material of FIGS. 4R and 4S after removing the photoresist, leaving a spacer pattern in the SP2 layer outside the cutout area.

FIG. 4U depicts a cross-sectional view of the layered semiconductor material of FIG. 4T along line 499.

FIG. 4V depicts a top view of the layered semiconductor material of FIGS. 4T and 4U after etching the metal layer using the spacers in the SP2 layer as a mask, resulting in a pattern of peaks in the M and SP2 layers.

FIG. 4W depicts a cross-sectional view of the layered semiconductor material of FIG. 4V along line 499.

FIG. 4X depicts a top view of the layered semiconductor material of FIGS. 4V and 4W after removing the spacer material from the SP2 layer, resulting in a pattern of peaks in the M layer. These peaks form the pattern of the metal wiring layer.

FIG. 4Y depicts a cross-sectional view of the layered semiconductor material of FIG. 4X along line 499.

FIG. 4Z depicts a cross-sectional view of the layered semiconductor material of FIGS. 4X and 4Y after depositing insulation (IN) and performing CMP to planarize a top surface of the material, resulting in the final metal wiring layer 490.

Referring again to FIG. 4X, the pattern of the final metal wiring layer is shown. The metal wiring layer 490 includes metal lines which extend uninterrupted through the left-side lateral area 401 (such as lines 430 and 431) and the right-side lateral area 403 (such as lines 445 and 424). These can be active lines in the resulting semiconductor device. Metal lines 431 and 445 are coincident with straight line peaks 404 and 413, respectively, in FIG. 4N.

Moreover, in Q1, metal wiring layer portions 433 and 434 are coincident with the inner loop 406, and metal wiring layer portions 432 and 435 are coincident with the outer loop 405, as shown by the overlay of the dashed lines. Similarly, in Q2, metal wiring layer portions 442 and 443 are coincident with the inner loop 411, and metal wiring layer portions 441 and 444 are coincident with the outer loop 412, as shown by the overlay of the dashed lines. Similarly, in Q3, metal wiring layer portions 426 and 427 are coincident with the inner loop 421, and metal wiring layer portions 425 and 428 are coincident with the outer loop 420, as shown by the overlay of the dashed lines. Similarly, in Q4, metal wiring layer portions 434 and 435 are coincident with the inner loop 423, and metal wiring layer portions 433 and 436 are coincident with the outer loop 422, as shown by the overlay of the dashed lines.

Regarding the loops, the long dashed lines represent portions of the loops which have a corresponding metal wiring layer portion and the short dashed lines represent portions of the loops which do not have a corresponding metal wiring layer portion. These metal wiring layer portions can be said to form broken loops with a broken end in the central area 402. The short dashed lines represent broken regions of the loops, respectively.

The breaks in the loops are a result of the masking of the cut out area to exclude any portion of the metal wiring layer in the cut out area. A broken loop comprises metal wiring layer portions which would form a loop in the absence of the use of the cut out area. The broken or omitted portions of the loops are co-located with the cut out area.

Further, metal wiring layer portions 437 and 430 extend in the y-direction, co-linearly, but are separated from one another by the cut out area. Metal wiring layer portions 438 and 431 extend in the y-direction, co-linearly, but are separated from one another by the cut out area.

Metal wiring layer portions 436, 455, and 429 are coincident with the line 407 of FIG. 4N, which defines the left side of the outer cross 419, while metal wiring layer portions 440, 457 and 432 are coincident with the line 410 of FIG. 4N, which defines the right side of the outer cross 419. Metal wiring layer portions 437, 456, and 430 are coincident with the line 408 of FIG. 4N, which defines the left side of the inner cross 418, while metal wiring layer portions 438, 458 and 431 are coincident with the line 409 of FIG. 4N, which defines the right side of the inner cross 418.

The long dashed lines represent portions of the crosses which have a corresponding metal wiring layer portion and the short dashed lines represent portions of the cross which do not have a corresponding metal wiring layer portion. The metal wiring layer portions 436, 455, and 429; 440, 457 and 432 can be said to form a broken outer cross in the central area 402, while the metal wiring layer portions 437, 456, and 430; 438, 458 and 431 can be said to form a broken inner cross in the central area 402.

The short dashed lines represent broken or omitted regions of the cross. The breaks in the cross are a result of the masking of the cut out area to exclude any portion of the metal wiring layer in the cut out area. A broken cross comprises metal wiring layer portions which would form a cross in the absence of the use of the cut out area. The broken portions of the cross are co-located with the cut out area.

A contact 439 which is connected to the wiring layer portion 438, for instance, may be provided.

This process results in a wiring layer with twelve cut wires, as depicted by wiring layer portions 432-438 and 440-444.

FIGS. 5A-5E depict views of a layered semiconductor material which is processed to form a wiring layer using a single spacer, Damascene process, with three cut wires. FIG.

Figure 5A:
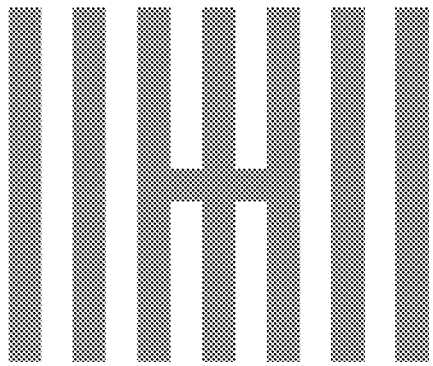
FIGS. 5A-5E depict views of a layered semiconductor material which is processed to form a wiring layer using a single spacer, Damascene process, with three cut wires.
Figure 5B:
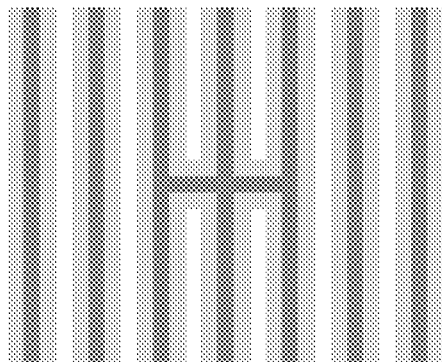
Figure 5C:
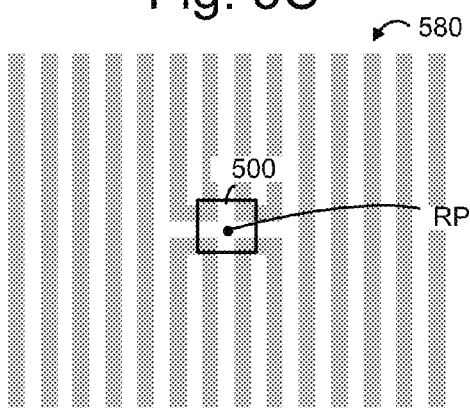
Figure 5D:
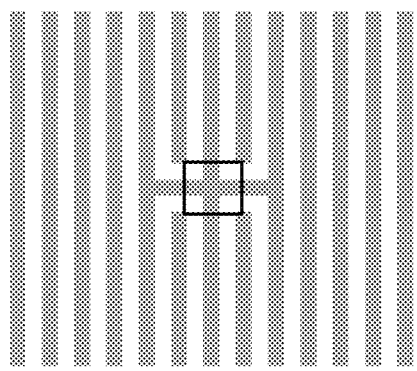
Figure 5E:
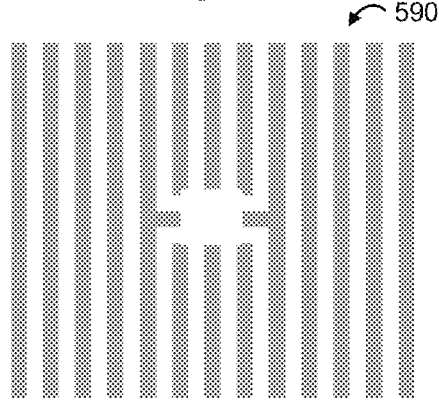

5A depicts the core layer pattern. FIG. 5B depicts the pattern after slimming and sidewall spacer formation. FIG. 5C depicts the pattern 580 after removing the spacer material, showing the RP and the cut out area 500. FIG. 5D depicts a wiring layer pattern which would be formed from the pattern in the absence of the cut out area, in addition to showing the cutout area. FIG. 5E depicts the final wiring layer pattern 590 which is formed using the cut out area.

Figure 6D:
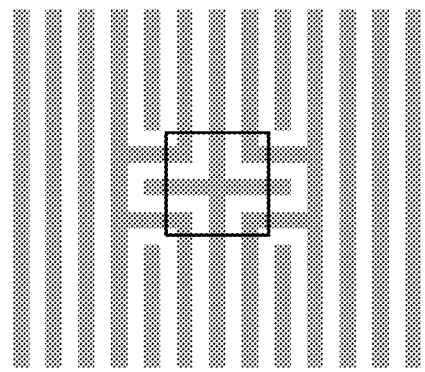
Figure 6E:
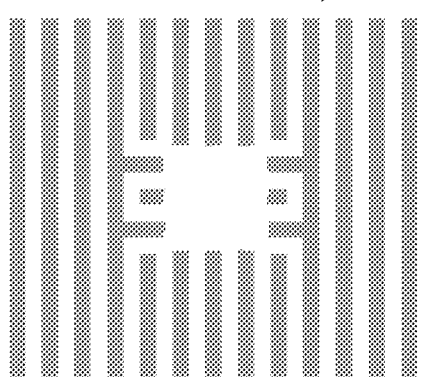

FIGS. 6A-6E depict views of a layered semiconductor material which is processed to form a wiring layer using a single spacer, Damascene process, with five cut wires. FIG. 6A depicts the core layer pattern. FIG. 6B depicts the pattern after slimming and sidewall spacer formation. FIG. 6C depicts the pattern 680 after removing the spacer material, showing the RP and the cut out area 600. FIG. 6D depicts a wiring layer pattern which would be formed from the pattern in the absence of the cut out area, in addition to showing the cutout area. FIG. 6E depicts the final wiring layer pattern 690 which is formed using the cut out area.

Figure 7A:
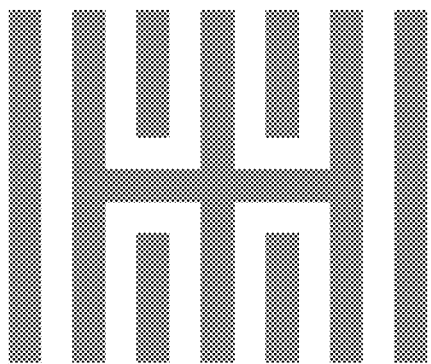
FIGS. 7A-7E depict views of a layered semiconductor material which is processed to form a wiring layer using a single spacer, Damascene process, with seven cut wires.
Figure 7B:
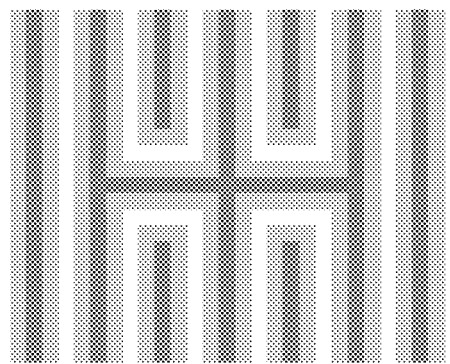
Figure 7C:
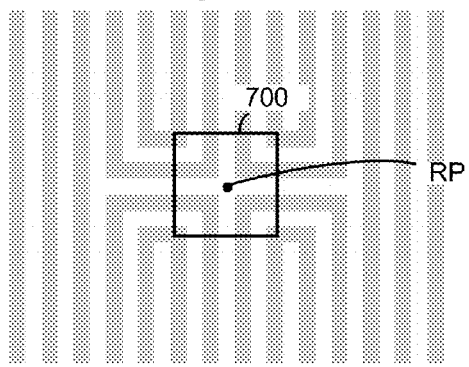
Figure 7D:
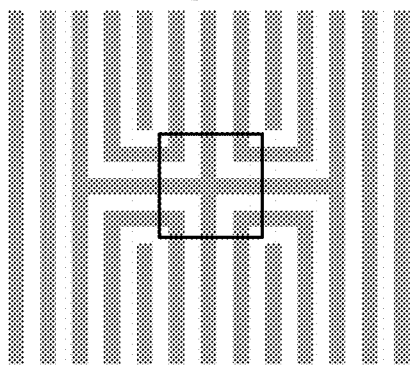
Figure 7E:
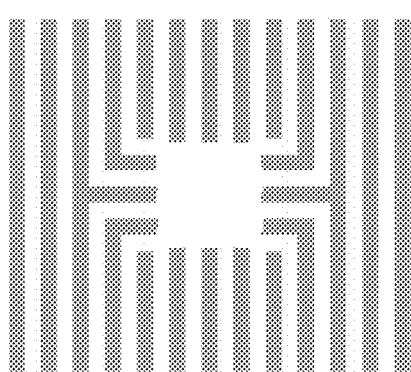

FIGS. 7A-7E depict views of a layered semiconductor material which is processed to form a wiring layer using a single spacer, Damascene process, with seven cut wires. FIG. 7A depicts the core layer pattern. FIG. 7B depicts the pattern after slimming and sidewall spacer formation. FIG. 7C depicts the pattern 780 after removing the spacer material, showing the RP and the cut out area 700. FIG. 7D depicts a wiring layer pattern which would be formed from the pattern in the absence of the cut out area, in addition to showing the cutout area. FIG. 7E depicts the final wiring layer pattern 790 which is formed using the cut out area.

Figure 8A:
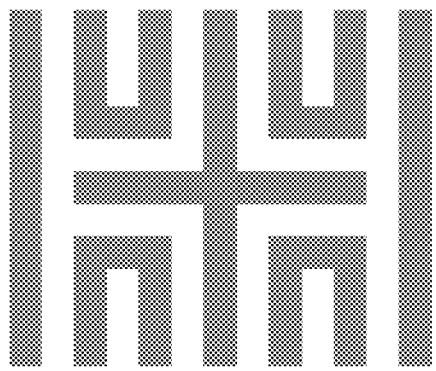
FIGS. 8A-8E depict views of a layered semiconductor material which is processed to form a wiring layer using a single spacer, Damascene process, with nine cut wires.
Figure 8B:
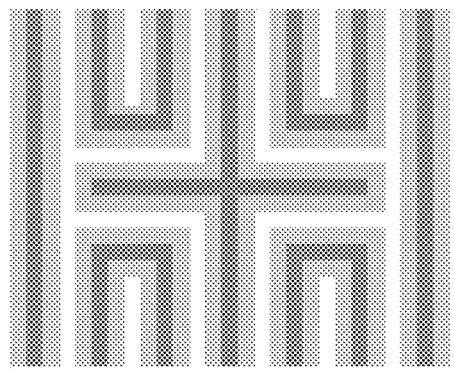
Figure 8C:
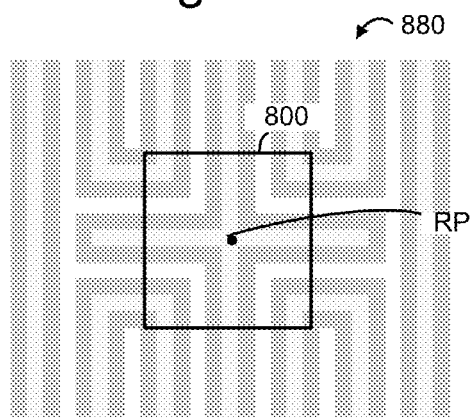
Figure 8D:
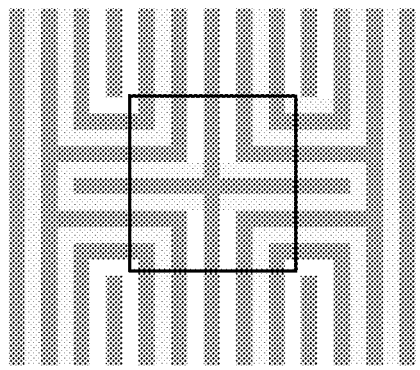
Figure 8E:
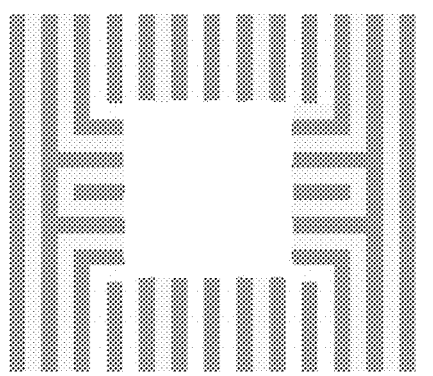

FIGS. 8A-8E depict views of a layered semiconductor material which is processed to form a wiring layer using a single spacer, Damascene process, with nine cut wires. FIG. 8A depicts the core layer pattern. FIG. 8B depicts the pattern after slimming and sidewall spacer formation. FIG. 8C depicts the pattern 880 after removing the spacer material, showing the RP and the cut out area 800. FIG. 8D depicts a wiring layer pattern which would be formed from the pattern in the absence of the cut out area, in addition to showing the cutout area. FIG. 8E depicts the final wiring layer pattern 890 which is formed using the cut out area.

Figure 9A:
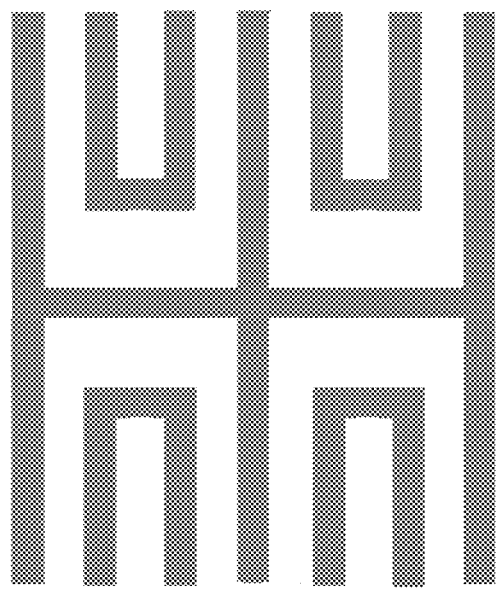
FIG. 9A depicts a core pattern of a layered semiconductor material which is processed to form a wiring layer using a single spacer, Damascene process, with eleven cut wires.

FIG. 9A depicts a core pattern of a layered semiconductor material which is processed to form a wiring layer using a single spacer, Damascene process, with eleven cut wires. The subsequent patterns and the final metal wiring layer pattern can be obtained using the techniques discussed herein for a single spacer, Damascene process.

Figure 9B:
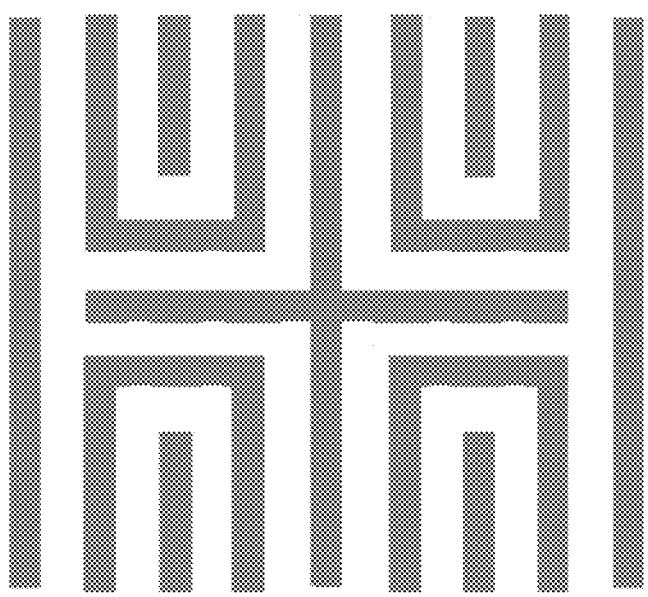
FIG. 9B depicts a core pattern of a layered semiconductor material which is processed to form a wiring layer using a single spacer, Damascene process, with thirteen cut wires.

FIG. 9B depicts a core pattern of a layered semiconductor material which is processed to form a wiring layer using a single spacer, Damascene process, with thirteen cut wires. The subsequent patterns and the final metal wiring layer pattern can be obtained using the techniques discussed herein for a single spacer, Damascene process.

FIGS. 10A-10G depict views of a layered semiconductor material which is processed to form a wiring layer using a double spacer, Damascene process, with seven cut wires.

Figure 10A:
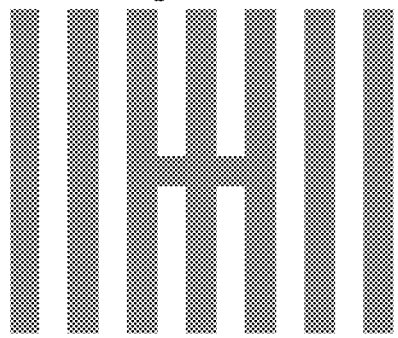
FIGS. 10A-10G depict views of a layered semiconductor material which is processed to form a wiring layer using a double spacer, Damascene process, with seven cut wires.
Figure 10B:
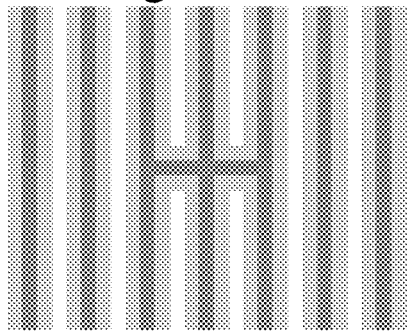
Figure 10C:
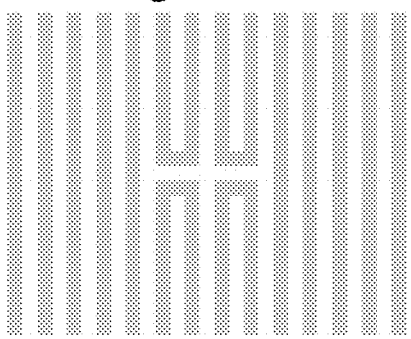
Figure 10D:
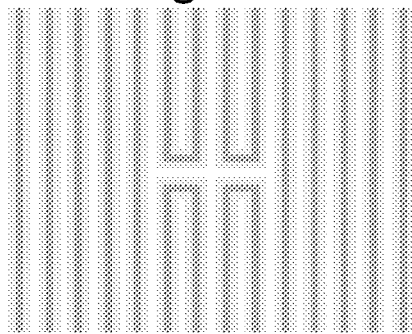
Figure 10E:
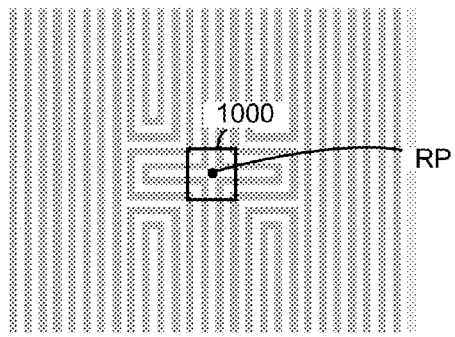
Figure 10F:
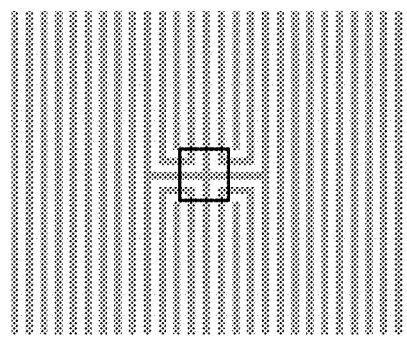
Figure 10G:
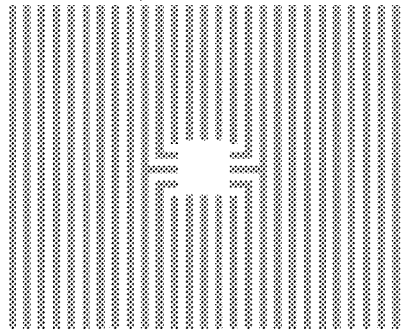

FIG. 10A depicts the core layer pattern. FIG. 10B depicts the pattern after slimming and a first sidewall spacer formation. FIG. 10C depicts the pattern after removing the first spacer material. FIG. 10D depicts the pattern after a second sidewall spacer formation. FIG. 10E depicts the pattern 1080 after removing the second spacer material, showing the RP and the cut out area 1000. FIG. 10F depicts a wiring layer pattern which would be formed from the pattern in the absence of the cut out area, in addition to showing the cutout area. FIG. 10G depicts the final wiring layer pattern 1090 which is formed using the cut out area.

Figure 11A:
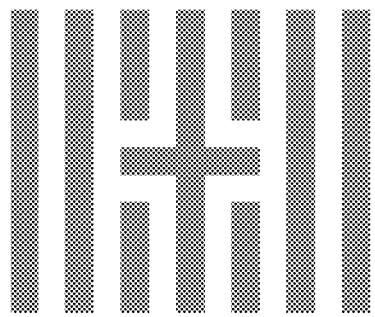
Figure 11B:
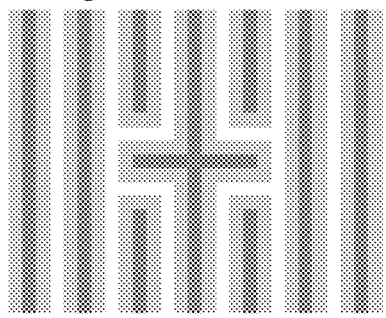
Figure 11C:
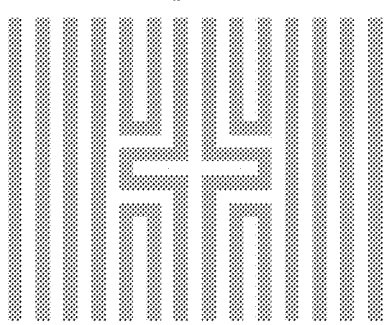
Figure 11D:
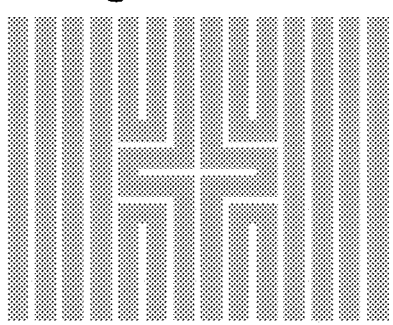
Figure 11D:
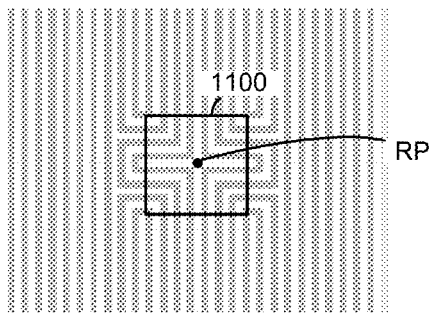
Figure 11F:
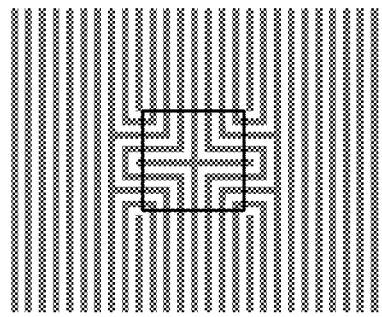
Figure 11F:
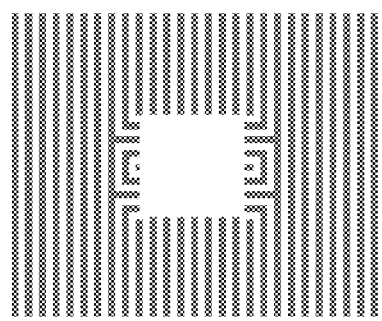

FIGS. 11A-11G depict views of a layered semiconductor material which is processed to form a wiring layer using a double spacer, Damascene process, with eleven cut wires. FIG. 11B depicts the pattern after slimming and a first sidewall spacer formation. FIG. 11C depicts the pattern after removing the first spacer material. FIG. 11D depicts the pattern after a second sidewall spacer formation. FIG. 11E depicts the pattern 1180 after removing the second spacer material, showing the RP and the cut out area 1100. FIG. 11F depicts a wiring layer pattern which would be formed from the pattern in the absence of the cut out area, in addition to showing the cutout area. FIG. 11G depicts the final wiring layer pattern 1190 which is formed using the cut out area.

Figure 12A:
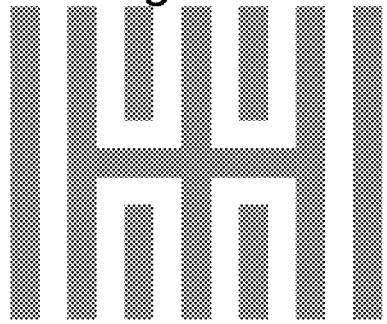
FIGS. 12A-12G depict views of a layered semiconductor material which is processed to form a wiring layer using a double spacer, Damascene process, with fifteen cut wires.
Figure 12B:
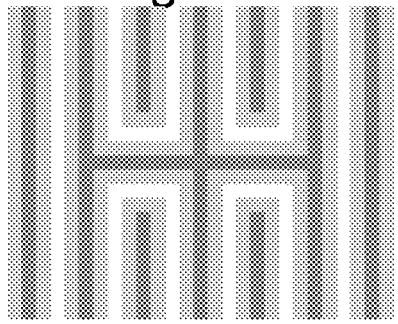
Figure 12C:
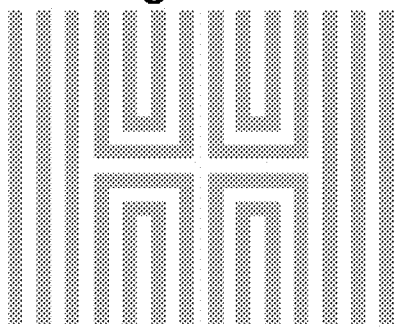
Figure 12D:
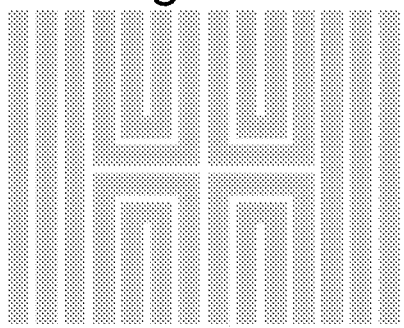
Figure 12E:
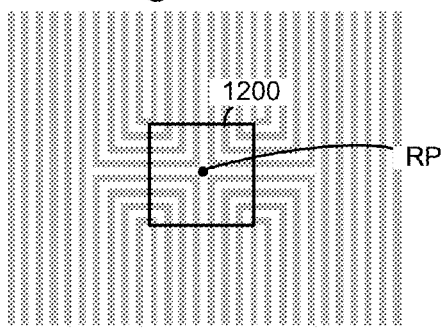
Figure 12F:
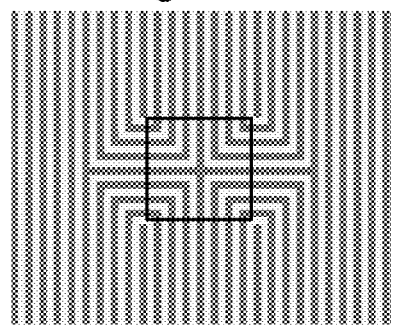
Figure 12G:
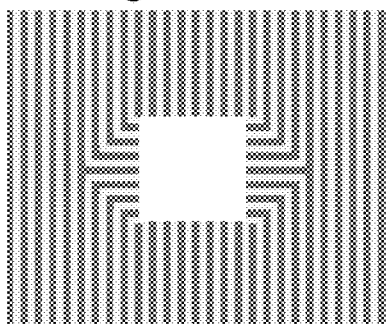

FIGS. 12A-12G depict views of a layered semiconductor material which is processed to form a wiring layer using a double spacer, Damascene process, with fifteen cut wires. FIG. 12B depicts the pattern after slimming and a first sidewall spacer formation. FIG. 12C depicts the pattern after removing the first spacer material. FIG. 12D depicts the pattern after a second sidewall spacer formation. FIG. 12E depicts the pattern 1280 after removing the second spacer material, showing the RP and the cut out area 1200. FIG. 12F depicts a wiring layer pattern which would be formed from the pattern in the absence of the cut out area, in addition to showing the cutout area. FIG. 12G depicts the final wiring layer pattern 1290 which is formed using the cut out area.

Figure 13A:
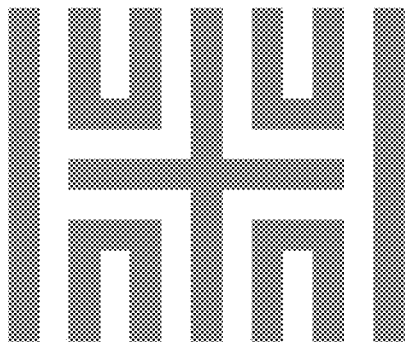
Figure 13B:
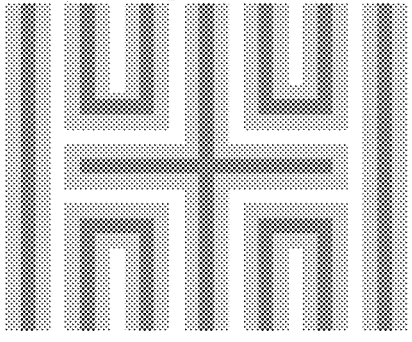
Figure 13C:
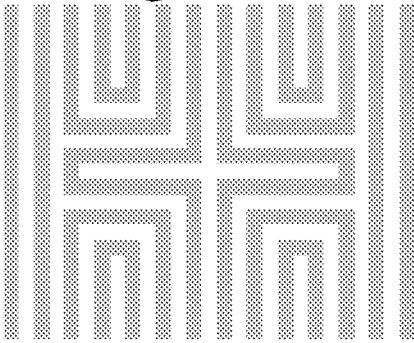
Figure 13D:
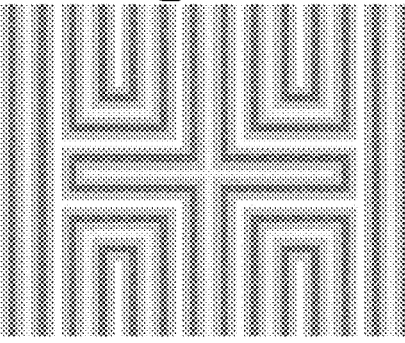
Figure 13D:
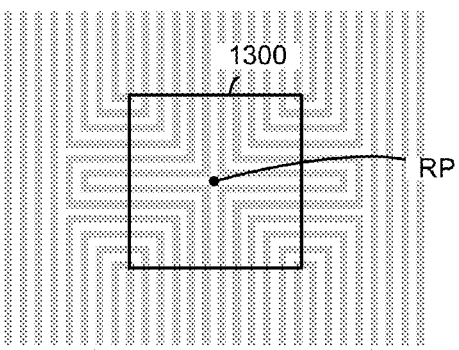
Figure 13F:
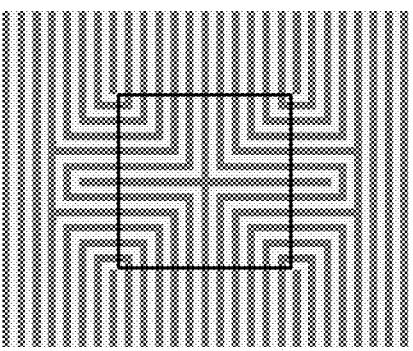
Figure 13F:
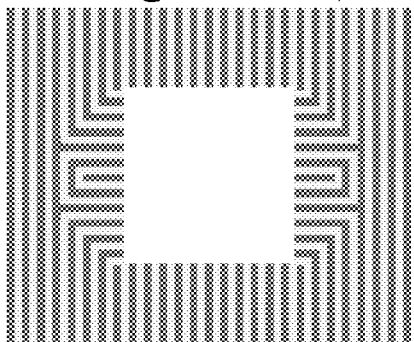

FIGS. 13A-13G depict views of a layered semiconductor material which is processed to form a wiring layer using a double spacer, Damascene process, with nineteen cut wires. FIG. 13B depicts the pattern after slimming and a first sidewall spacer formation. FIG. 13C depicts the pattern after removing the first spacer material. FIG. 13D depicts the pattern after a second sidewall spacer formation. FIG. 13E depicts the pattern 1380 after removing the second spacer material, showing the RP and the cut out area 1300. FIG. 13F depicts a wiring layer pattern which would be formed from the pattern in the absence of the cut out area, in addition to showing the cutout area. FIG. 13G depicts the final wiring layer pattern 1390 which is formed using the cut out area.

Figure 14A:
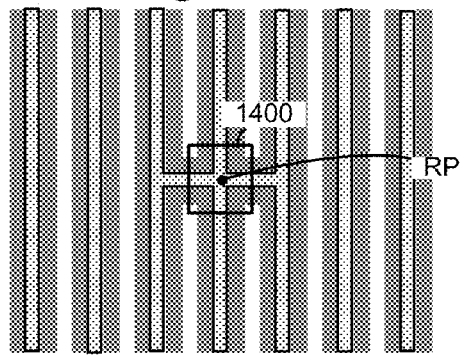
FIGS. 14A and 14B depict views of a layered semiconductor material which is processed to form a wiring layer using a single spacer, subtractive etch process, with four cut wires.
Figure 14B:
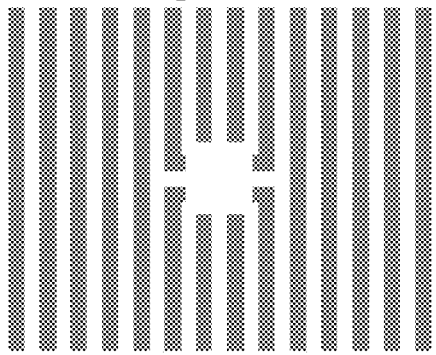

FIGS. 14A and 14B depict views of a layered semiconductor material which is processed to form a wiring layer using a single spacer, subtractive etch process, with four cut wires. FIG. 14A depicts a core pattern (stippled pattern) with sidewalls (solid pattern), the RP and the cut out area 1400. FIG. 14B depicts the final wiring layer pattern 1480 which is formed using the sidewall pattern with a portion removed by the cut out area. The subsequent patterns and the final metal wiring layer pattern can be obtained using the techniques discussed herein for a single spacer, subtractive etch process.

Figure 14C:
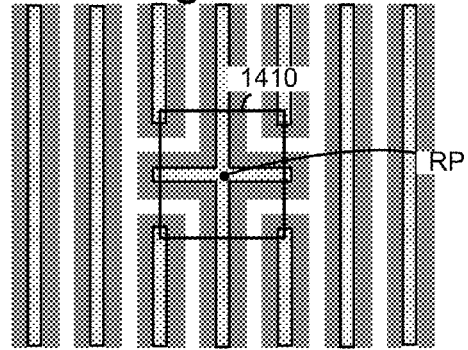
FIGS. 14C and 14D depict views of a layered semiconductor material which is processed to form a wiring layer using a single spacer, subtractive etch process, with six cut wires.
Figure 14D:
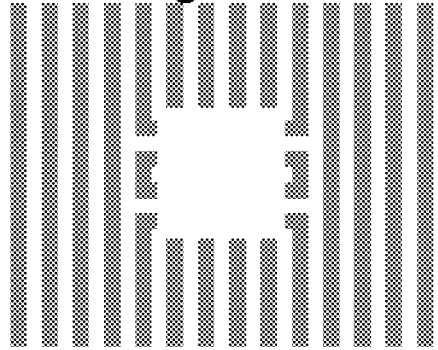

FIGS. 14C and 14D depict views of a layered semiconductor material which is processed to form a wiring layer using a single spacer, subtractive etch process, with six cut wires. FIG. 14C depicts a core pattern (stippled pattern) with sidewalls (solid pattern), the RP and the cut out area 1410. FIG. 14D depicts the final wiring layer pattern 1481 which is formed using the sidewall pattern with a portion removed by the cut out area.

Figure 14E:
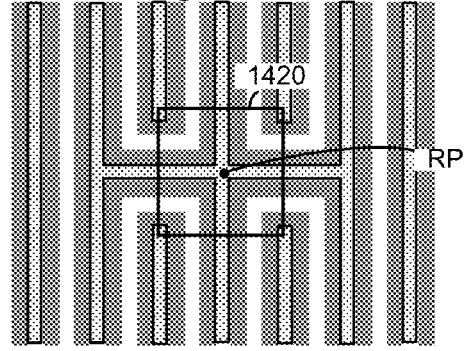
FIGS. 14E and 14F depict views of a layered semiconductor material which is processed to form a wiring layer using a single spacer, subtractive etch process, with eight cut wires.
Figure 14F:
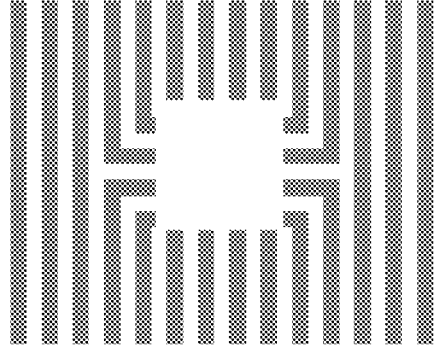

FIGS. 14E and 14F depict views of a layered semiconductor material which is processed to form a wiring layer using a single spacer, subtractive etch process, with eight cut wires. FIG. 14E depicts a core pattern (stippled pattern) with sidewalls (solid pattern), the RP and the cut out area 1420. FIG. 14F depicts the final wiring layer pattern 1482 which is formed using the sidewall pattern with a portion removed by the cut out area.

Figure 14G:
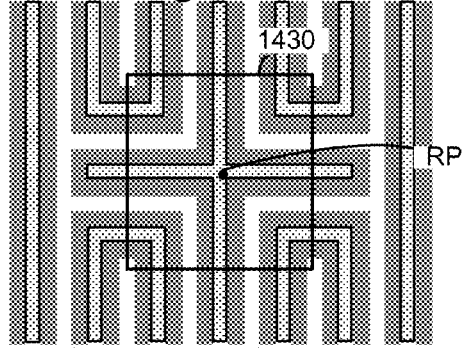
FIGS. 14G and 14H depict views of a layered semiconductor material which is processed to form a wiring layer using a single spacer, subtractive etch process, with ten cut wires.
Figure 14H:
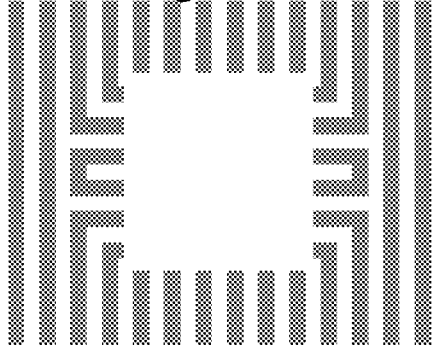

FIGS. 14G and 14H depict views of a layered semiconductor material which is processed to form a wiring layer using a single spacer, subtractive etch process, with ten cut wires. FIG. 14G depicts a core pattern (stippled pattern) with sidewalls (solid pattern), the RP and the cut out area 1430. FIG. 14H depicts the final wiring layer pattern 1483 which is formed using the sidewall pattern with a portion removed by the cut out area.

Figure 15A:
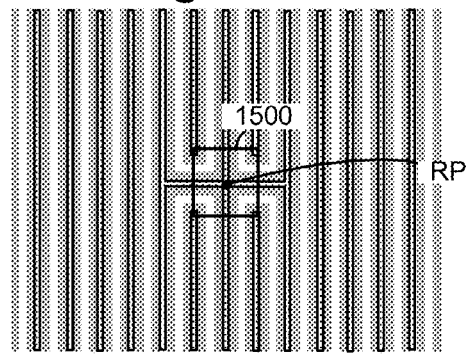
FIGS. 15A and 15B depict views of a layered semiconductor material which is processed to form a wiring layer using a double spacer, subtractive etch process, with eight cut wires.
Figure 15B:
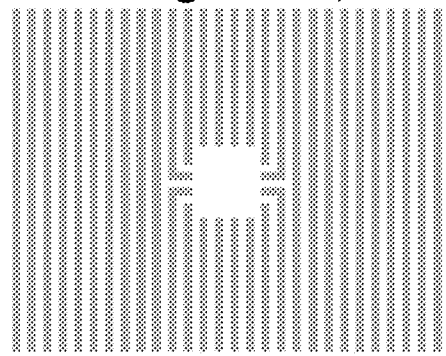

FIGS. 15A and 15B depict views of a layered semiconductor material which is processed to form a wiring layer using a double spacer, subtractive etch process, with eight cut wires. FIG. 15A depicts a core pattern (stippled pattern) with the second sidewall pattern (solid pattern), the RP and the cut out area 1500. FIG. 15B depicts the final wiring layer pattern 1580 which is formed using the second sidewall pattern with a portion removed by the cut out area. The subsequent patterns and the final metal wiring layer pattern can be obtained using the techniques discussed herein for a double spacer, subtractive etch process.

Figure 15C:
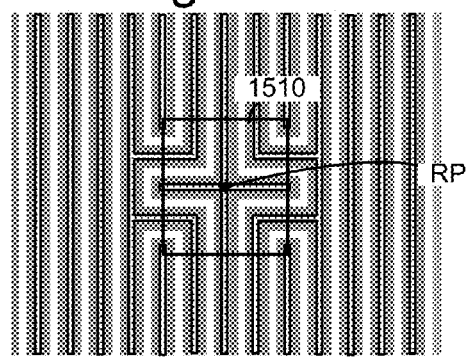
FIGS. 15C and 15D depict views of a layered semiconductor material which is processed to form a wiring layer using a double spacer, subtractive etch process, with twelve cut wires.
Figure 15D:
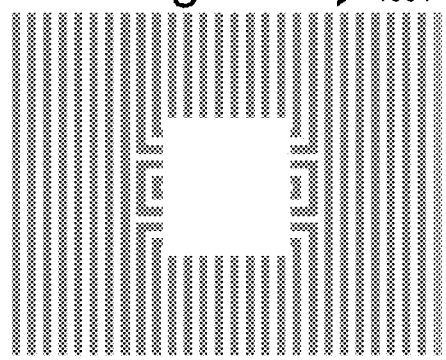

FIGS. 15C and 15D depict views of a layered semiconductor material which is processed to form a wiring layer using a double spacer, subtractive etch process, with twelve cut wires. FIG. 15C depicts a core pattern (stippled pattern) with the second sidewall pattern (solid pattern), the RP and the cut out area 1510. FIG. 15D depicts the final wiring layer pattern 1581 which is formed using the second sidewall pattern with a portion removed by the cut out area.

Figure 15E:
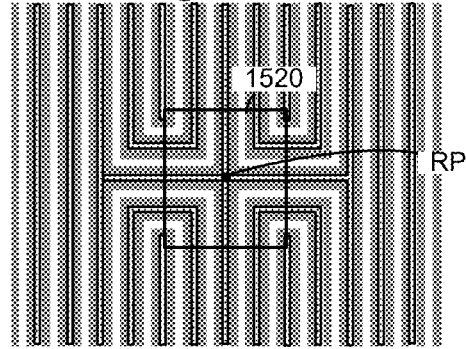
FIGS. 15E and 15F depict views of a layered semiconductor material which is processed to form a wiring layer using a double spacer, subtractive etch process, with sixteen cut wires.
Figure 15F:
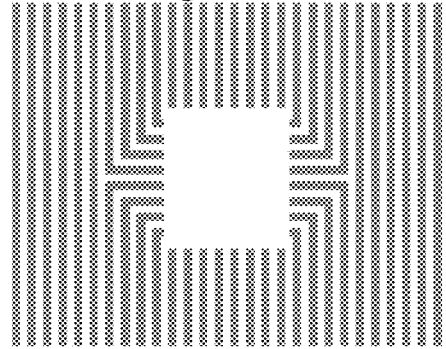

FIGS. 15E and 15F depict views of a layered semiconductor material which is processed to form a wiring layer using a double spacer, subtractive etch process, with sixteen cut wires. FIG. 15E depicts a core pattern (stippled pattern) with the second sidewall pattern (solid pattern), the RP and the cut out area 1520. FIG. 15F depicts the final wiring layer pattern 1582 which is formed using the second sidewall pattern with a portion removed by the cut out area.

Figure 15G:
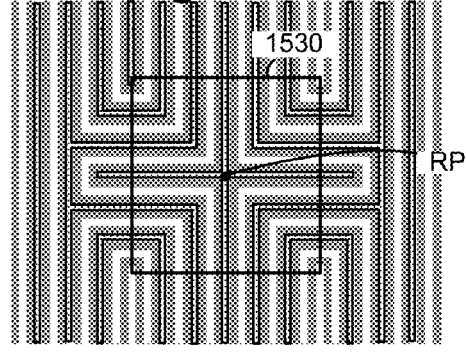
FIGS. 15G and 15H depict views of a layered semiconductor material which is processed to form a wiring layer using a double spacer, subtractive etch process, with twenty cut wires.
Figure 15H:
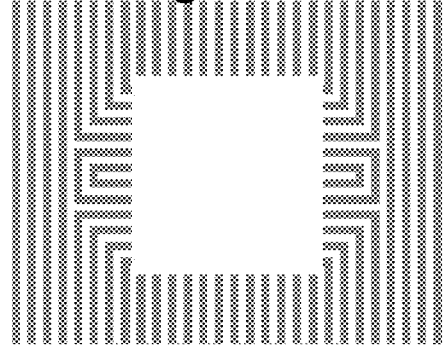

FIGS. 15G and 15H depict views of a layered semiconductor material which is processed to form a wiring layer using a double spacer, subtractive etch process, with twenty cut wires. FIG. 15G depicts a core pattern (stippled pattern) with the second sidewall pattern (solid pattern), the RP and the cut out area 1530. FIG. 15H depicts the final wiring layer pattern 1583 which is formed using the second sidewall pattern with a portion removed by the cut out area.

FIGS. 16A-E depicts alternative configurations of the split loop pattern of FIG. 1A1.

Figure 16A:
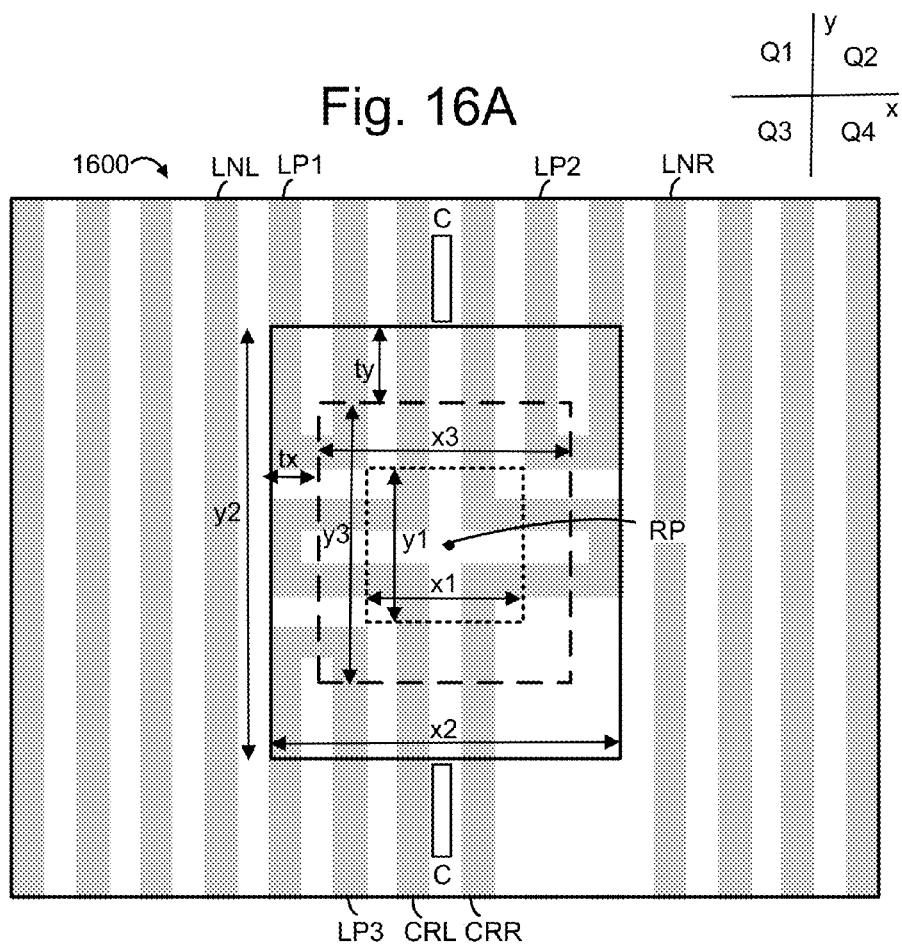

In FIG. 16A, the pattern 1600 is non-symmetric about both the x and y axes, and the pattern contains one or more loops (LP1-LP3) in three of the quadrants (Q1, Q2 and Q3). The pattern has a symmetry with respect to the RP. In Q4, the pattern does not contain loops which are similar to the other quadrants. The pattern in Q4 can contain no feature, or features which are different than the loops in the other quadrants. Q4 could contain loops which are different than the loops in the other quadrants. The cut area can be same as in FIG. 1A1 since the pattern has the same x and y extent as in FIG. 1A1. The cut area of FIG. 1A1 is provided for reference.

In FIG. 16B, the pattern 1610 is symmetric about the y axis but not the x axis, and the pattern contains one or more loops (LP1 and LP2) in two of the quadrants (Q1 and Q2). The pattern has a symmetry with respect to the RP. In Q1 and Q2, the pattern does not contain loops which are similar to the other quadrants. The patterns in Q1 and Q2 can contain no feature, or features which are different than the loops in the other quadrants. Q1 and Q2 could contain loops which are different than the loops in the other quadrants. The cut area can be smaller than in FIG. 1A1 since the pattern has the same x extent but a smaller y extent as in FIG. 1A1. The cut area of FIG. 1A1 is provided for reference.

In FIG. 16C, the pattern 1620 is symmetric about the RP but not about the x or y axis, and the pattern contains one or more loops (LP2 and LP3) in two of the quadrants (Q2 and Q3). Q2 and Q3 are diagonal to one another. The pattern has a symmetry with respect to the RP. In Q1 and Q4, the pattern does not contain loops which are similar to the other quadrants. The pattern in Q1 and Q4 can contain no feature, or features which are different than the loops in the other quadrants. Q1 and Q4 could contain loops which are different than the loops in the other quadrants. The cut area can be same as in FIG. 1A1 since the pattern has the same x and y extent as in FIG. 1A1. The cut area of FIG. 1A1 is provided for reference.

Figure 16D:
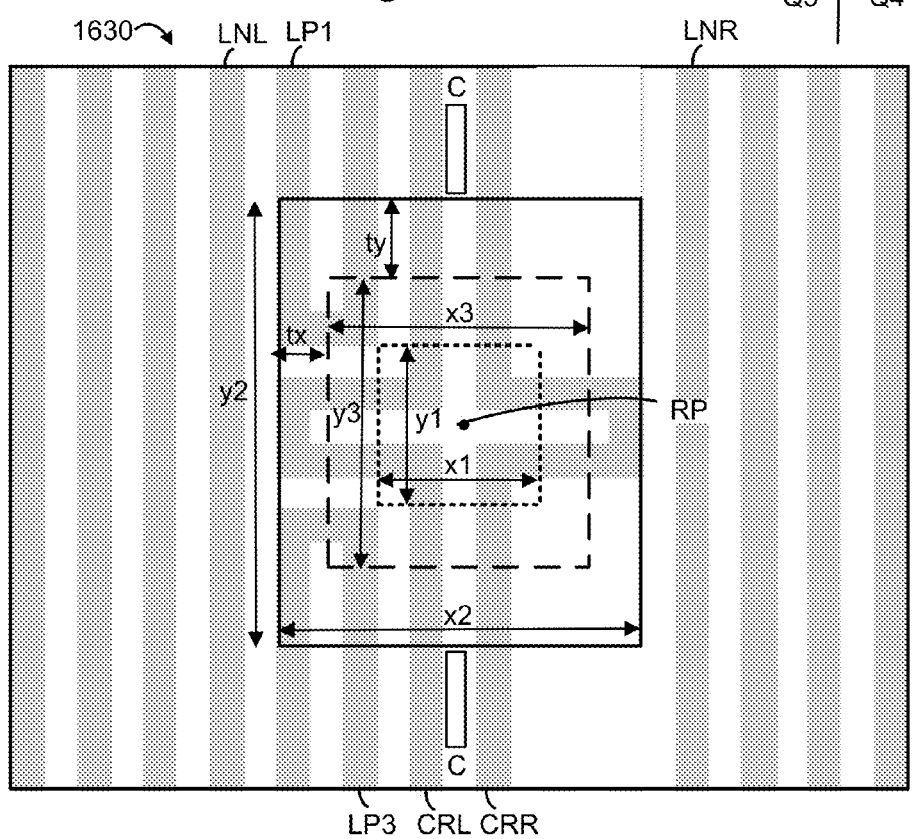

In FIG. 16D, the pattern 1630 is symmetric about the x axis but not the y axis, and the pattern contains one or more loops (LP1 and LP3) in two of the quadrants (Q1 and Q3). The pattern has a symmetry with respect to the RP. In Q2 and Q4, the pattern does not contain loops which are similar to the other quadrants. The patterns in Q2 and Q4 can contain no feature, or features which are different than the loops in the other quadrants. Q2 and Q4 could contain loops which are different than the loops in the other quadrants. The cut area can be smaller than in FIG. 1A1 since the pattern has the same y extent but a smaller x extent as in FIG. 1A1. The cut area of FIG. 1A1 is provided for reference.

In FIG. 16E, the pattern 1640 does not have a symmetry about the x axis, y axis or the RP, and the pattern contains one or more loops (LP1) in one of the quadrants (Q1). The other quadrants do not contain loops which are similar to Q1. The other quadrants can contain no feature, or features which are different than the loops in the other quadrants. Q2 and Q4 could contain loops which are different than the loops in the other quadrants. The cut area can be smaller than in FIG. 1A1 since the pattern has a smaller x and y extent as in FIG. 1A1. The cut area of FIG. 1A1 is provided for reference.

In an example implementation, the techniques provided herein are used with 193 nm immersion lithography tools.

In one embodiment, a method for fabricating a semiconductor device comprises: providing a pattern in an area of a layered semiconductor material, the area extends in a first direction and in a second direction, transverse to the first direction, the area comprises a central area, a left-side lateral area on a left side of the central area, and a right-side lateral area on a right side of the central area, portions of the pattern in the left-side and right-side lateral areas comprise lines which extend uninterrupted through the left-side and right-side lateral areas, respectively, in the first direction, the central area comprises four quadrants relative to a reference point, a portion of the pattern in each quadrant comprises a loop, each loop comprises a closed end in the central area, and a portion of the pattern in the central area comprises a cross which extends uninterrupted through the central area, between the loops, the cross is symmetric with respect to a first axis which passes through the reference point and which is in the first direction, and with respect to a second axis which passes through the reference point and which is in the second direction; masking the pattern to provide a masked pattern, the masked pattern defines a cut out area, the cut out area is contained within the central area and extends from the reference point outward to overlap the closed ends in the quadrants and to overlap portions of the cross which are between the reference point and the closed ends; and using the masked pattern, providing a patterned metal wiring layer in the layered semiconductor material, the cut out area defines an area in which the metal wiring layer is excluded.

In another embodiment, a method for fabricating a semiconductor device comprises providing a pattern in a patterned area of a layered semiconductor material, the area extends in a first direction and in a second direction, transverse to the first direction, the area comprises four quadrants relative to a reference point of the area, a portion of the pattern in each quadrant of at least two of the quadrants which are diagonal to one another comprises a loop, each loop comprises a closed end in the area, and a portion of the pattern in the area comprises a cross which extends uninterrupted through the area and between the loops, the cross is symmetric with respect to a first axis which passes through the reference point and which is in the first direction; masking the pattern to provide a masked pattern, the masked pattern defines a cut out area, the cut out area extends from the reference point outward to overlap the closed ends in the at least two of the quadrants and to overlap portions of the cross which are between the reference point and the closed ends; and using the masked pattern, providing a patterned metal wiring layer in the layered semiconductor material, the cut out area defines an area in which the metal wiring layer is excluded.

In another embodiment, a semiconductor device comprises: a substrate; and a metal wiring layer carried on the substrate, the metal wiring layer is provided in a patterned area which extends in a first direction and in a second direction, transverse to the first direction, the area comprises a central area, a left-side lateral area on a left side of the central area, and a right-side lateral area on a right side of the central area, the metal wiring layer comprises active lines which extend uninterrupted through the left-side and right-side lateral areas, adjacent to the central area, the central area comprises four quadrants relative to a reference point, a portion of the metal wiring layer in each quadrant comprises a broken loop, each broken loop comprises a broken end in the central area, a portion of the metal wiring layer in the central area comprises a broken cross, the broken cross is symmetric with respect to a first axis which passes through the reference point and which is in the first direction, and with respect to a second axis which passes through the reference point and which is in the second direction, the broken cross comprises separated metal wire portions which extend in the first direction, and separated metal wire portions which extend in the second direction, the metal wiring layer is excluded from a cut out area, and the cut out area is contained within the central area and extends from the reference point outward to overlap missing portions of the broken ends in the quadrants and to overlap missing portions of the broken cross which are between the reference point and the broken ends.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A semiconductor device, comprising:
a substrate; and
a metal wiring layer carried on the substrate,
the metal wiring layer is provided in a patterned area which extends in a first direction and in a second direction, transverse to the first direction,
the patterned area comprises a central area, a left-side lateral area on a left side of the central area, and a right-side lateral area on a right side of the central area,
the metal wiring layer comprises active lines which extend uninterrupted through the left-side and right-side lateral areas, adjacent to the central area,
the central area comprises four quadrants relative to a reference point,
a portion of the metal wiring layer in each quadrant comprises a broken loop, each broken loop comprises a broken end in the central area,
a portion of the metal wiring layer in the central area comprises a broken cross, the broken cross is symmetric with respect to a first axis which passes through the reference point and which is in the first direction, and with respect to a second axis which passes through the reference point and which is in the second direction,
the broken cross comprises separated metal wire portions which extend in the first direction, and separated metal wire portions which extend in the second direction,
the metal wiring layer is excluded from a cut out area, and
the cut out area is contained within the central area and extends from the reference point outward to overlap missing portions of the broken ends in the quadrants and to overlap missing portions of the broken cross which are between the reference point and the broken ends.

2. The semiconductor device of claim 1, wherein:
the metal wiring layer comprises a plurality of nested broken loops in each quadrant, each of the plurality of nested broken loops comprises a broken end in the central area; and
the cut out area extends from the reference point outward to each of the broken ends in each quadrant.

3. The semiconductor device of claim 1, wherein:
the metal wiring layer comprises a plurality of nested broken crosses in the central area, each broken cross comprises separated metal wire portions which extend in the first direction, and separated metal wire portions which extend in the second direction.

4. The semiconductor device of claim 3, wherein:
the metal wiring layer comprises a plurality of nested broken loops in each quadrant, each of the plurality of nested broken loops comprises a broken end in the central area; and
the cut out area extends from the reference point outward to each of the broken ends in each quadrant.

* * * * *